US011437589B2

(12) United States Patent
Ran et al.

(10) Patent No.: US 11,437,589 B2
(45) Date of Patent: Sep. 6, 2022

(54) COMPOUND, DISPLAY PANEL, AND DISPLAY APPARATUS

(71) Applicant: Xiamen Tianma Micro-Electronics Co., Ltd., Xiamen (CN)

(72) Inventors: Quan Ran, Shanghai (CN); Lei Zhang, Shanghai (CN); Wei Gao, Shanghai (CN); Jinghua Niu, Shanghai (CN); Wenpeng Dai, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 334 days.

(21) Appl. No.: 16/833,892

(22) Filed: Mar. 30, 2020

(65) Prior Publication Data

US 2020/0227655 A1 Jul. 16, 2020

(30) Foreign Application Priority Data

Jan. 3, 2020 (CN) ........................ 202010005739.7

(51) Int. Cl.
*B32B 9/00* (2006.01)
*H01L 51/00* (2006.01)
*H01L 51/50* (2006.01)

(52) U.S. Cl.
CPC ...... *H01L 51/0072* (2013.01); *H01L 51/0061* (2013.01); *H01L 51/0067* (2013.01); *H01L 51/0094* (2013.01); *H01L 51/5092* (2013.01)

(58) Field of Classification Search
CPC ............. H01L 51/0072; H01L 51/0061; H01L 51/0067; H01L 51/0094; H01L 51/5092

(Continued)

(56) References Cited

U.S. PATENT DOCUMENTS

2015/0349270 A1* 12/2015 Lee ..................... H01L 51/0067 546/281.1
2017/0092873 A1* 3/2017 Kang .................. H01L 51/0061
2017/0098778 A1* 4/2017 Oh ....................... C07D 251/24

FOREIGN PATENT DOCUMENTS

CN 105246880 A 1/2016
CN 107353298 A 11/2017

(Continued)

OTHER PUBLICATIONS

Office Action of CN Patent Application No. 202010005739.7 dated Dec. 17, 2020.

*Primary Examiner* — Phuc T Dang

(74) *Attorney, Agent, or Firm* — Kilpatrick Townsend & Stockton, LLP

(57) ABSTRACT

The present disclosure relates provides an compound represented by Chemical Formula 1, in which $Ar_1$, $Ar_2$, $Ar_3$ and $Ar_4$ are C6-C40 aryl, or C5-C40 heteroaryl; $R^1$ and $R^2$ are —$C(R)_2$—, —N(R)—, —O—, or —S—; $X_1$, $X_2$ and $X_3$ are C or N; $L_1$ and $L_2$ are phenylene, naphthylene, or biphenylene; $Y_1$ and $Y_2$ are each an electron-withdrawing group selected from a N-containing heterocyclic group, or a cyano-containing group. The compound of the present disclosure has bipolar characteristics of simultaneously transmitting holes and electrons. The bipolar transmission host is beneficial to charge transmission balance in the light-emitting layer, and can widen the exciton recombination region, to simplify the device structure and improving device efficiency. The present disclosure further provides a display panel and a display apparatus.

(Continued)

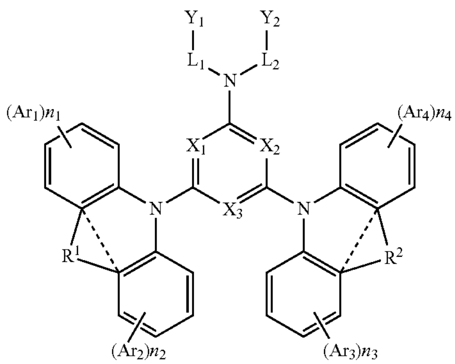

20 Claims, 2 Drawing Sheets

(58) Field of Classification Search
USPC .......................................................... 428/690
See application file for complete search history.

(56) References Cited

FOREIGN PATENT DOCUMENTS

| | | | |
|---|---|---|---|
| CN | 105246880 | B | 10/2018 |
| KR | 20120130566 | A | 12/2012 |
| KR | 20160079545 | A | 7/2016 |

* cited by examiner

COMPOUND, DISPLAY PANEL, AND DISPLAY APPARATUS

CROSS-REFERENCE TO RELATED DISCLOSURES

The present application claims priority to Chinese Patent Application No. 202010005739.7, filed on Jan. 3, 2020, the content of which is incorporated herein by reference in its entirety.

FIELD

The present disclosure belongs to the field of organic electroluminescence materials, and more particularly, relates to a compound that can be used as a light-emitting host material of organic light-emitting diodes (OLEDs), a display panel including the compound, and a display apparatus.

BACKGROUND

Organic electroluminescent materials, as a new generation display technology, have been widely used in flat panel display, flexible display, solid state lighting and automotive display industries due to their advantages such as ultra-thinness, self-luminance, wide viewing angle, fast response, high light-emitting efficiency, good temperature adaptability, simple production process, low driving voltage, low energy consumption, etc.

The light-emitting mechanisms of OLEDs can be classified into two types: electrofluorescent mechanism and electrophosphorescent mechanism. Fluorescent light is light emitted by a radiation decay transition of singlet exciton, and phosphorescent light is light emitted through an attenuation of triplet exciton radiation to the ground state. According to the theory of spin quantum statistics, the formation probability of singlet excitons to triplet excitons is 1:3. The fluorescent materials have an internal quantum efficiency not exceeding 25%, and an external quantum efficiency generally lower than 5%. The phosphorescent materials have an internal quantum efficiency which may theoretically reach 100%, and an external quantum efficiency up to 20%. In 1998, Professor Ma Yuguang of Jilin University in China and Professor Forrest of Princeton University both firstly reported the use of europium complex and platinum complex as dyes doped in the light-emitting layer, obtained and explained the phosphorescent photoluminescence phenomenon, which was groundbreaking to apply the phosphorescent material to the electroluminescent devices.

Due to long lifetime (p,$) of heavy metal phosphorescent materials, triplet-triplet annihilation and concentration quenching may be caused at high current densities, resulting in degradation of device performances. Therefore, the heavy metal phosphorescent materials are usually doped into suitable host materials to form a host-guest doping system, in order to optimize the energy transfer and maximize the light-emitting efficiency and lifetime. In the current researches, the heavy metal doping materials are commercially matured, and it is difficult to develop alternative doping materials. Therefore, it is a new research direction to develop new phosphorescent host materials.

So far, many typical host materials, for instance, carbazole derivative of 9,9'-(1,3-phenyl)-di-9H-carbazole (mCP), have been widely used in the OLED devices. However, they have relatively lower glass transition temperatures (about 55° C.), which may lead to poor thermal stability and poor film formation, and thus they are unstable in vapor deposition of devices. In addition, due to the lack of an electron-withdrawing group in mCP, mCP can hardly achieve phase balance between holes and electrons in OLED devices. Therefore, in order to improve the performances of the OLED devices, it is urgent to develop OLED light-emitting host materials with better performances.

SUMMARY

In view of the above, a first aspect of the present disclosure provides a compound that can be used as a light-emitting host material. The compound has a structure represented by Chemical Formula 1:

Chemical Formula 1

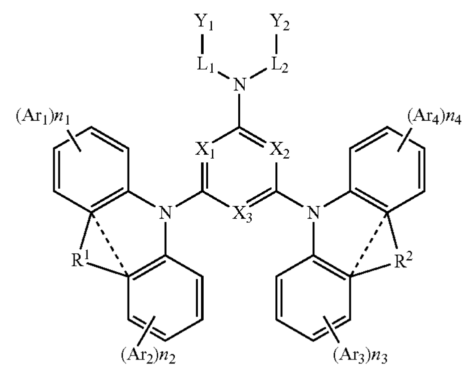

$Ar_1$, $Ar_2$, $Ar_3$ and $Ar_4$ are each independently one or more selected from the group consisting of hydrogen, deuterium, C1-C20 alkyl, C1-C20 alkoxy, C1-C20 alkylthiol, C3-C20 cycloalkyl, a substituted or unsubstituted C6-C40 aryl, and a substituted or unsubstituted C5-C40 heteroaryl, n1, n2, n3, and n4 are each an integer independently selected from 0, 1, or 2;

$R^1$ and $R^2$ are each independently selected from the group consisting of —$C(R)_2$—, —O—, —S—, —N(R)—, and —$Si(R)_2$—, and R is selected from the group consisting of C1-C20 alkyl, C1-C20 alkoxy, C1-C20 alkylthiol, C3-C20 cycloalkyl, a substituted or unsubstituted C6-C30 aryl, and a substituted or unsubstituted C5-C30 heteroaryl;

$X_1$, $X_2$ and $X_3$ are each C or N;

$L_1$ and $L_2$ are each independently selected from the group consisting of phenylene, naphthylene, anthrylene, phenanthrylene, pyrenylene, and biphenylene; \

$Y_1$ and $Y_2$ are each an electron-withdrawing group, and $Y_1$ and $Y_2$ are each independently selected from an N-heterocyclic group, a cyano-containing group, a carbonyl-containing group, a sulfone-containing group, a phosphoroso- or phosphinothioyl-containing group, or a boron-heterocyclic group.

A second aspect of the present disclosure provides a display panel including an organic light-emitting device. The organic light-emitting device includes an anode, a cathode arranged opposite to the anode, a light-emitting layer located between the anode and the cathode. The light-emitting layer includes a host material and guest material, and the host material includes one or more compounds according to the first aspect of the present disclosure.

A third aspect of the present disclosure provides a display apparatus including the display panel as described above.

DESCRIPTION OF EMBODIMENTS

Figure 1:
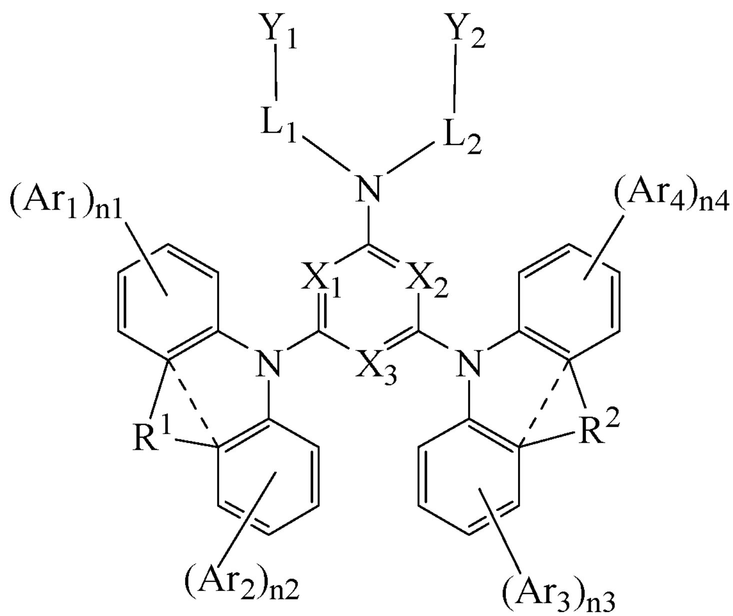
FIG. 1 is a chemical formula of a compound according to an embodiment of the present disclosure.

The present disclosure is further described through examples and comparative examples. These examples are merely used to illustrate the present disclosure, and the present disclosure is not limited to the following examples.

One aspect of the present disclosure provides a compound having a structure represented by Chemical Formula 1:

Chemical Formula 1

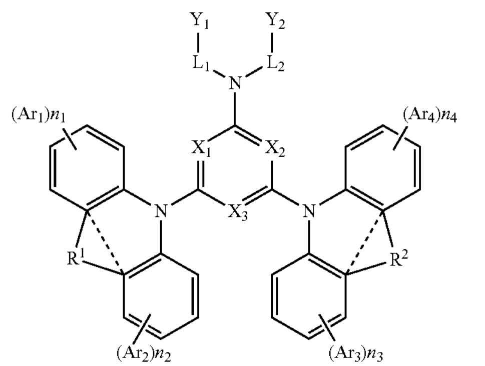

in which $Ar_1$, $Ar_2$, $Ar_3$ and $Ar_4$ are each independently one or more selected from the group consisting of hydrogen, deuterium, C1-C20 alkyl, C1-C20 alkoxy, C1-C20 alkylthiol, C3-C20 cycloalkyl, a substituted or unsubstituted C6-C40 aryl, and a substituted or unsubstituted C5-C40 heteroaryl, n1, n2, n3, and n4 are each an integer independently selected from 0, 1, or 2;

$R^1$ and $R^2$ are each independently selected from the group consisting of —C(R)$_2$—, —O—, —S—, —N(R)—, and —Si(R)$_2$—, and R is selected from the group consisting of C1-C20 alkyl, C1-C20 alkoxy, C1-C20 alkylthiol, C3-C20 cycloalkyl, a substituted or unsubstituted C6-C30 aryl, and a substituted or unsubstituted C5-C30 heteroaryl;

$X_1$, $X_2$ and $X_3$ are each C or N;

$L_1$ and $L_2$ are each independently selected from the group consisting of phenylene, naphthylene, anthrylene, phenanthrylene, pyrenylene, and biphenylene;

$Y_1$ and $Y_2$ are each an electron-withdrawing group, and $Y_1$ and $Y_2$ are each independently selected from an N-heterocyclic group, a cyano-containing group, a carbonyl-containing group, a sulfone-containing group, a phosphoroso- or phosphinothioyl-containing group, or a boron-heterocyclic group.

In the compound of the present disclosure, two substituted sites (1-position and 3-position; i.e., a site between $X_1$ and $X_3$ and a site between $X_2$ and $X_3$) on a central benzene ring or ae nitrogen heterocyclic ring where $X_1$, $X_2$ and $X_3$ are located are each connected to electron-donating groups, and the compound has the ability of hole transmission. Another substituted site (5-position, i.e., a site between $X_1$ and $X_2$) is connected to an amino group containing an electron-withdrawing unit, which imparts the compound with the ability of electron transmission. Therefore, the compound has a bipolar characteristics of simultaneously transmitting holes and electrons. When the compound of the present disclosure is used as the host material of the light-emitting layer, the bipolar characteristics of the compound are beneficial to the charge transmission balance in the light-emitting layer. By introducing the bipolar transmission host in the light-emitting layer, the exciton recombination region can be widened, to simplify the device structure and improving device efficiency.

According to an embodiment of the compound of the present disclosure, $Y_1$ and $Y_2$ are identical.

The structural symmetry is conducive to simplifying the synthesis of the compounds. The cases when $Y_1$ and $Y_2$ are identical are only some examples of symmetrical structure of the compounds. However, the asymmetrical molecule is also possible in the present disclosure.

According to an embodiment of the compound of the present disclosure, the compound has the following structure:

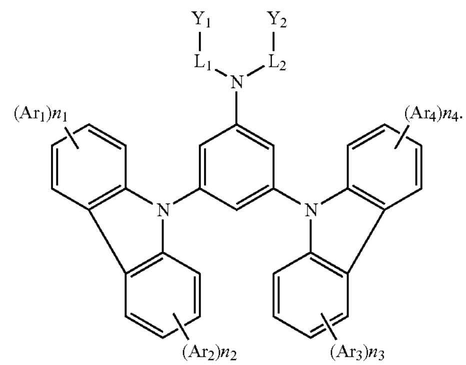

According to an embodiment of the compound of the present disclosure, the compound has the following structure:

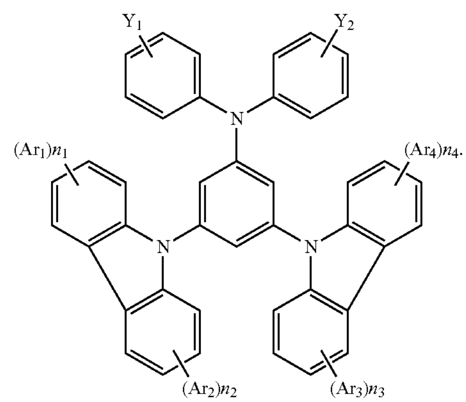

According to an embodiment of the compound of the present disclosure, the compound has the following structure:

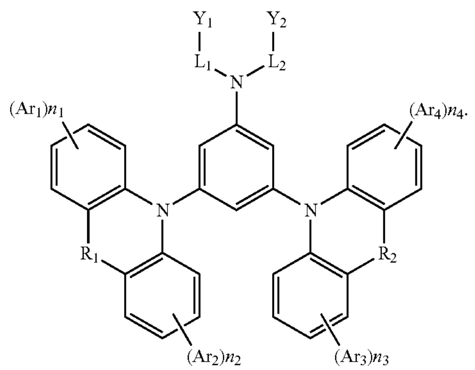

Acridine derivatives have a stronger electron-donating ability than carbazole derivatives. Therefore, when the same electron-donating groups are respectively connected to the 1-position and the 3-position, the HOMO energy levels difference is great. When two different groups are connected to the 1-position and the 3-position of the central benzene ring, the electron-donating ability will change accordingly, and the HOMO energy levels are between acridine derivatives and carbazole derivatives, to achieve the energy level regulation and meeting the requirements of matching adjacent functional layers during device preparation.

According to an embodiment of the compound of the present disclosure, the compound has any one of the following structures:

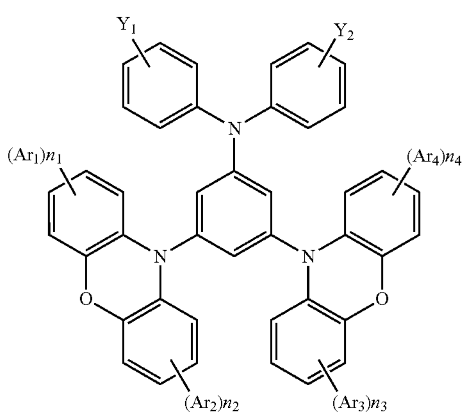

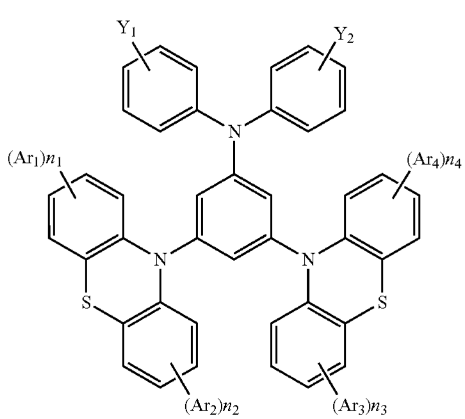

-continued

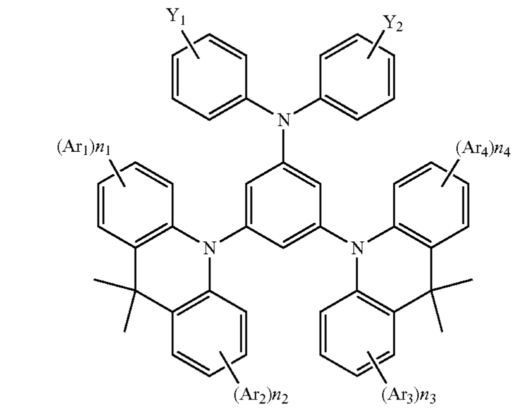

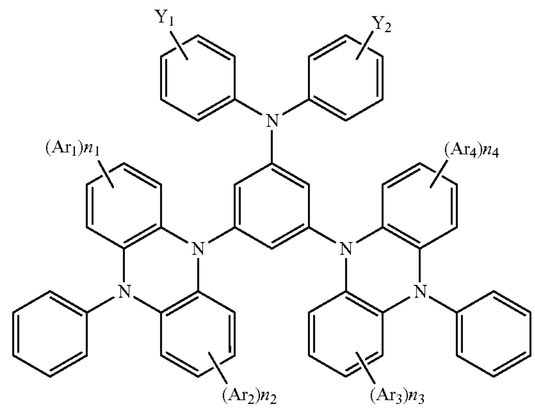

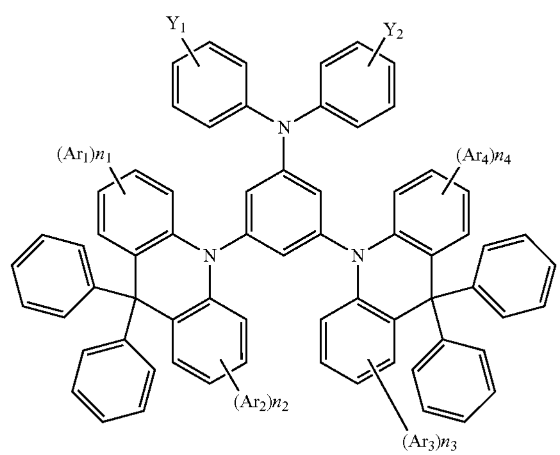

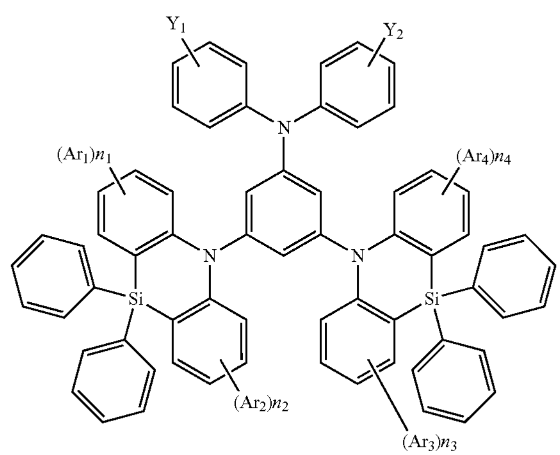

-continued
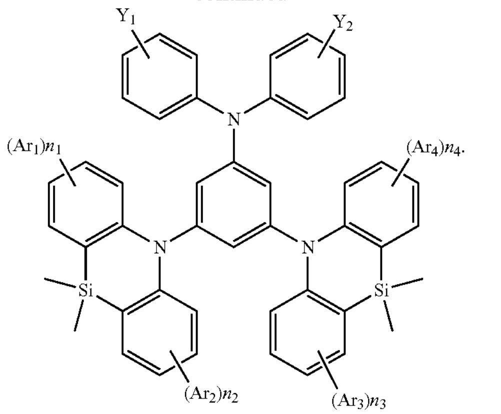
According to an embodiment of the compound of the present disclosure, the N-containing heterocyclic group is any one of the following groups:
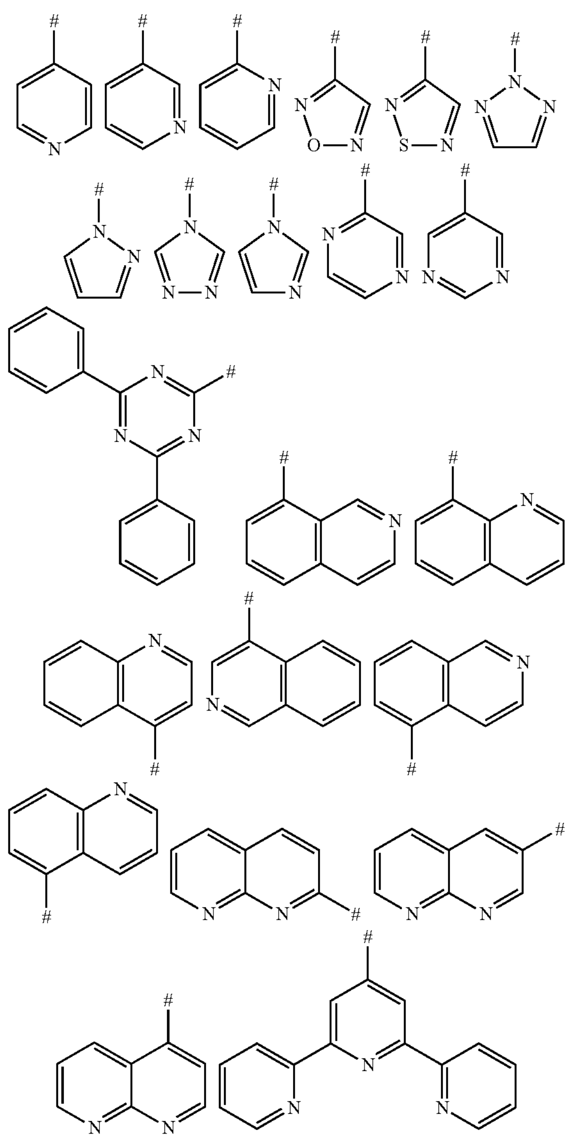
-continued
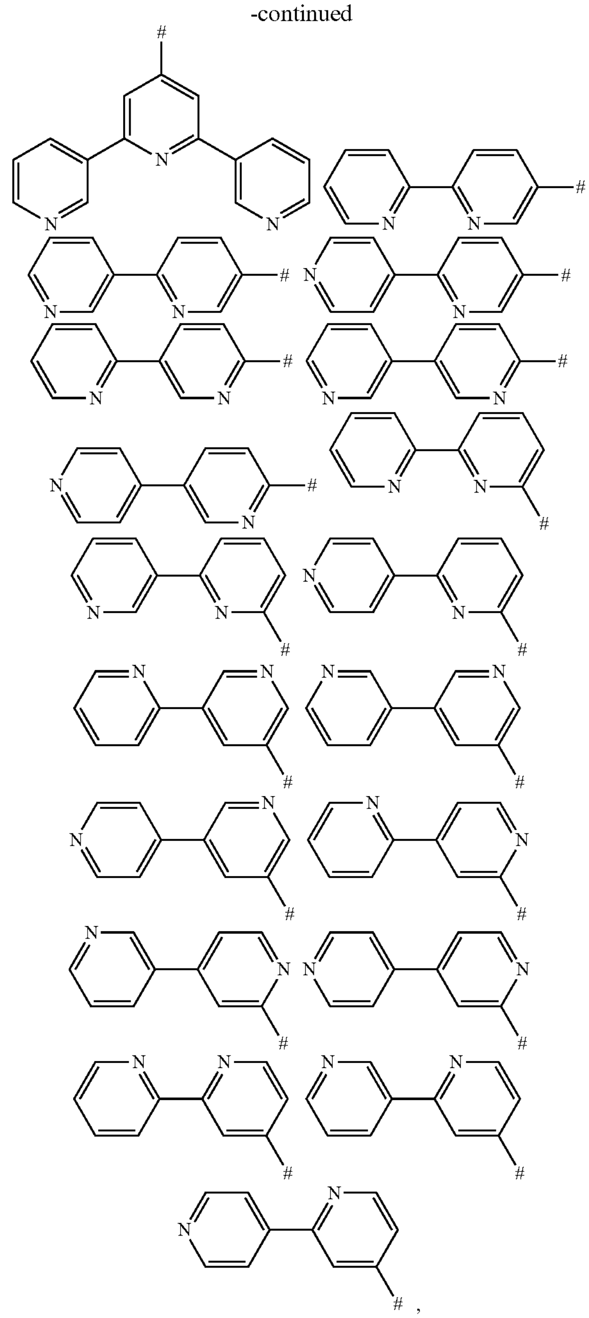
in which # indicates a position bonding to the Chemical Formula 1.
According to an embodiment of the compound of the present disclosure, the cyano-containing group is any one of the following groups:
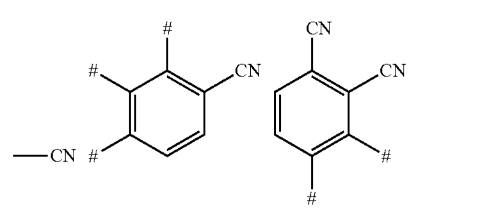

-continued

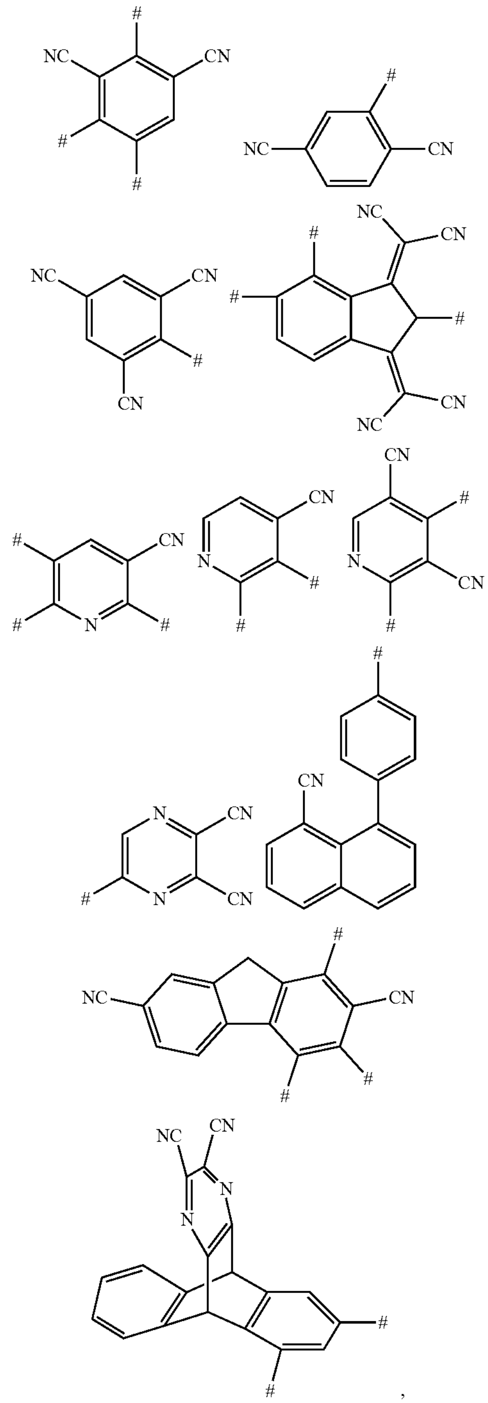

in which, # indicates a possible position bonding to the Chemical Formula 1.

The cyano-containing group is a common electron acceptor. In the compounds of the present disclosure, the benzene ring or nitrogen heterocyclic ring containing cyano group has higher stability than the cyano group itself, and the entire bipolar host material has higher stability.

According to an embodiment of the compound of the present disclosure, the carbonyl-containing group is any one of the following groups:

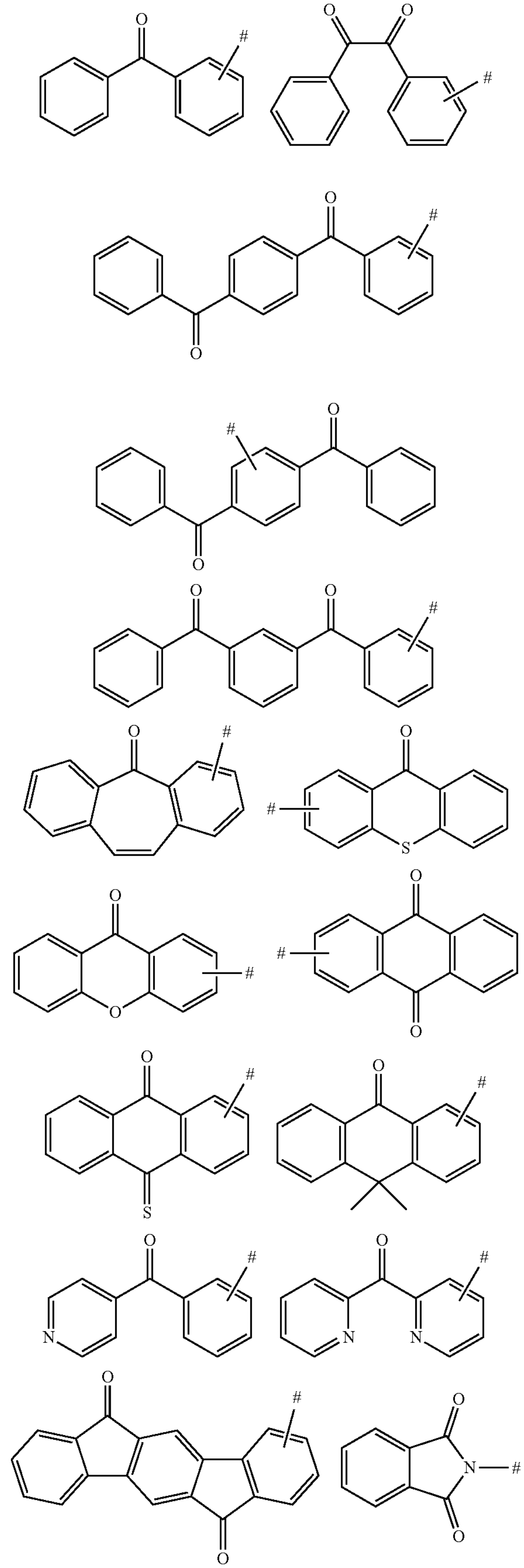

-continued

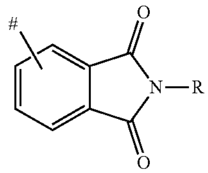
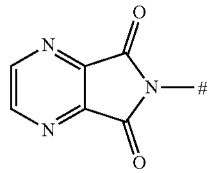
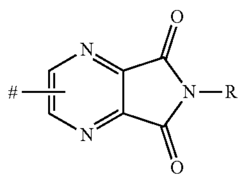
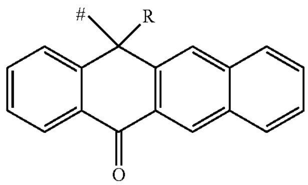
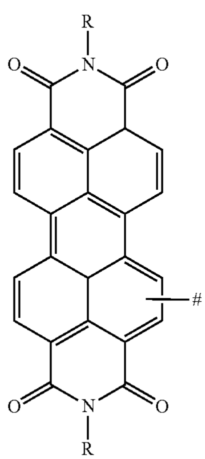
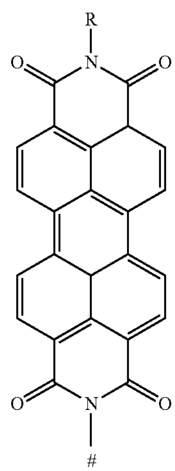
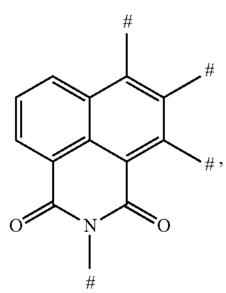

in which # indicates a position bonding to the Chemical Formula 1, and R is C1-C20 alkyl, C1-C20 alkoxy, C2-C20 alkenyl, C2-C20 alkynyl, C4-C8 cycloalkyl, C6-C40 aryl, or C4-C40 heteroaryl.

According to an embodiment of the compound of the present disclosure, the sulfone-containing group is any one of the following groups:

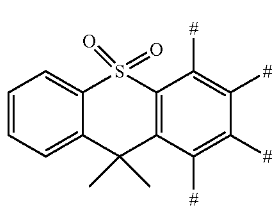
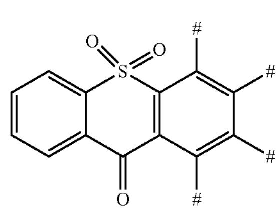

-continued

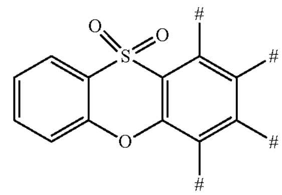
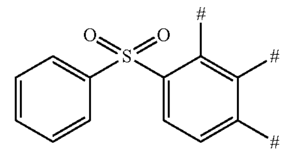
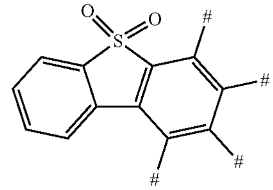
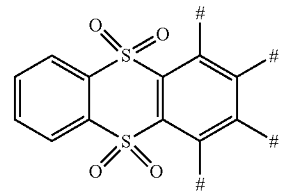
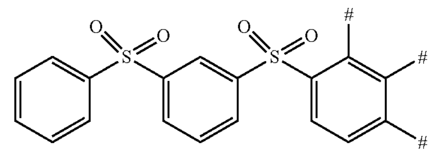
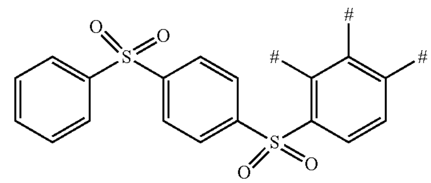
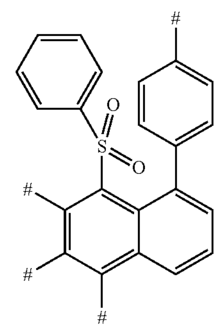

in which # indicates a position bonding to the Chemical Formula 1.

According to an embodiment of the compound of the present disclosure, the phosphoroso or phosphinothioyl-containing group is any one of the following groups:

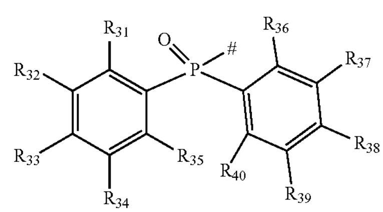
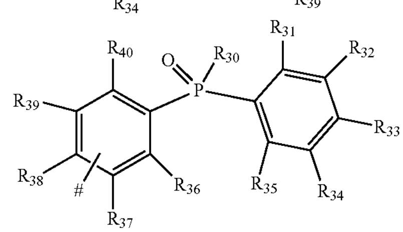

-continued

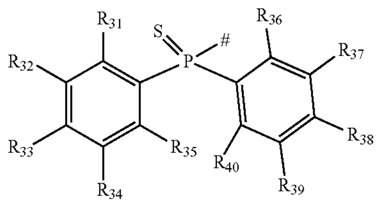

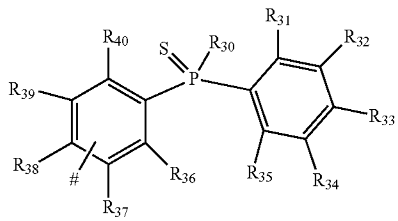

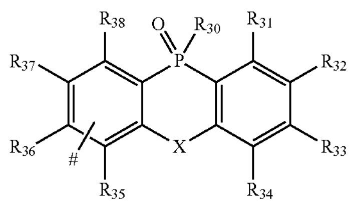

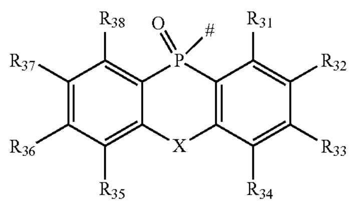

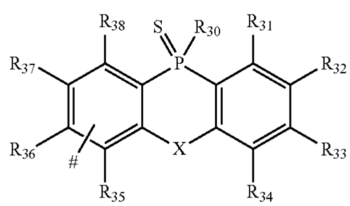

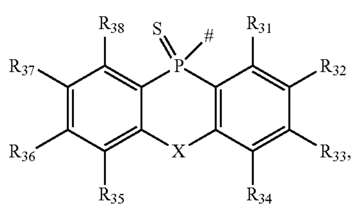

in which, X is O, S, —BR41, —C(R41)2, —Si(R41)2, or —NR41; and

R30, R31, R32, R33, R34, R35, R36, R37, R38, R39, R40, and R41 are each independently selected from the group consisting of hydrogen, a substituted or unsubstituted C1-C20 alkyl, a substituted or unsubstituted C3-C20 cycloalkyl, a substituted or unsubstituted C1-C20 alkoxy, a substituted or unsubstituted C3-C20 heterocyclic groups, a substituted or unsubstituted C6-C40 aryl, and substituted or unsubstituted C2-C40 heteroaryl; and # indicates a position bonding to the Chemical Formula 1.

According to an embodiment of the compound of the present disclosure, the boron-heterocyclic group is any one of the following groups:

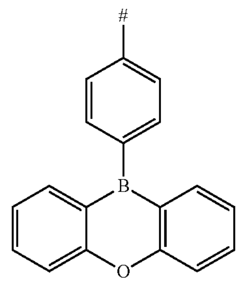

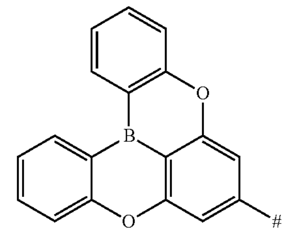

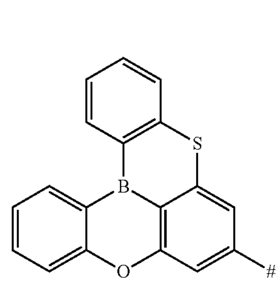

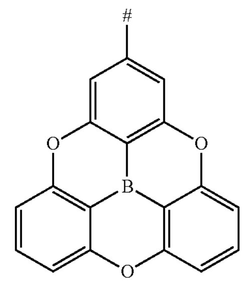

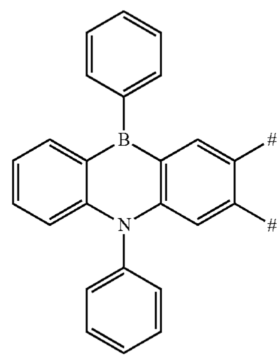

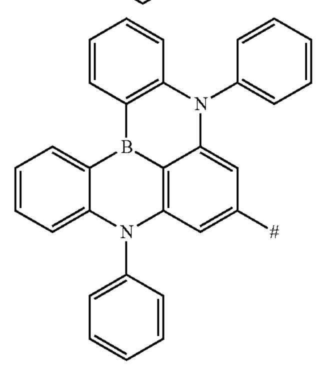

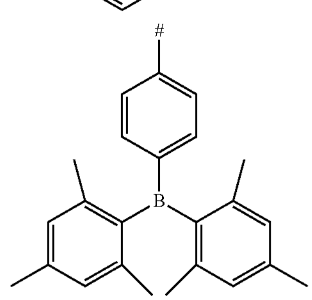

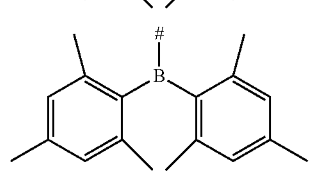

-continued

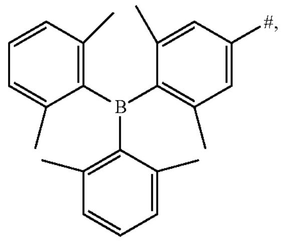

in which # indicates a position bonding to the Chemical Formula 1.

According to an embodiment of the compound of the present disclosure, at least one of $X_1$, $X_2$ or $X_3$ is N.

Electron migration may not match hole migration in a D-A type bipolar host material. In the D-A type bipolar host material, the hole mobility is usually greater than the electron mobility. In the compounds of the present disclosure, when the ring where $X_1$, $X_2$ and $X_3$ are located contains a nitrogen atom, the central nitrogen heterocyclic ring can improve the electron transmission performance due to the electron-withdrawing property of the nitrogen heterocyclic ring. In this way, a higher matching degree between the electron transmission and the hole transmission can be achieved, and a carrier transmission can be balanced. Moreover, nitrogen-substituted compounds may form intramolecular and intermolecular hydrogen bonds, to stabilize the compounds.

According to an embodiment of the compound of the present disclosure, $R^1$ and $R^2$ are each independently selected from the group consisting of —C(R)$_2$—, —N(R)—, and —Si(R)—; $L_1$ and $L_2$ are each phenylene; and R is defined as in claim 1. In the present embodiment, the electron transmission ability and the hole transmission ability can be balanced by changing the R group. When $L_1$ and $L_2$ are phenylene, in a first aspect, the cost of synthesis raw materials can be reduced, and the synthesis is simpler and more efficient, which is more suitable for mass production. In a second aspect, the molecular weight is moderate, i.e., not so great to result in a high temperature of vapor deposition, to guarantee the thermal stability of the material, which is beneficial to the vapor deposition process. In a third aspect, for the light-emitting host material, HOMO and LUMO should are required to be sufficient overlapped in order to ensure efficient electron exchange and higher efficiency, and the presence of phenylene allows sufficient overlapping of HOMO and LUMO of the D-A host materials, to facilitate electron exchange.

According to an embodiment of the compound of the present disclosure, $Ar_1$, $Ar_2$, $Ar_3$ and $Ar_4$ are each independently selected from the group consisting of the substituted or unsubstituted C6-C40 aryl, and the substituted or unsubstituted C5-C40 heteroaryl, and $Y_1$ and $Y_2$ are each the N-containing heterocyclic group.

According to an embodiment of the compound of the present disclosure, the compound is any one of the following compounds:

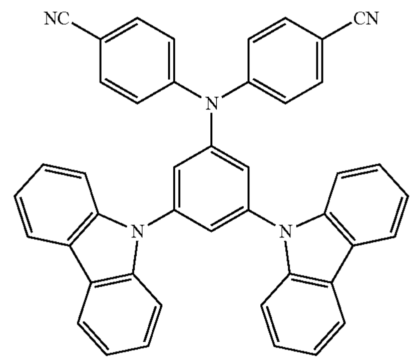

1

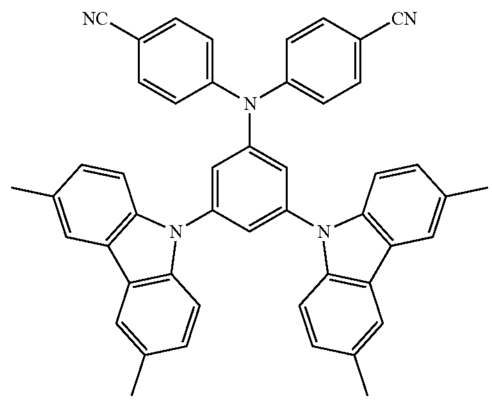

2

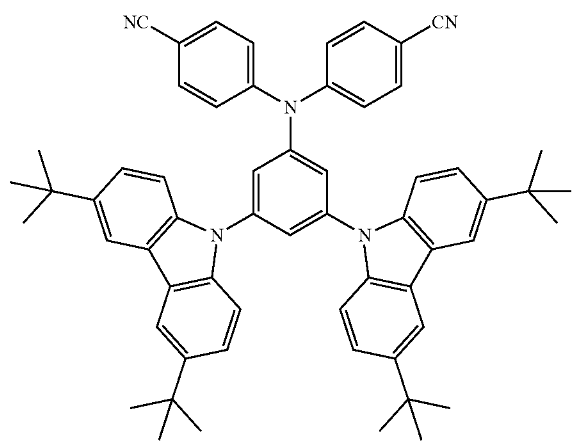

3

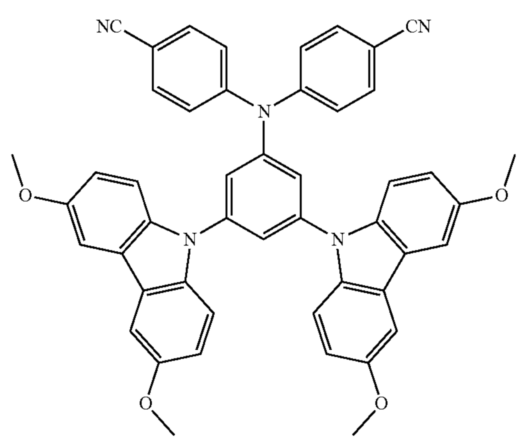

4

5
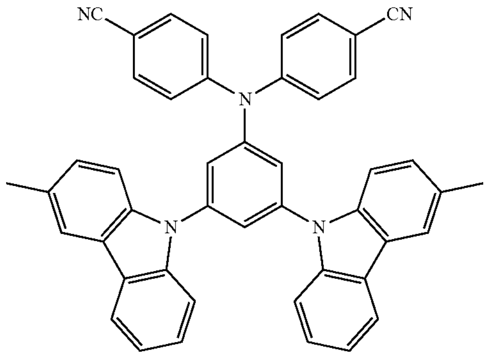
6
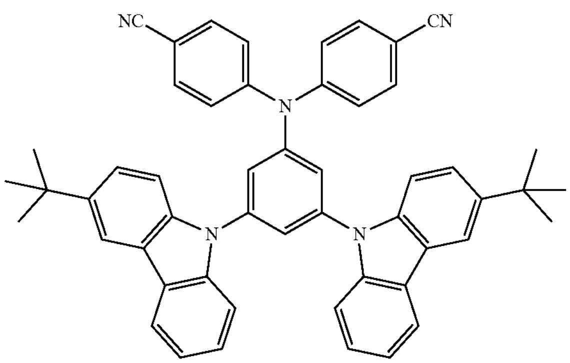
7
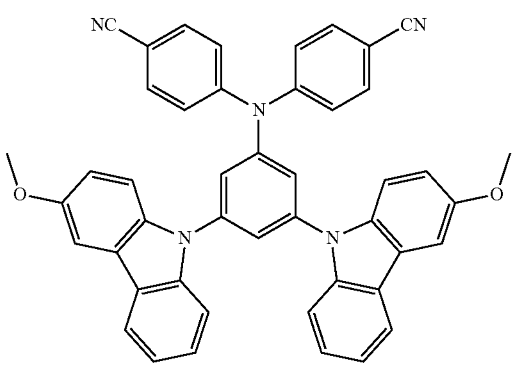
8
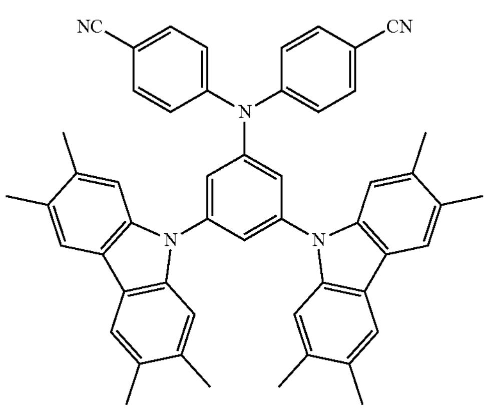
9
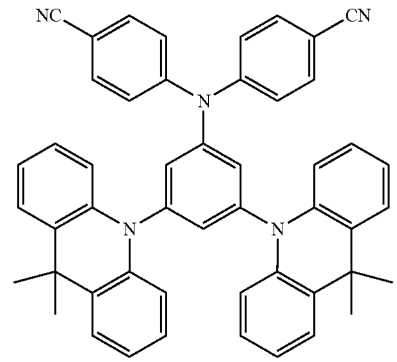
10
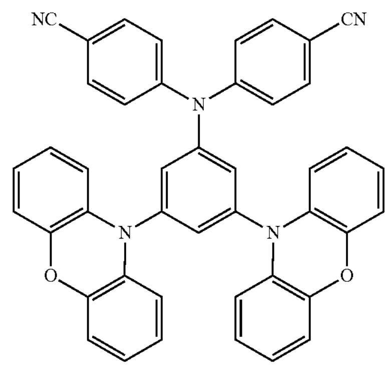
11
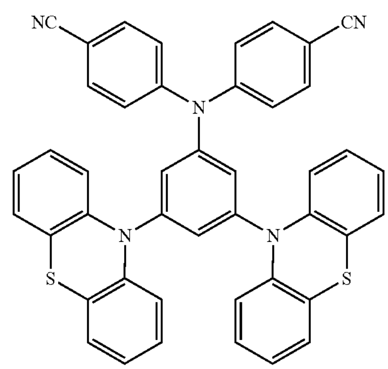
12
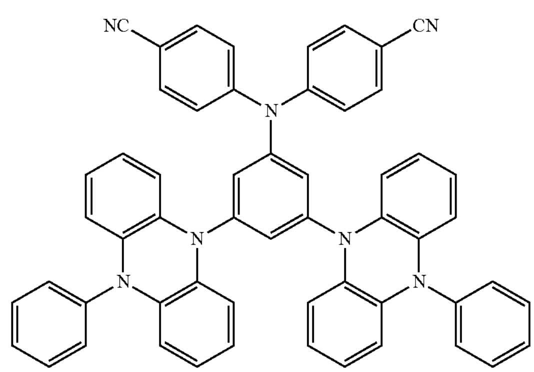

13
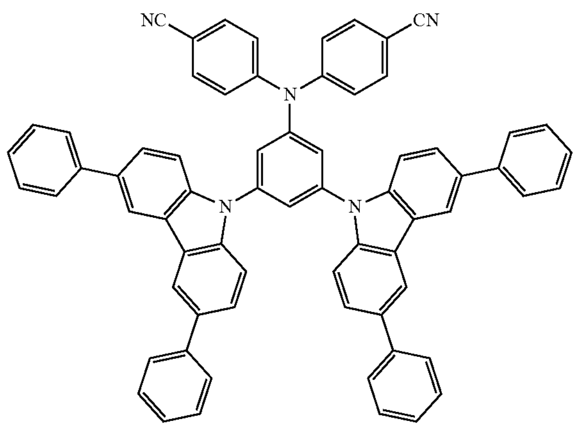
14
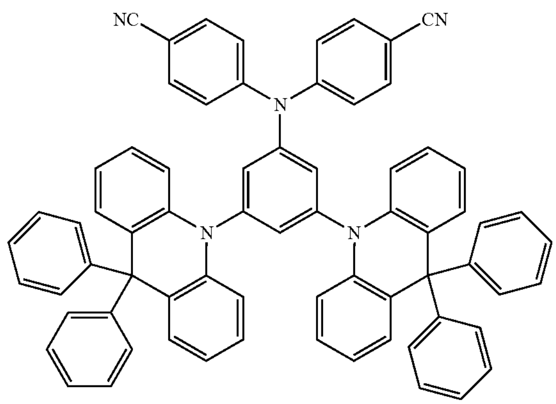
15
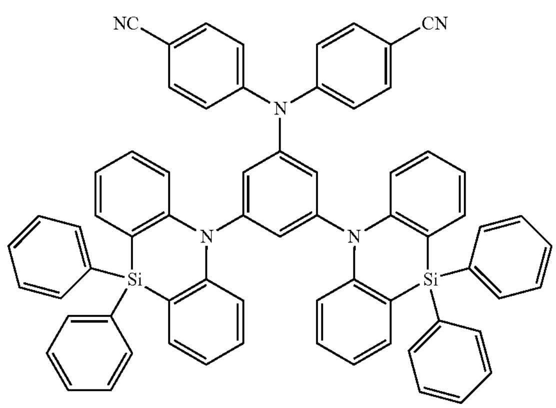
16
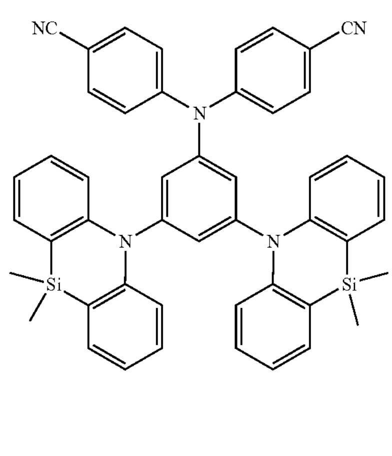
17
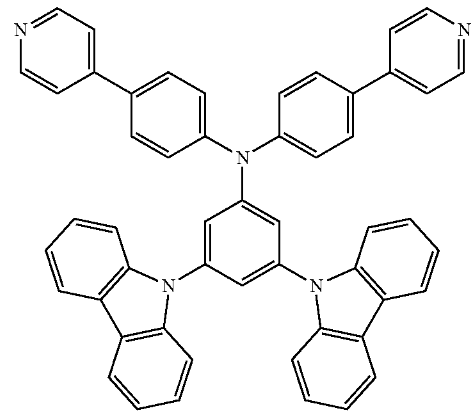
18
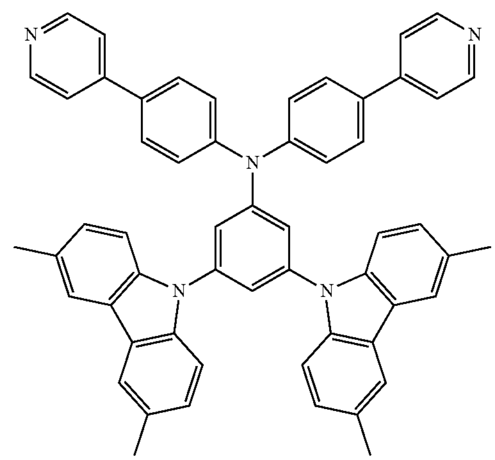
19
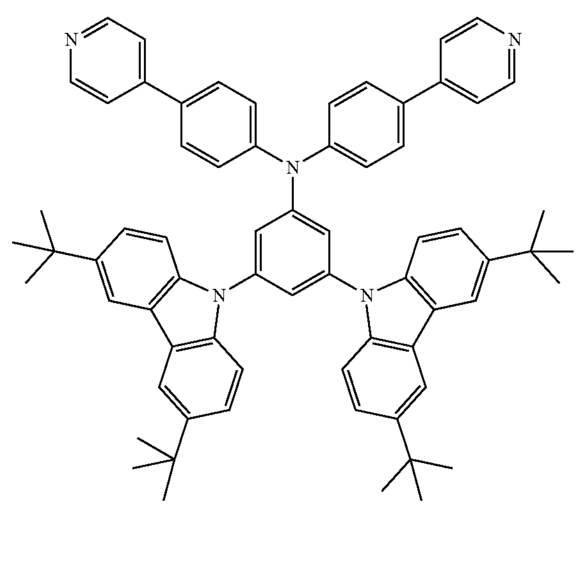

20
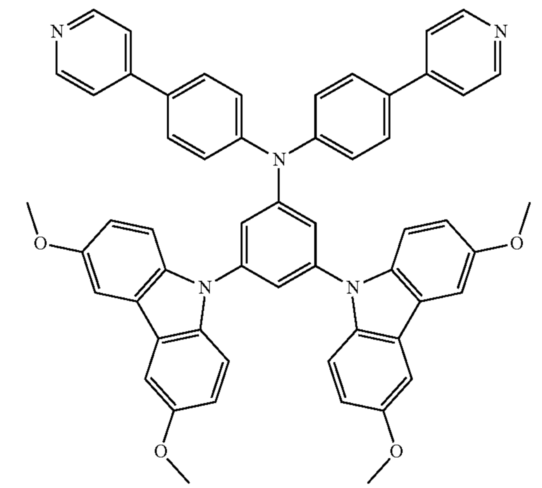
21
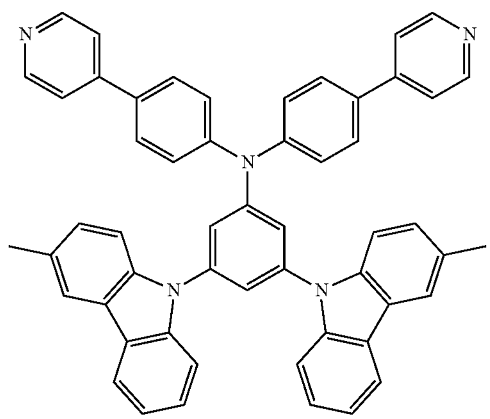
22
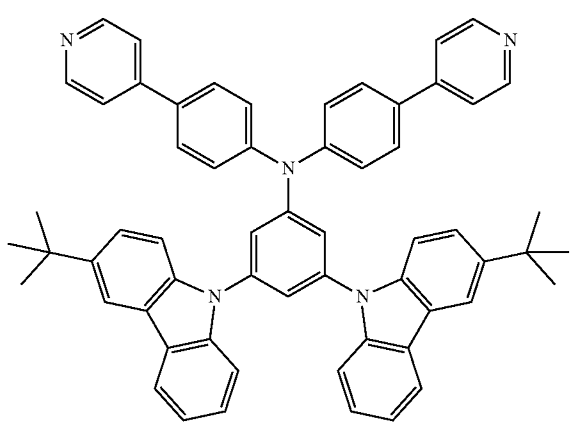
23
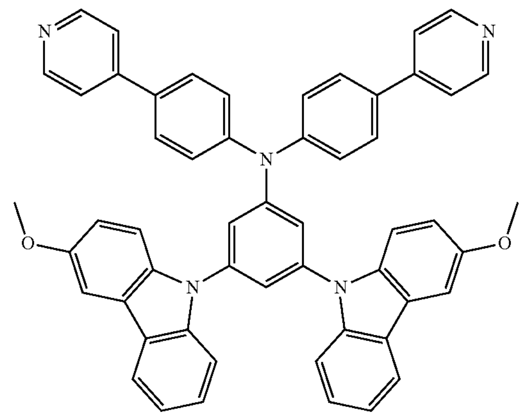
24
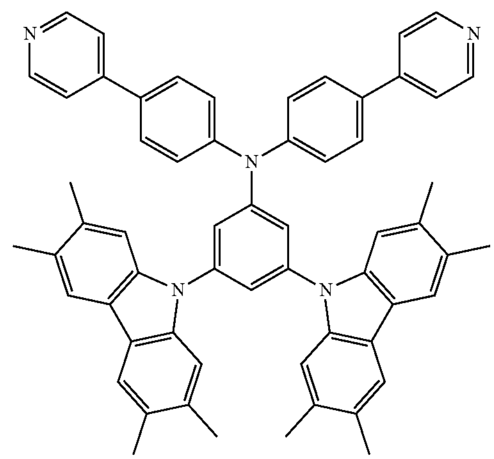
25
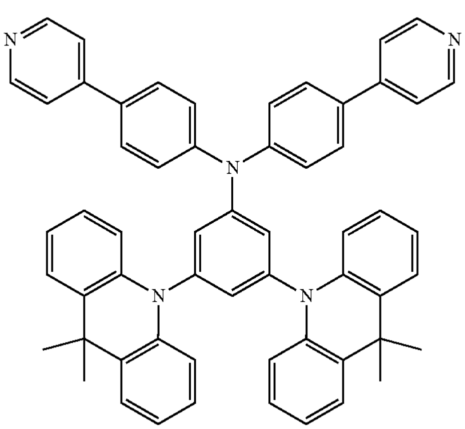

-continued
26
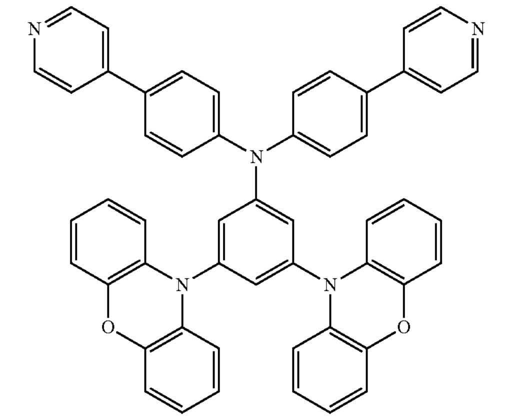
27
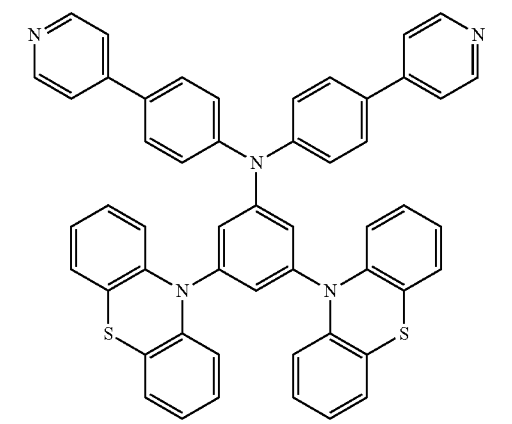
28
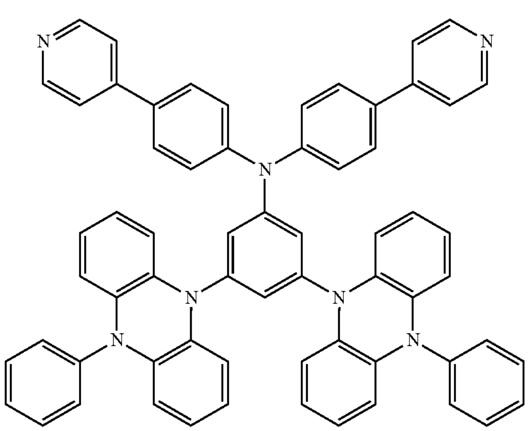
-continued
29
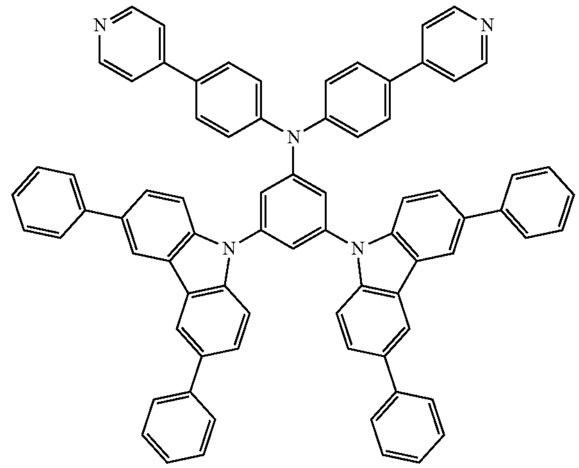
30
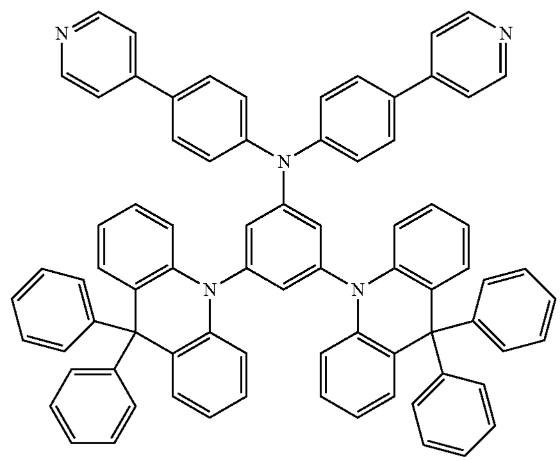
31
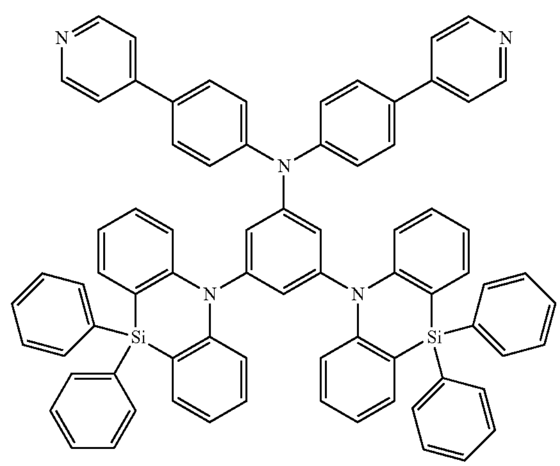

-continued
32
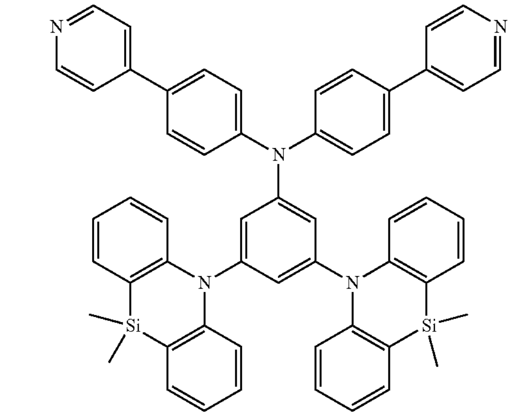
33
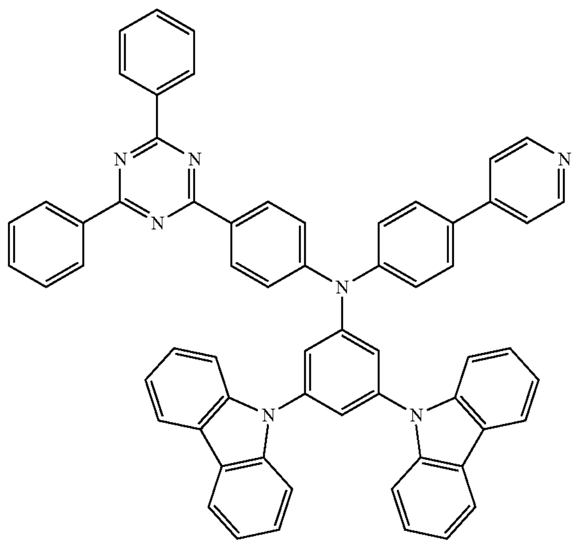
34
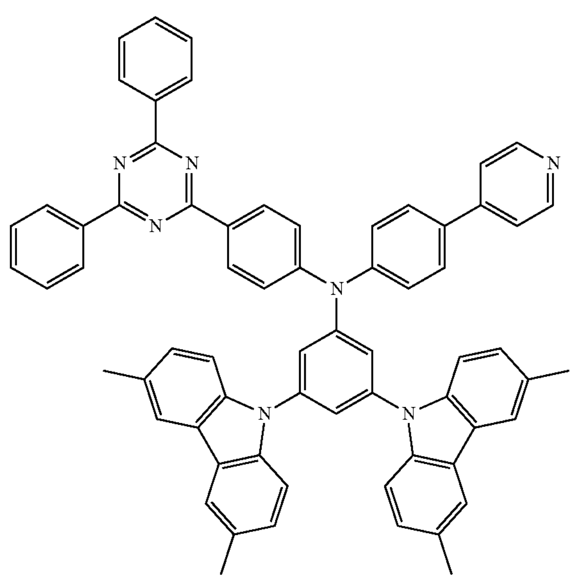
-continued
35
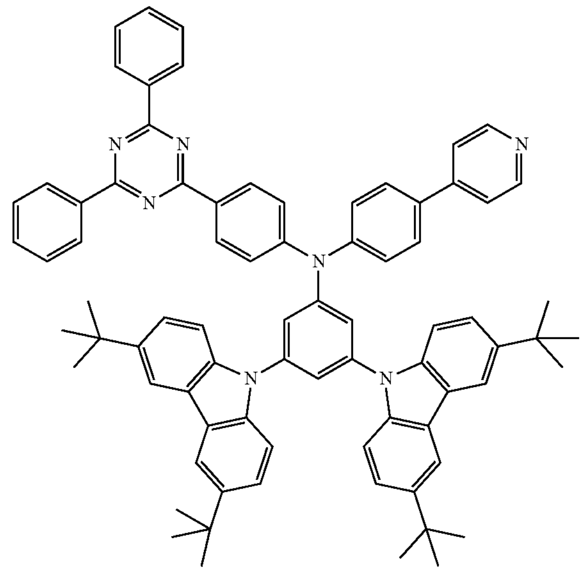
36
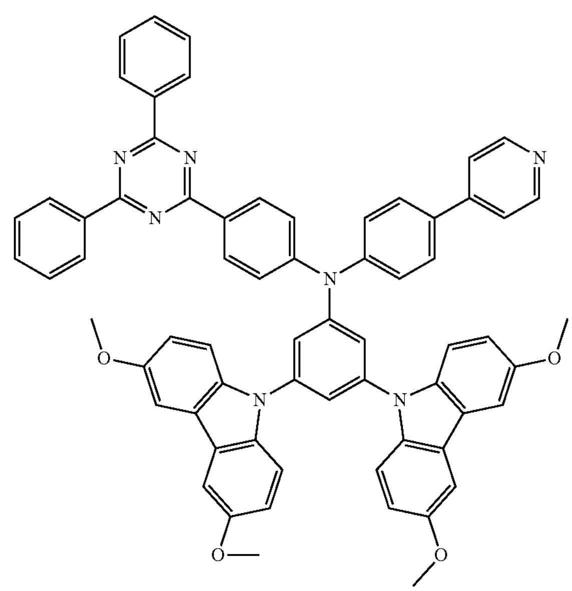

-continued
37
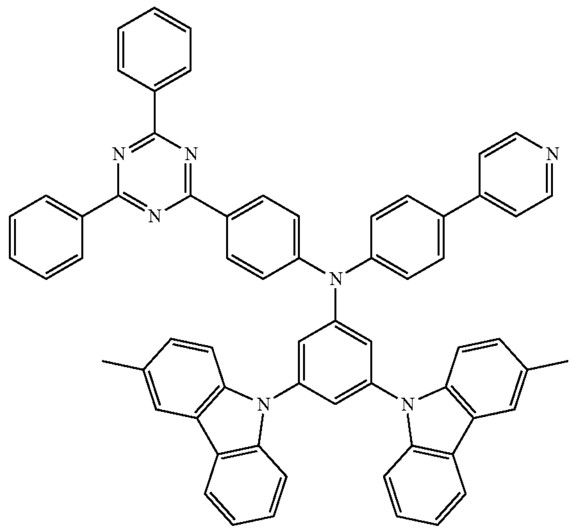
38
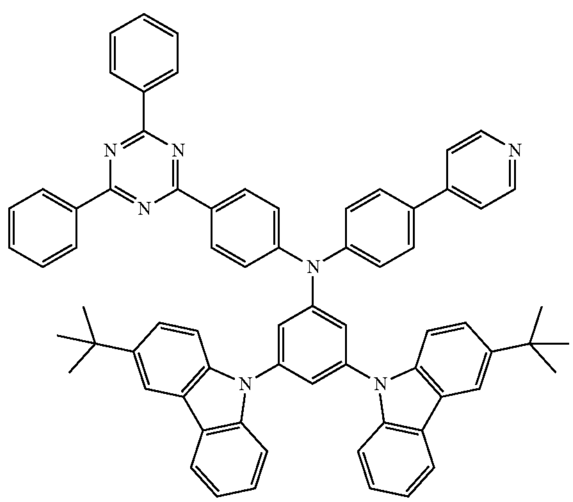
39
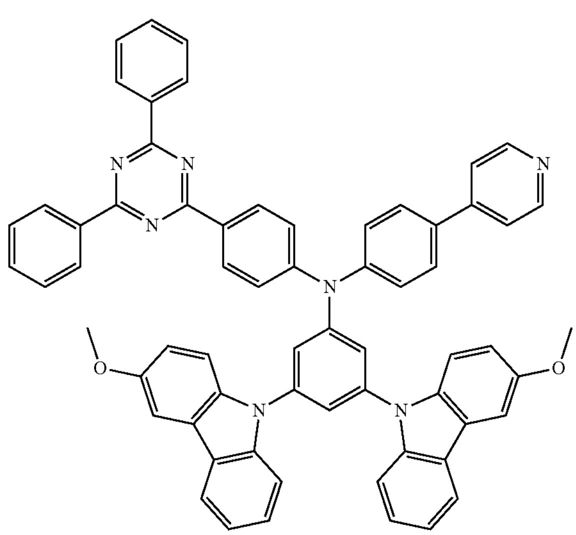
-continued
40
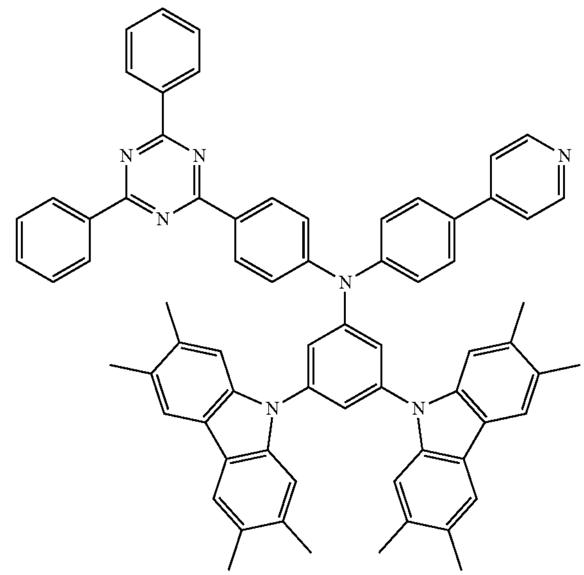
41
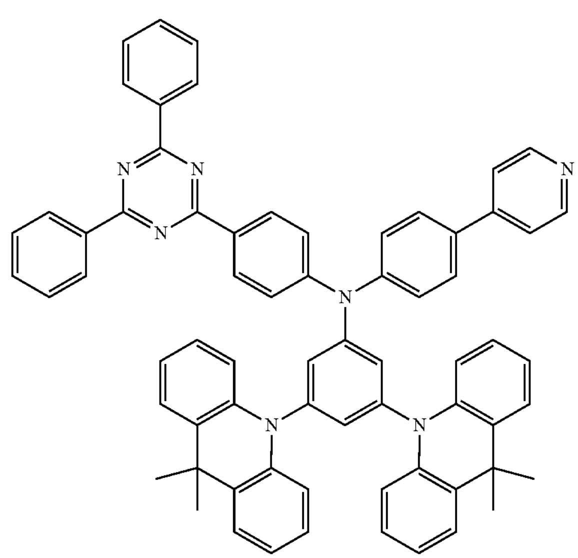

42
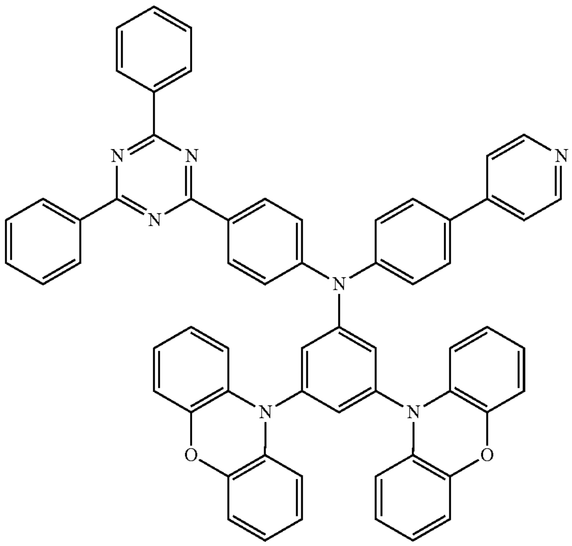
43
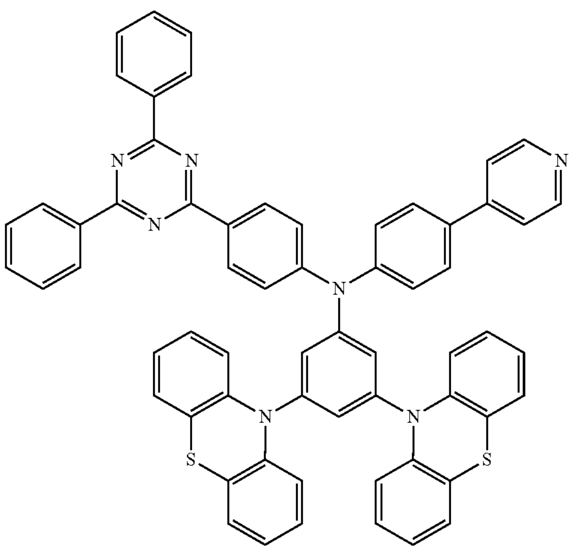
44
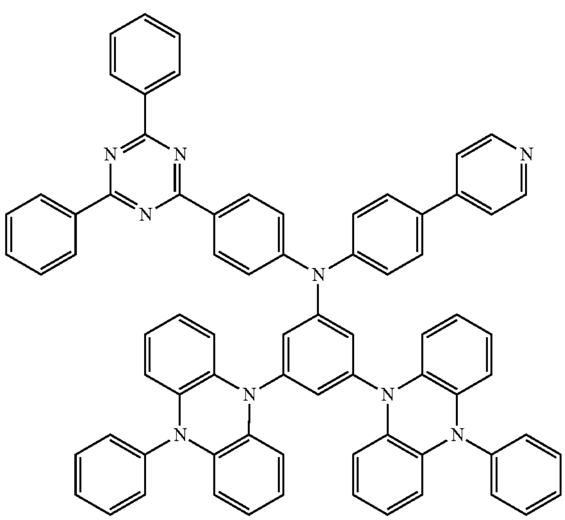
45
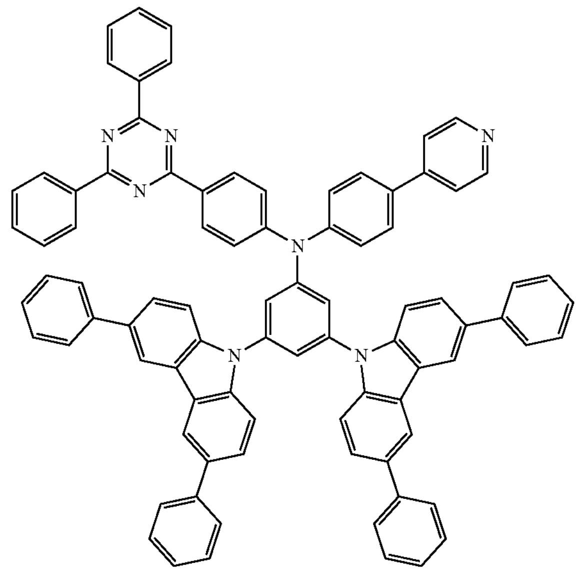
46
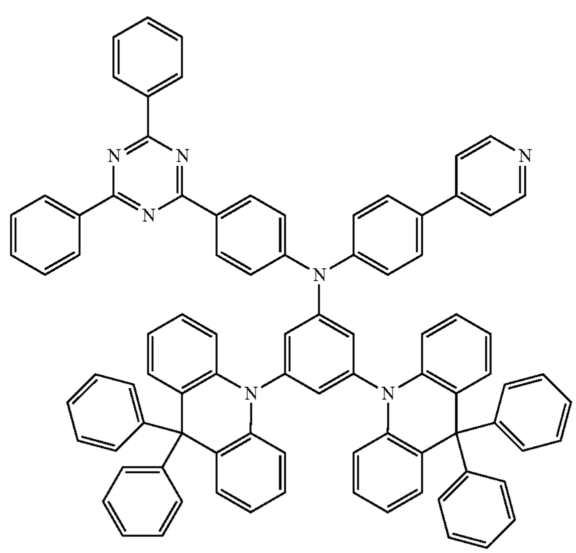

-continued
47
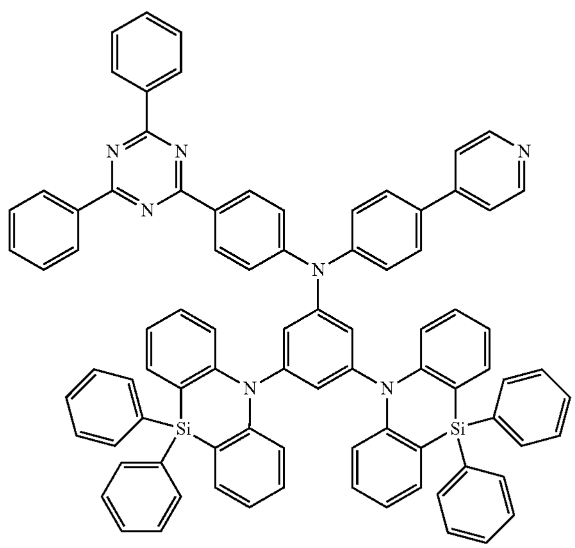
48
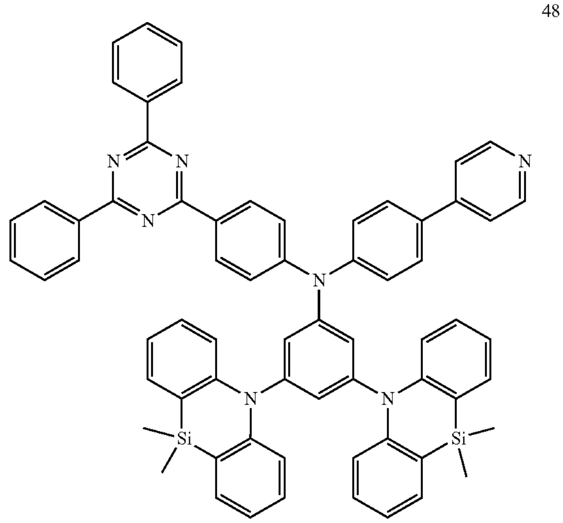
49
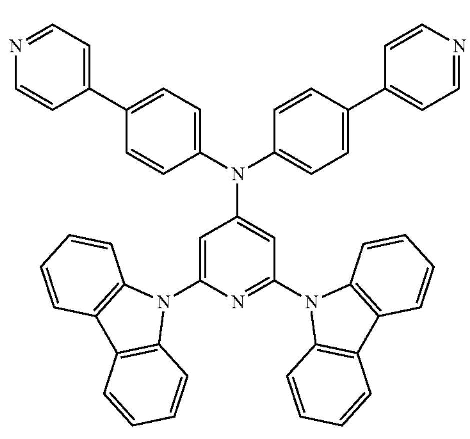
-continued
50
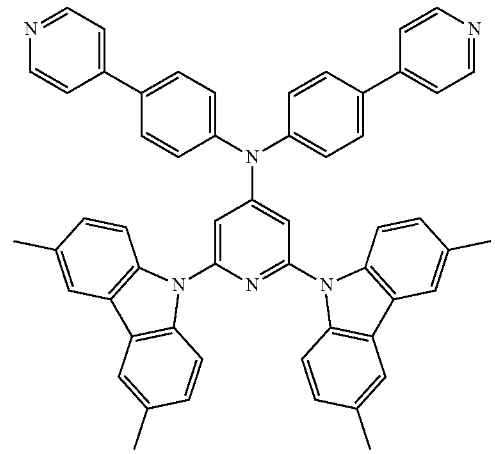
51
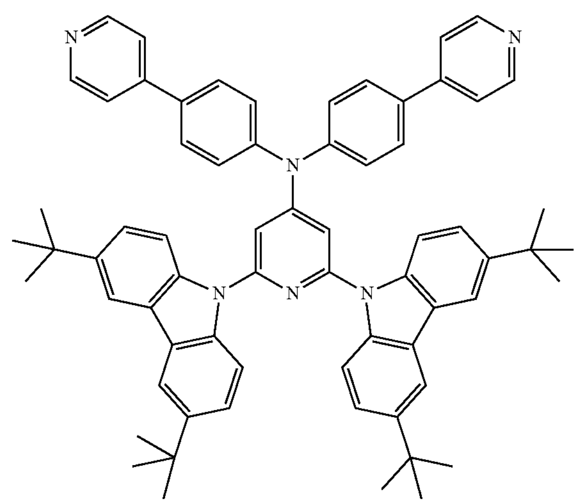
52
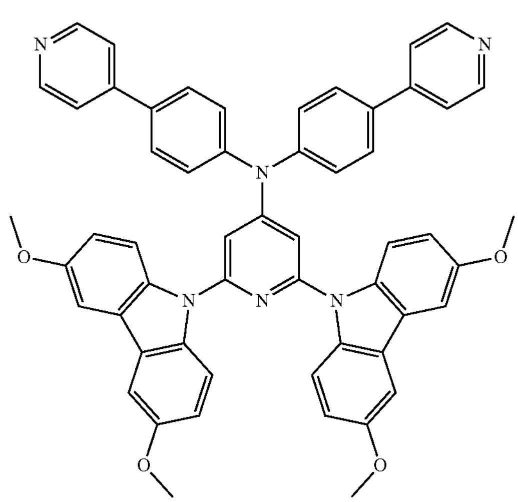

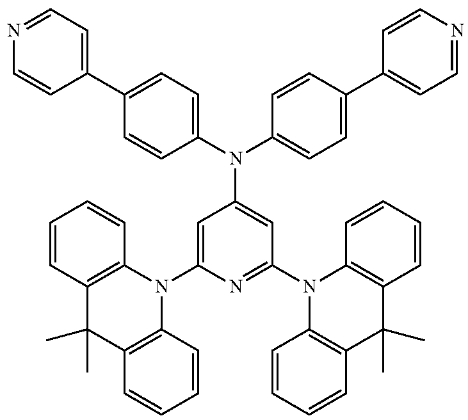
53
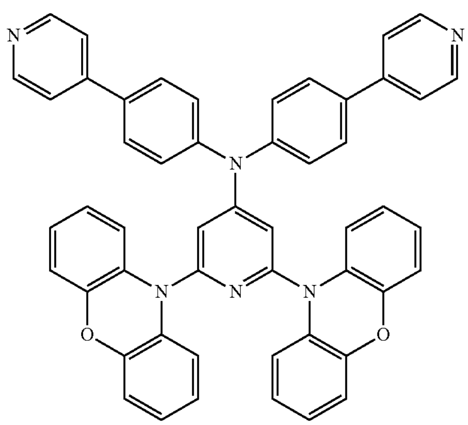
54
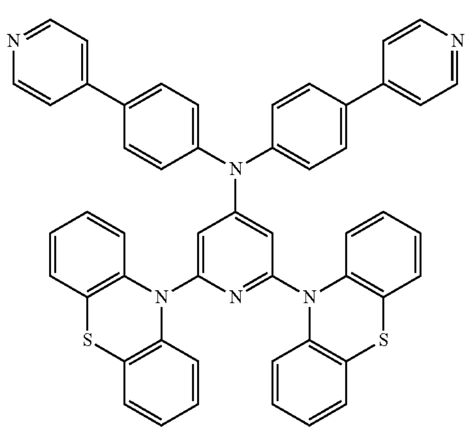
55
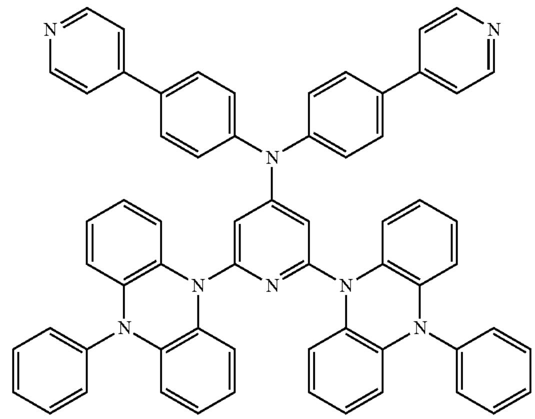
56
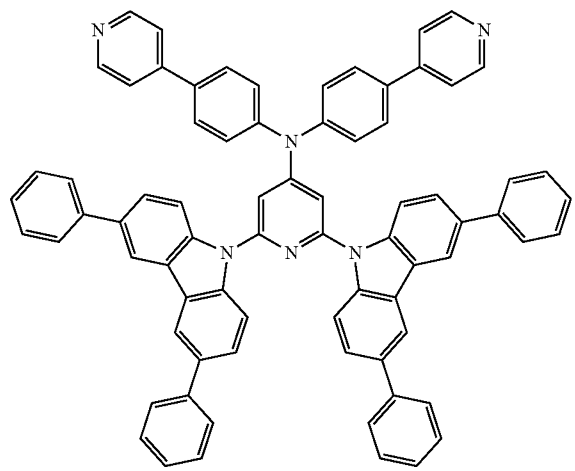
57
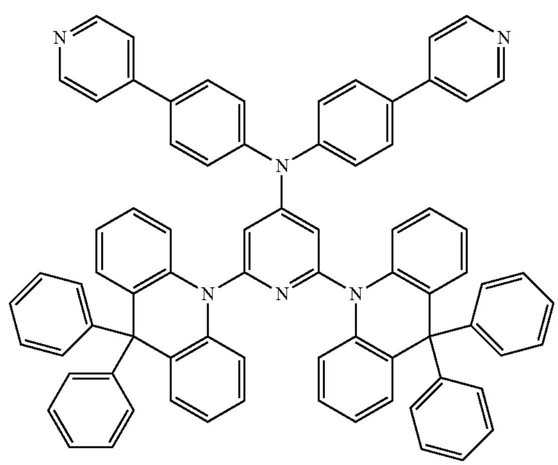
58

-continued
59
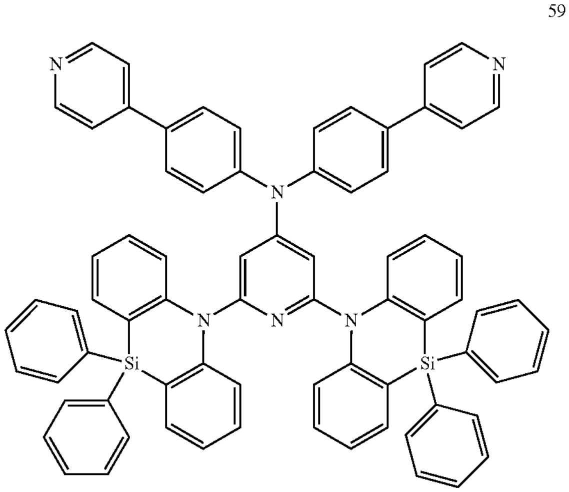
60
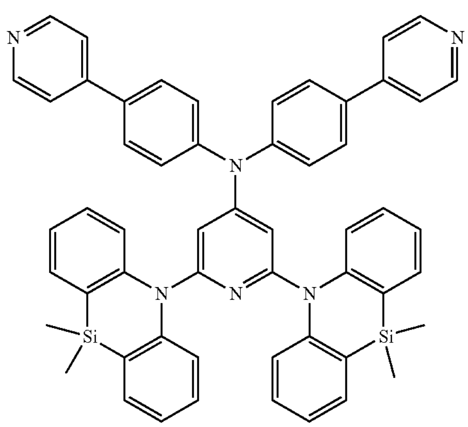
61
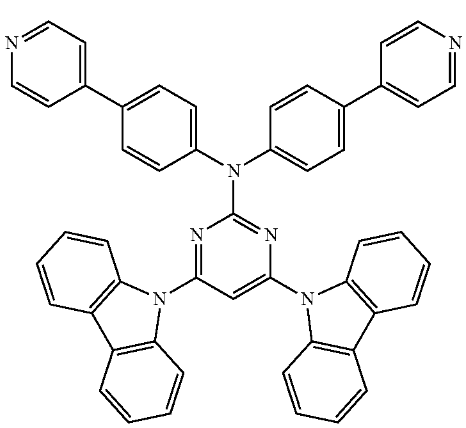
-continued
62
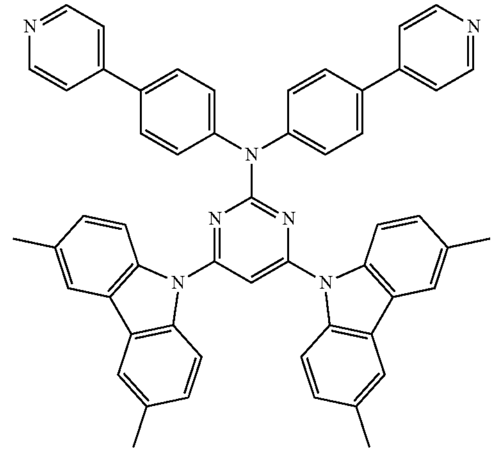
63
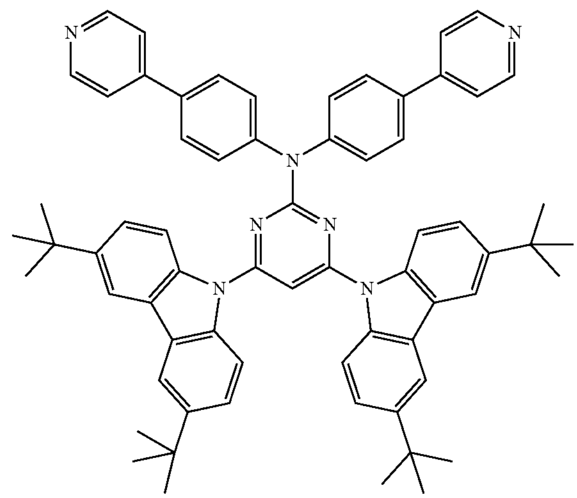
64
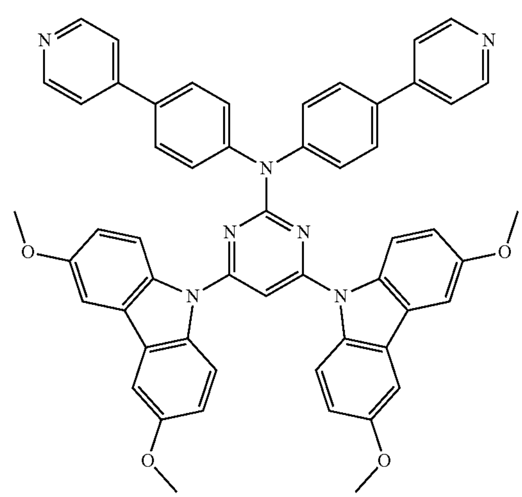

65
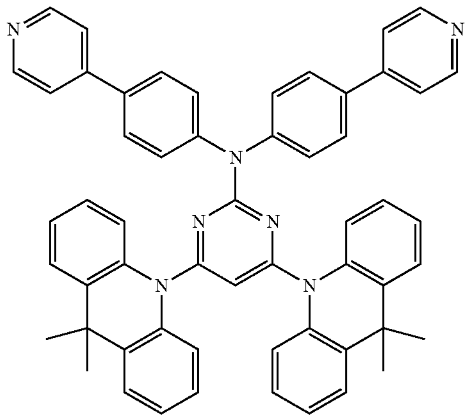
66
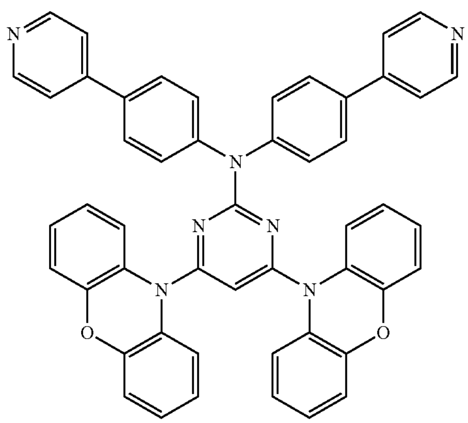
67
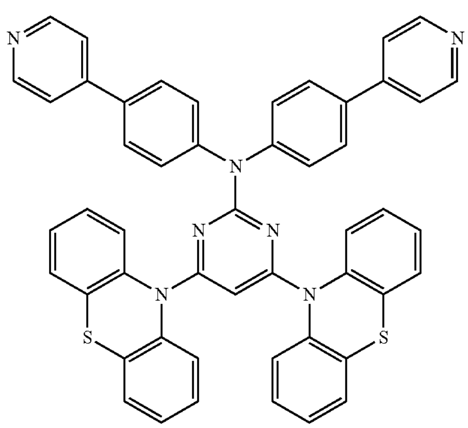
68
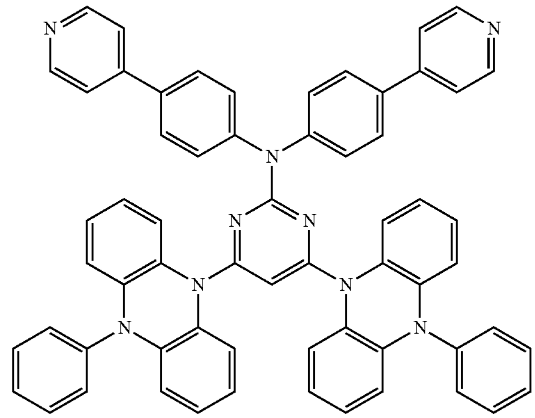
69
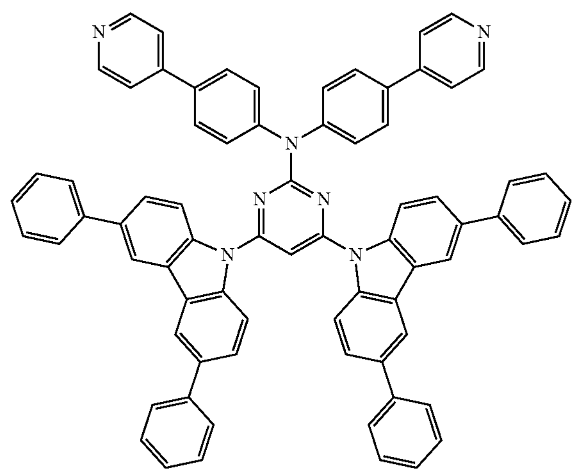
70
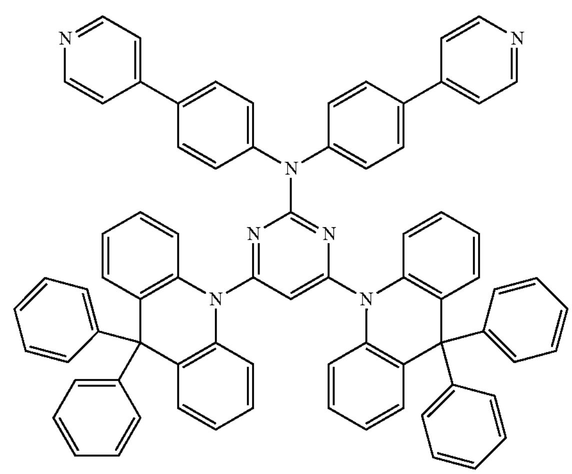

-continued
71
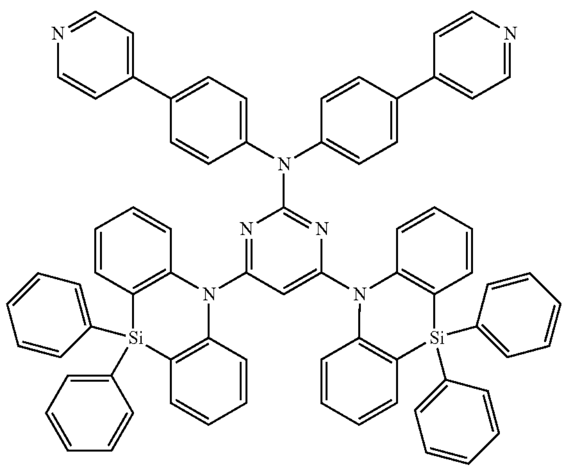
72
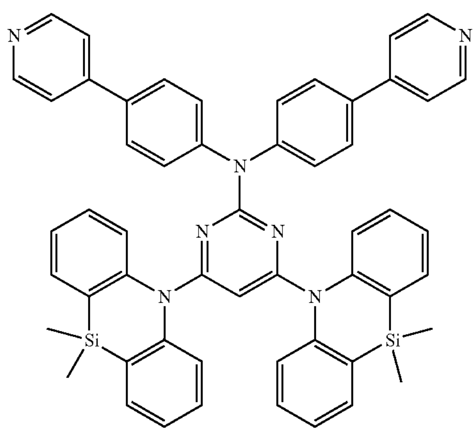
73
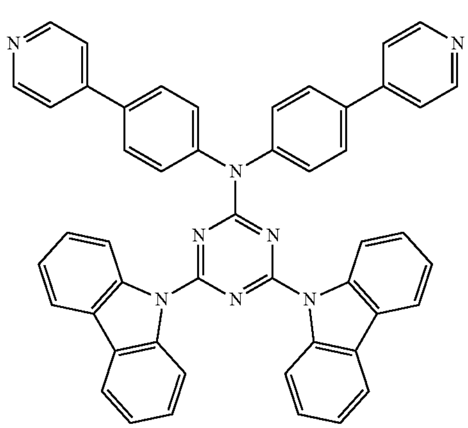
-continued
74
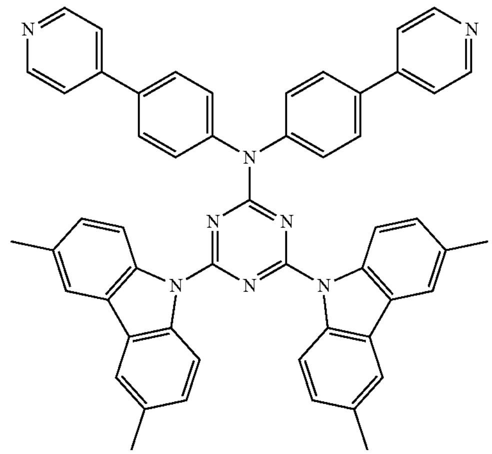
75
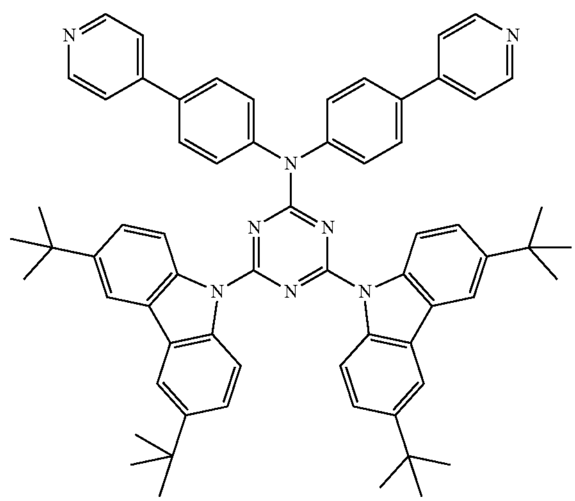
76
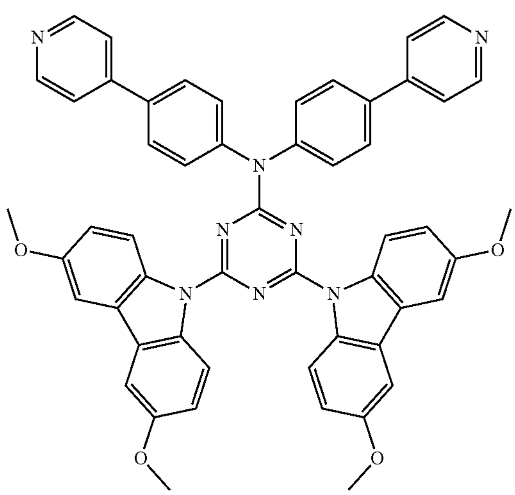

-continued
77
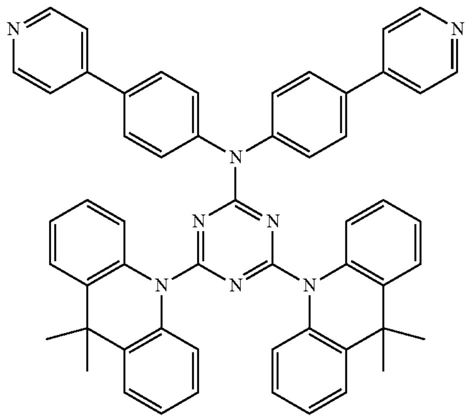
78
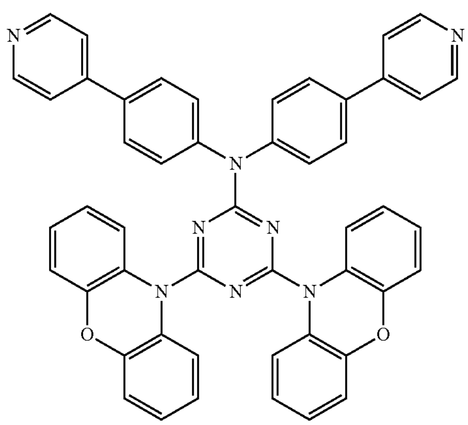
79
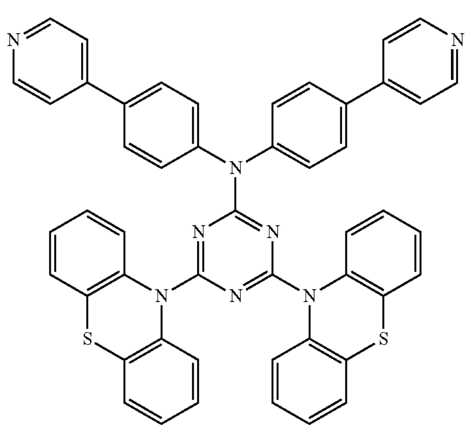
-continued
80
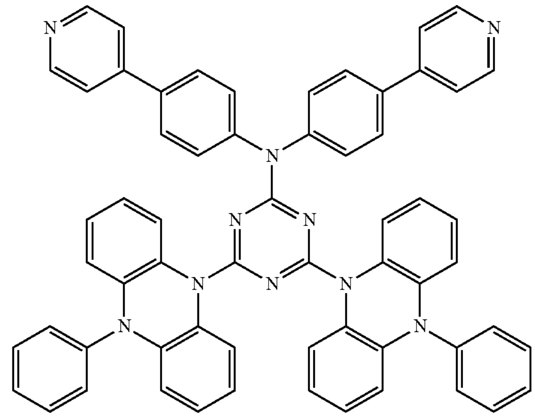
81
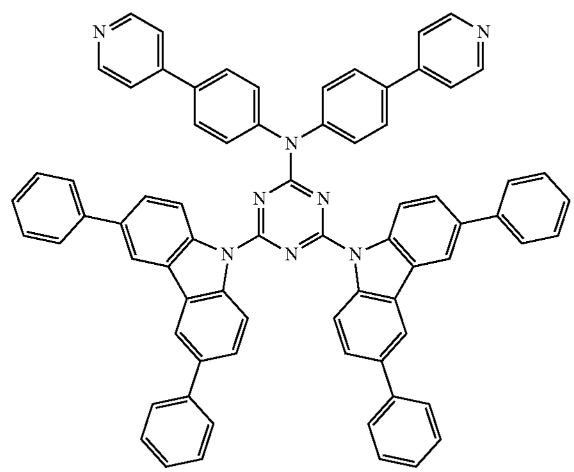
82
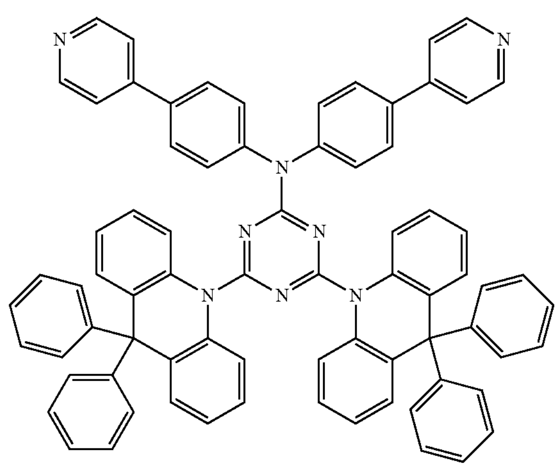

-continued
83
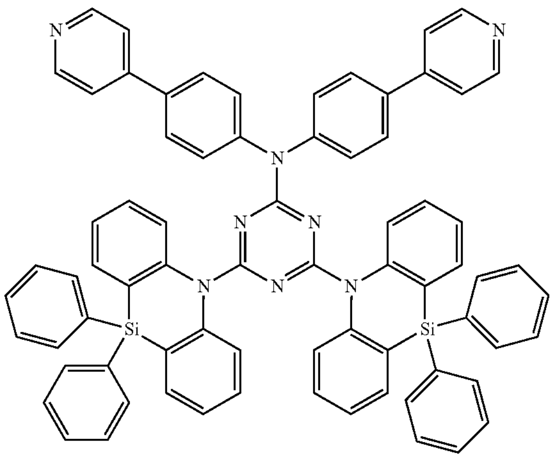
84
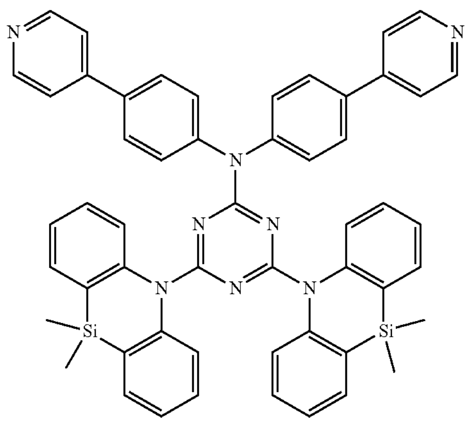
85
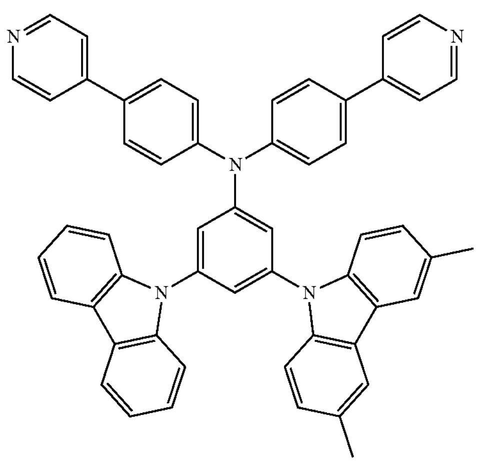
-continued
86
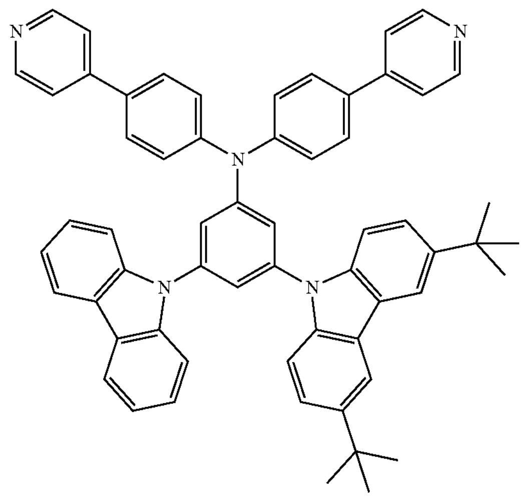
87
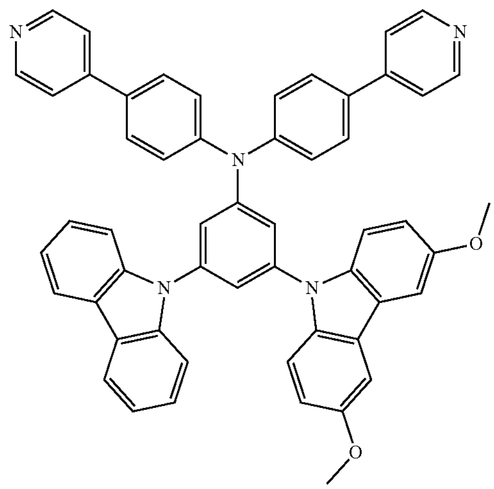
88
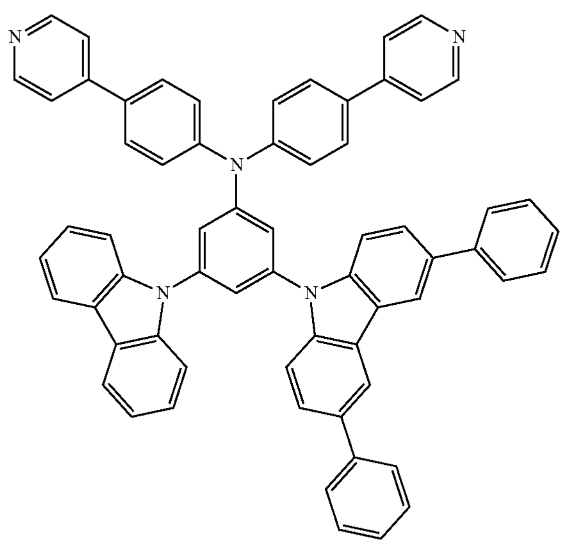

-continued
89
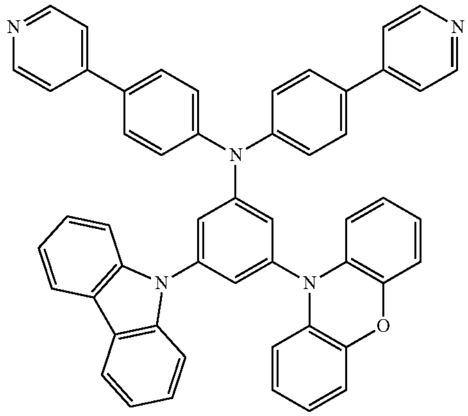
90
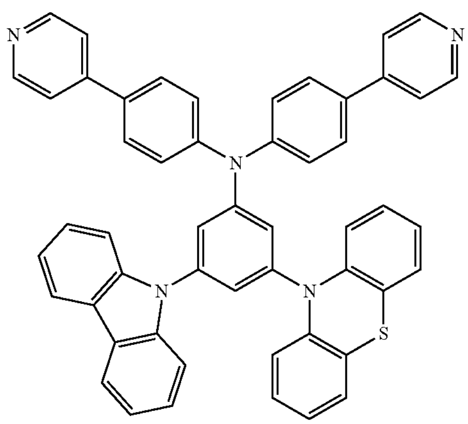
91
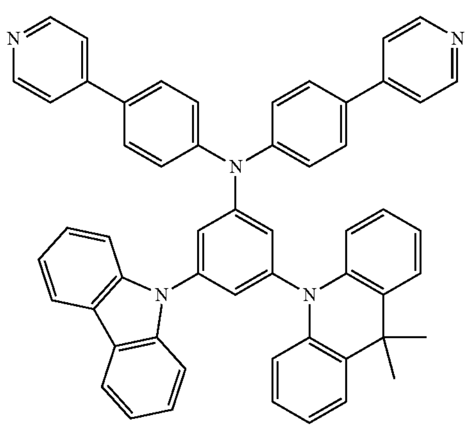
-continued
92
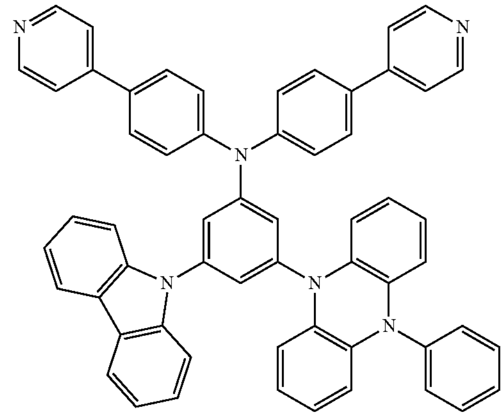
93
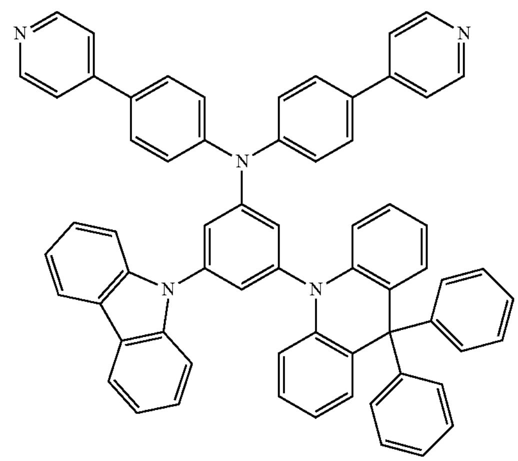
94
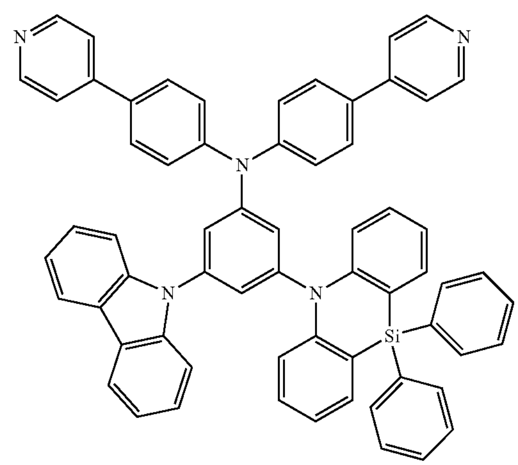

-continued
95
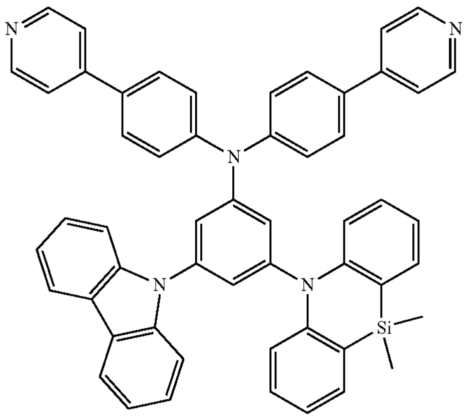
96
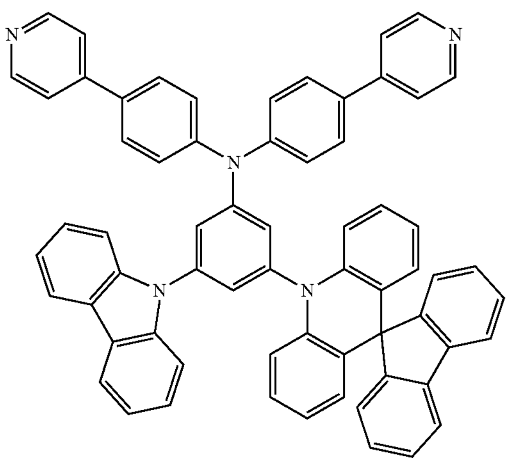
97
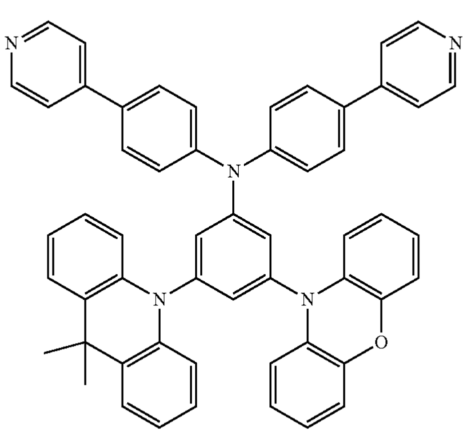
-continued
98
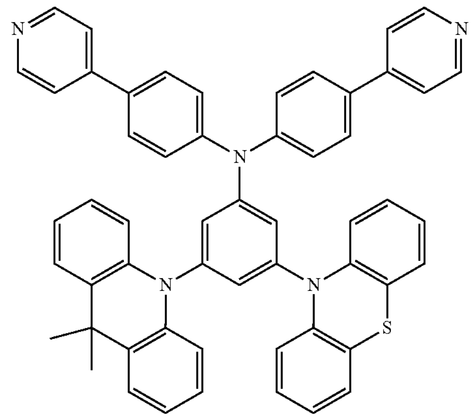
99
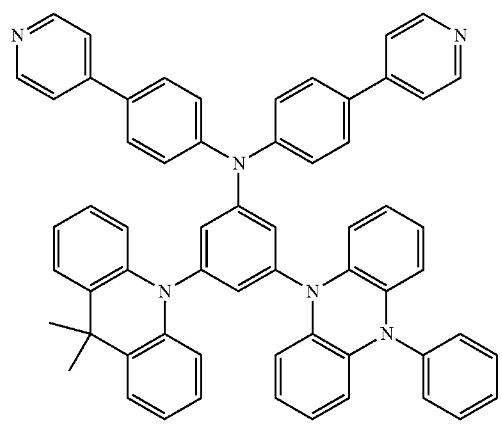
100
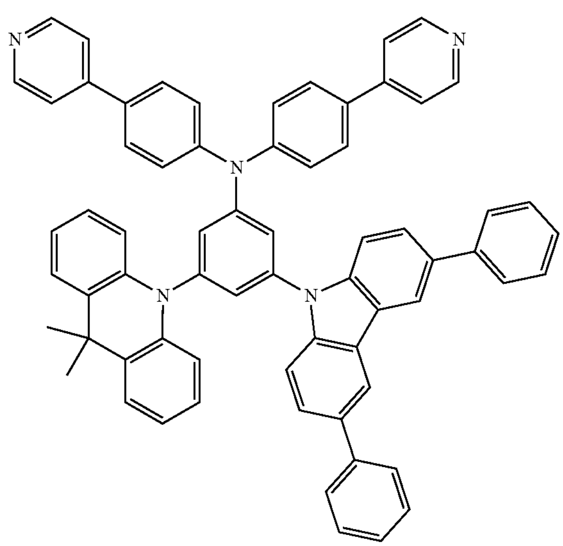

101
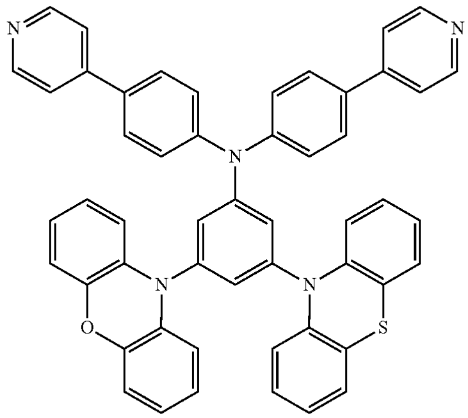
102
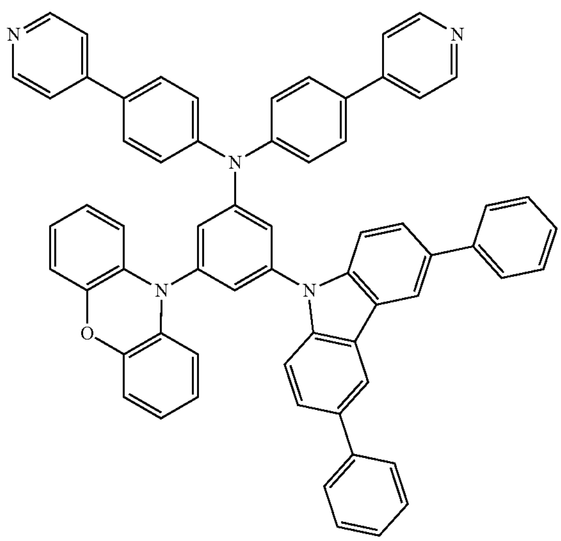
103
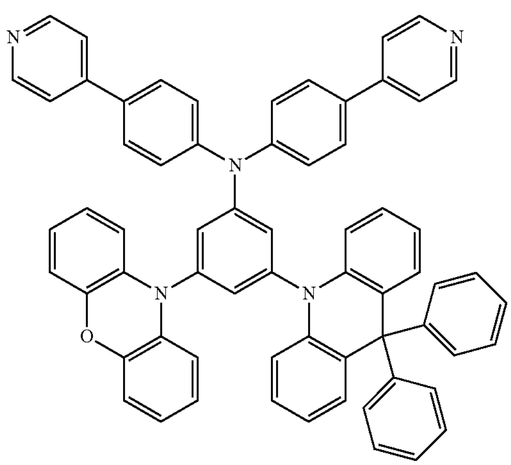
104
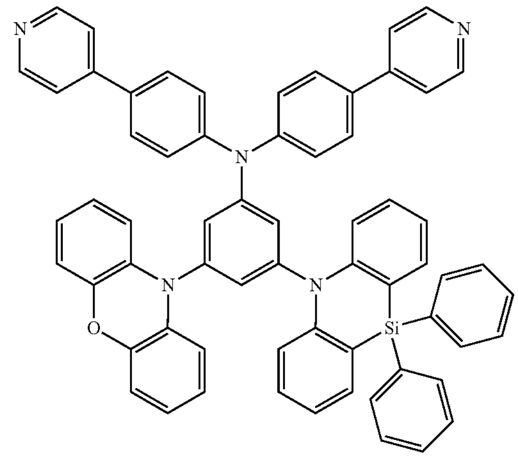
105
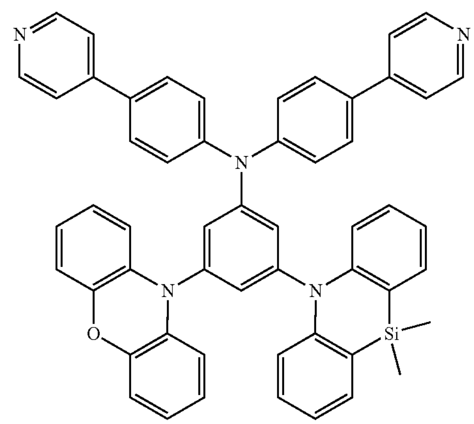
106
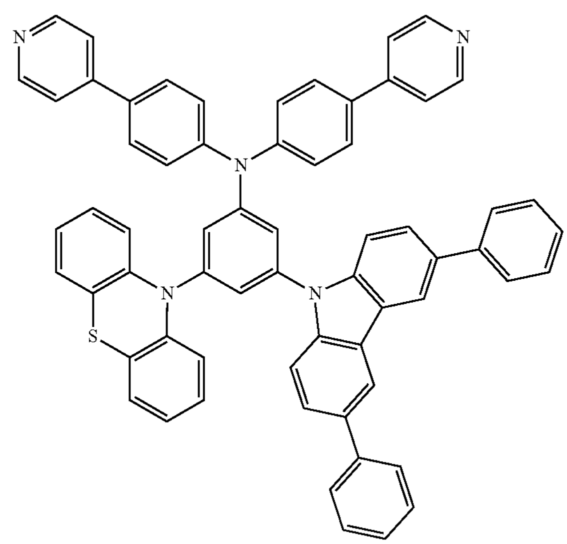

-continued
107
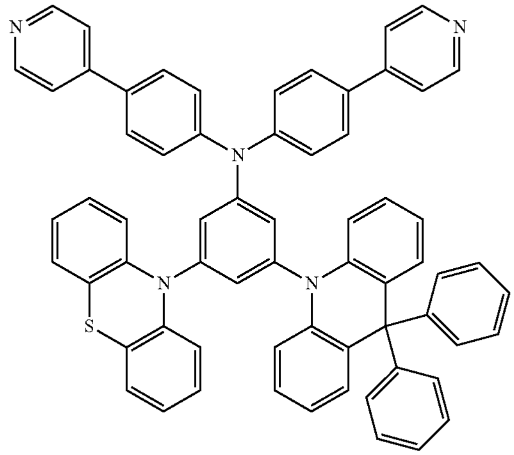
108
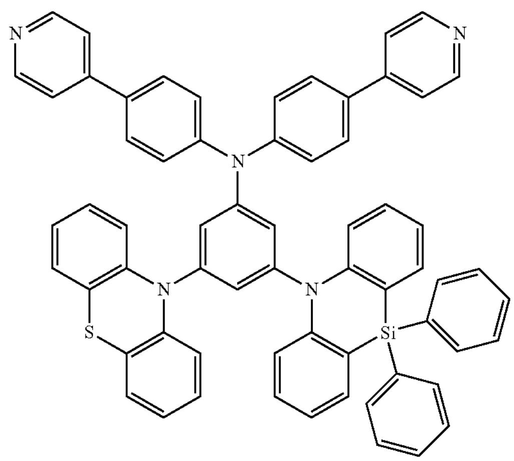
109
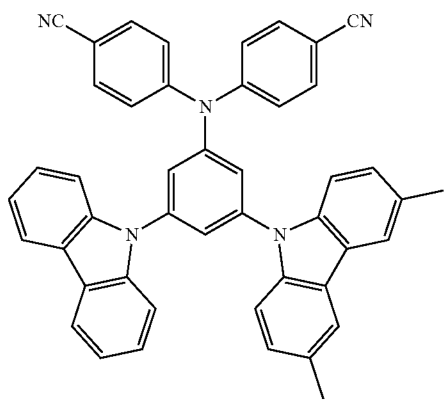
-continued
110
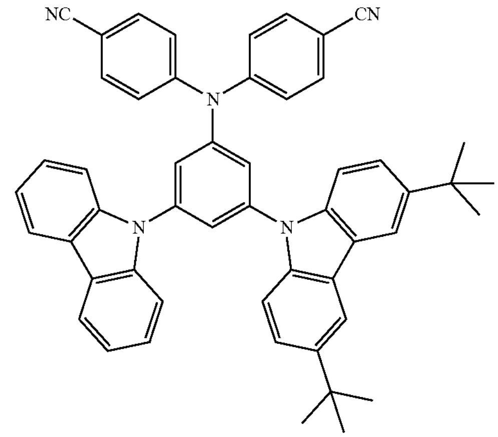
111
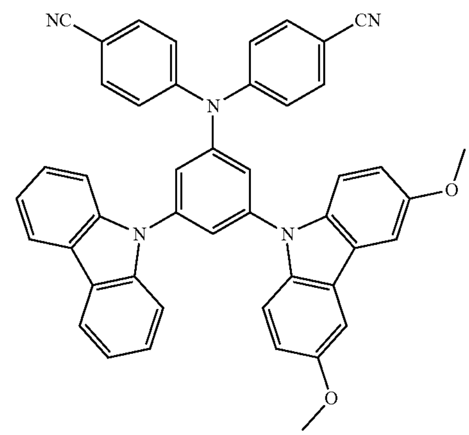
112
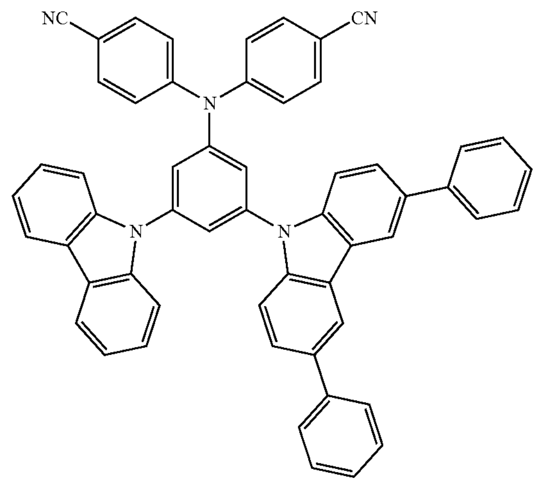

-continued
113
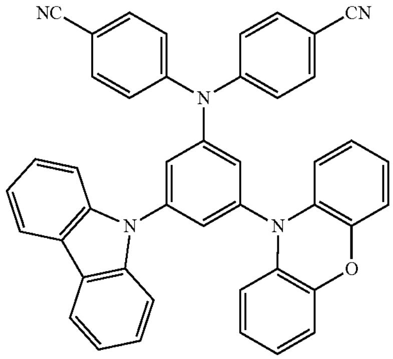
114
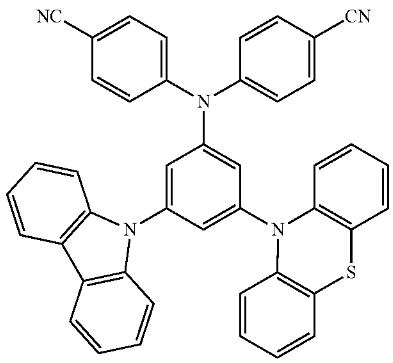
115
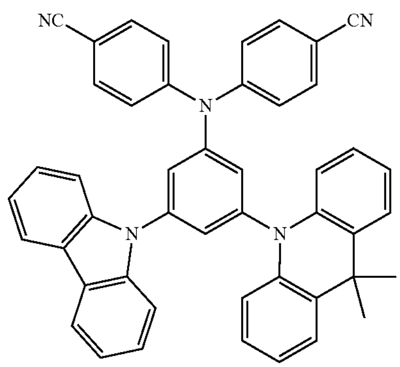
116
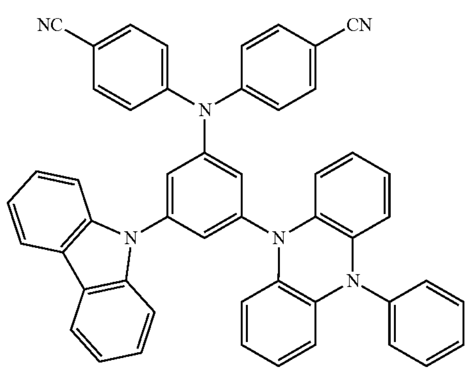
-continued
117
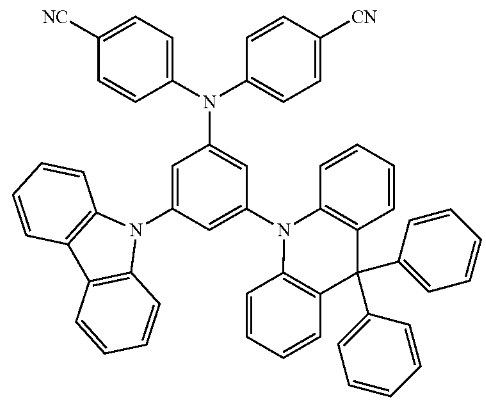
118
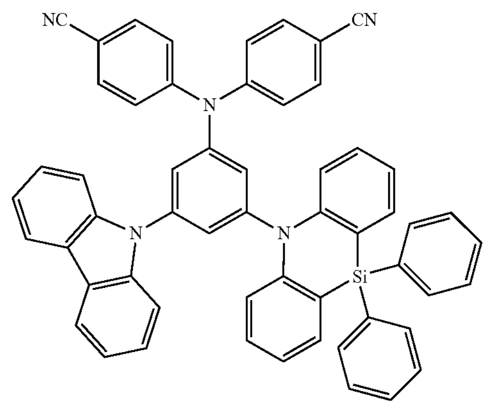
119
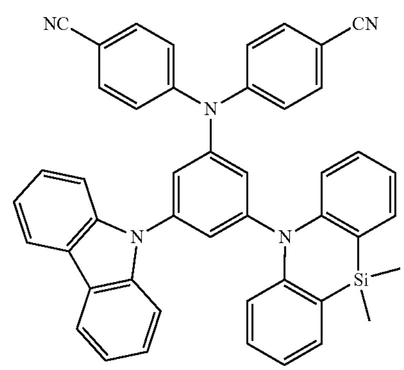
120
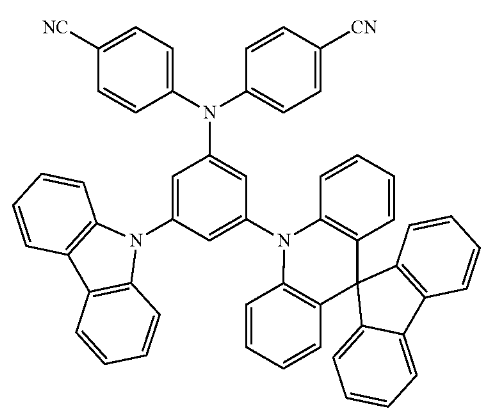

-continued
121
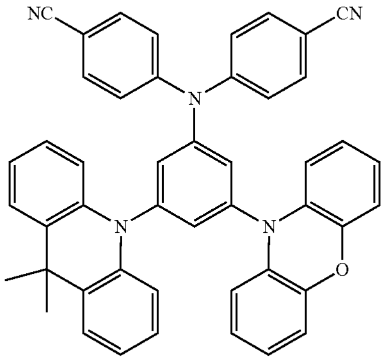
122
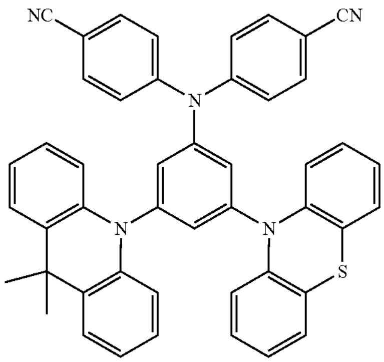
123
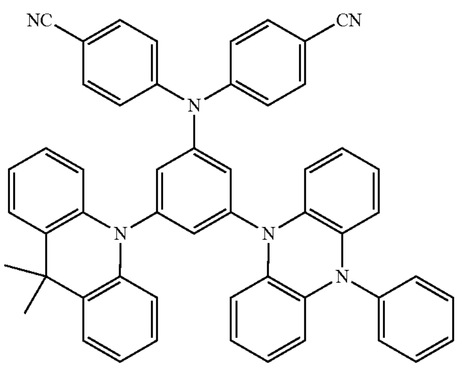
124
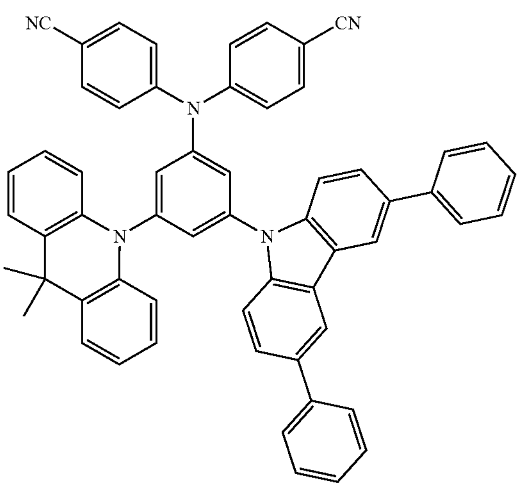
-continued
125
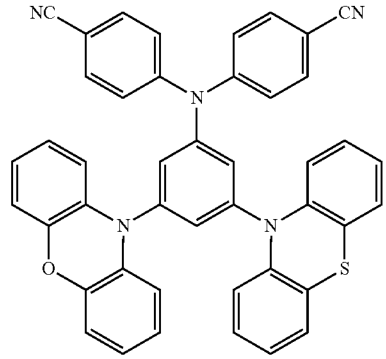
126
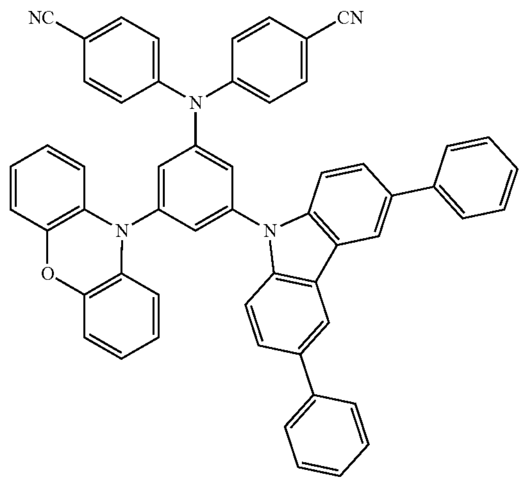
127
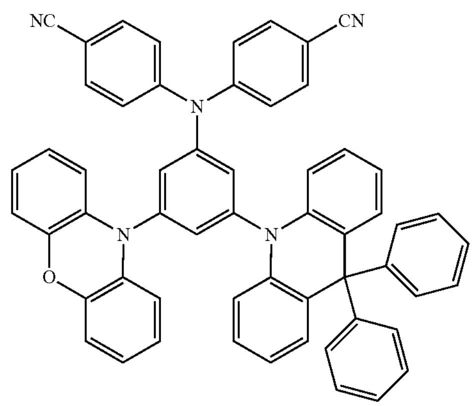
128
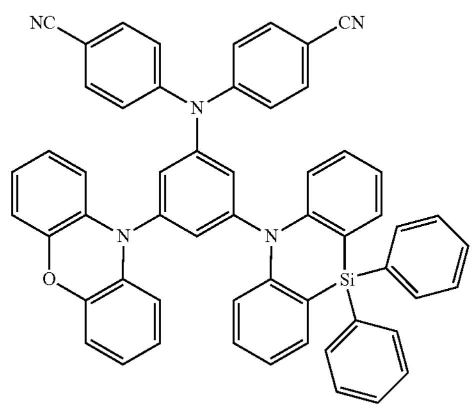

-continued
129
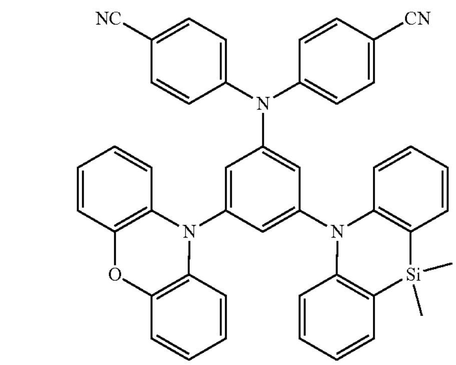
130
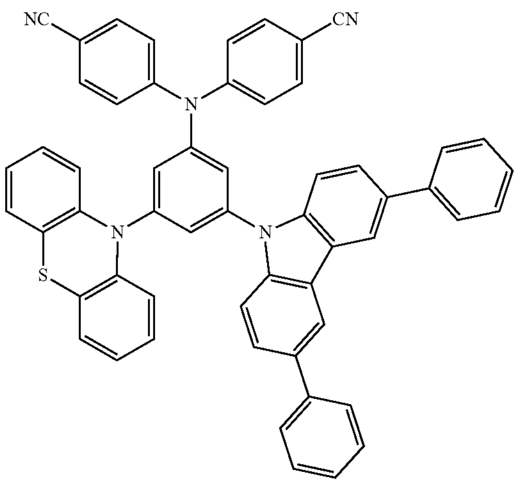
131
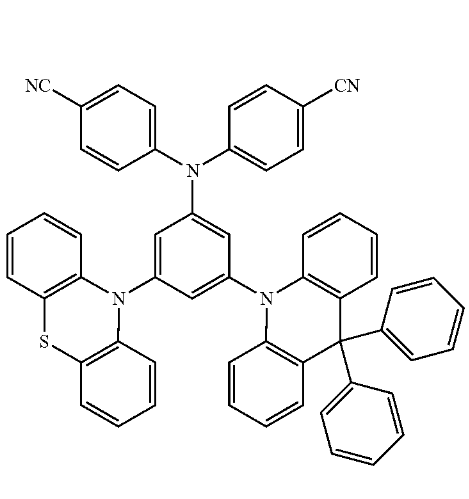
-continued
132
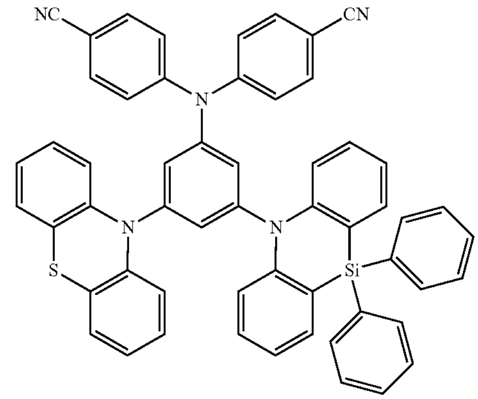
133
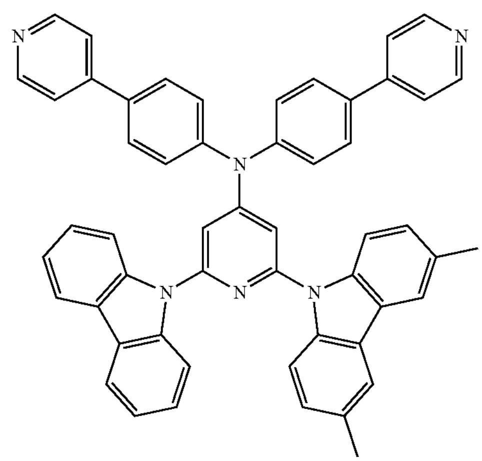
134
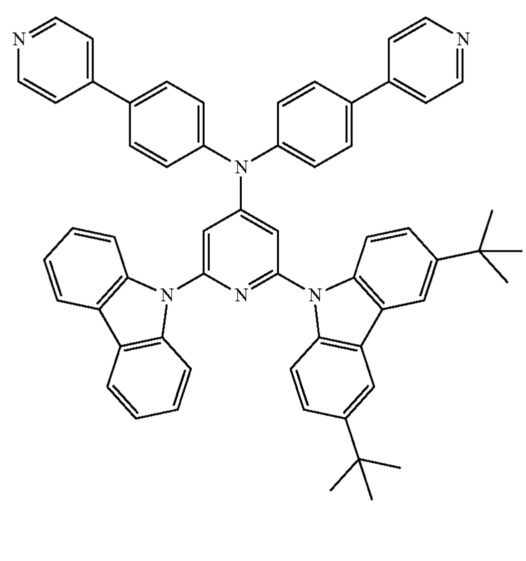

-continued
135
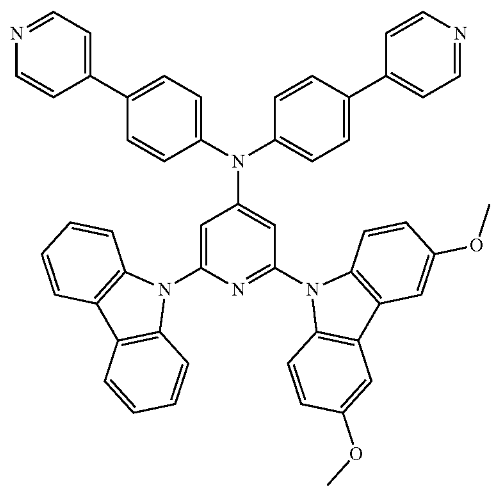
136
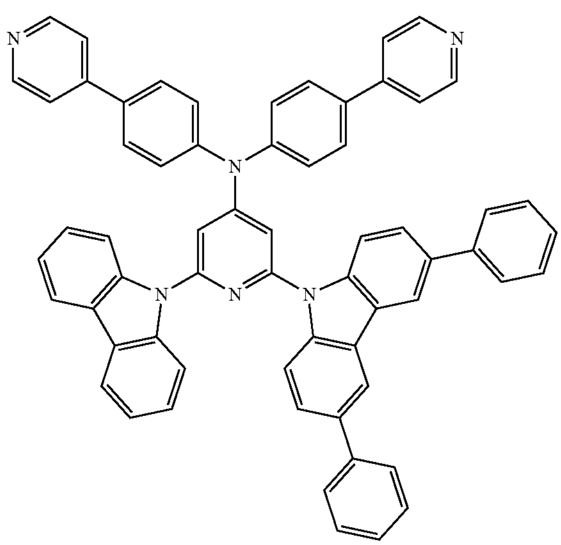
137
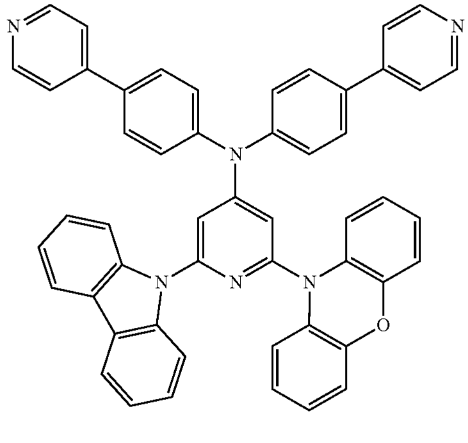
-continued
138
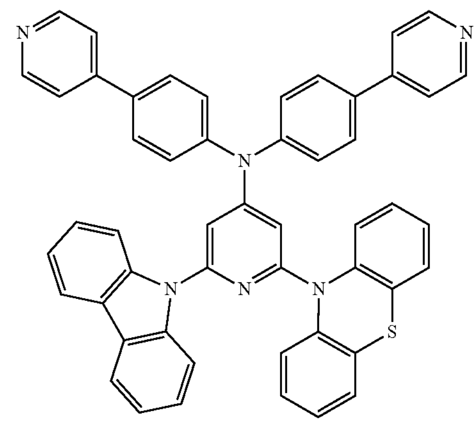
139
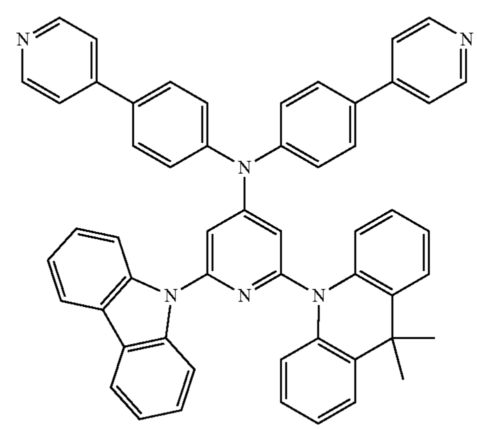
140
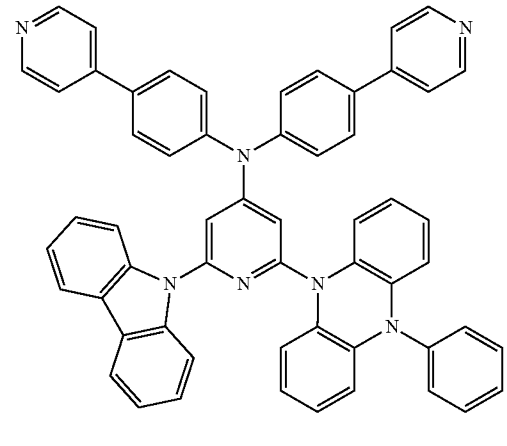

-continued
141
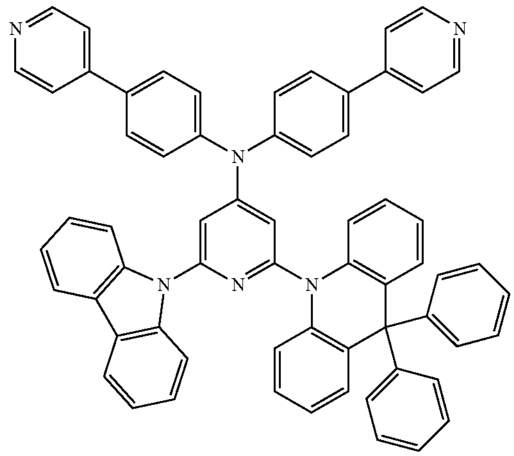
142
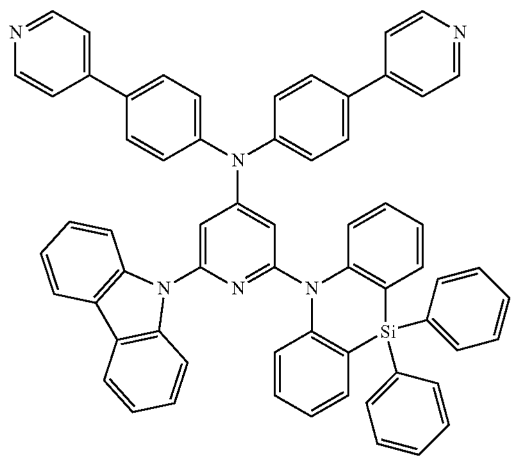
143
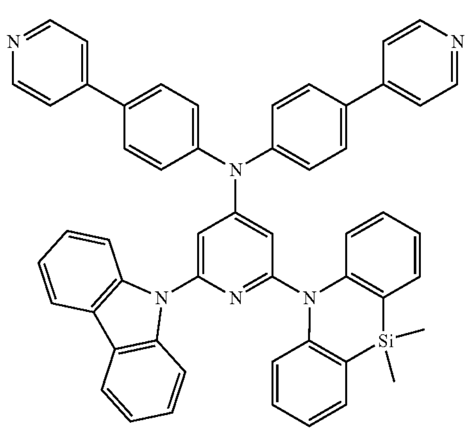
-continued
144
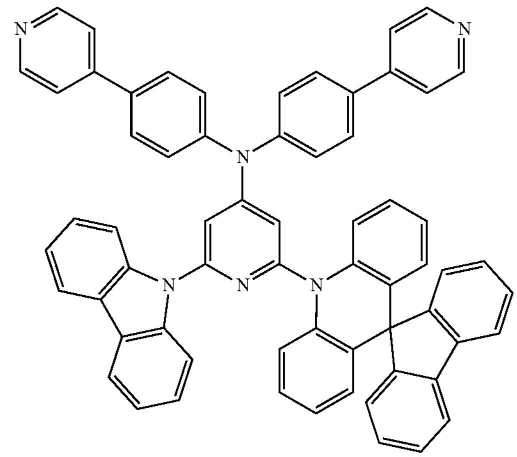
145
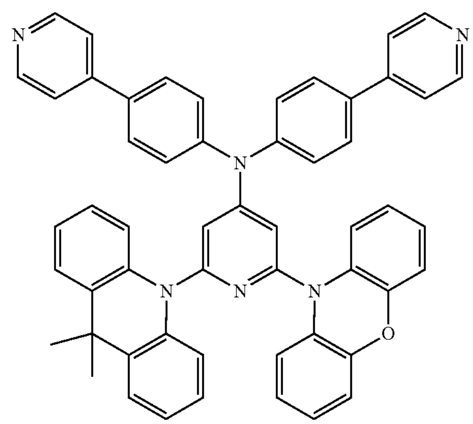
146
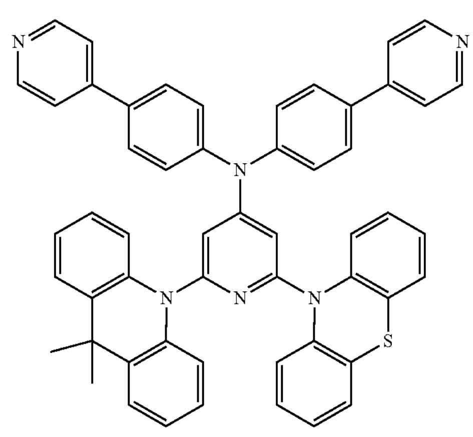

-continued
147
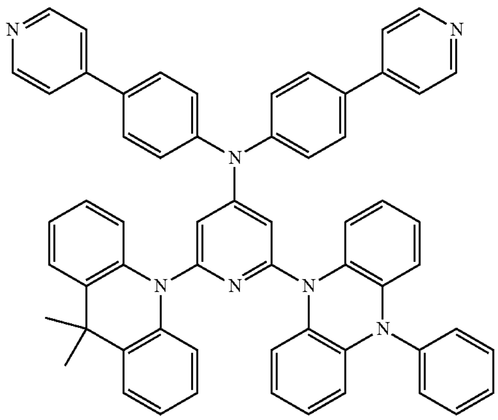
148
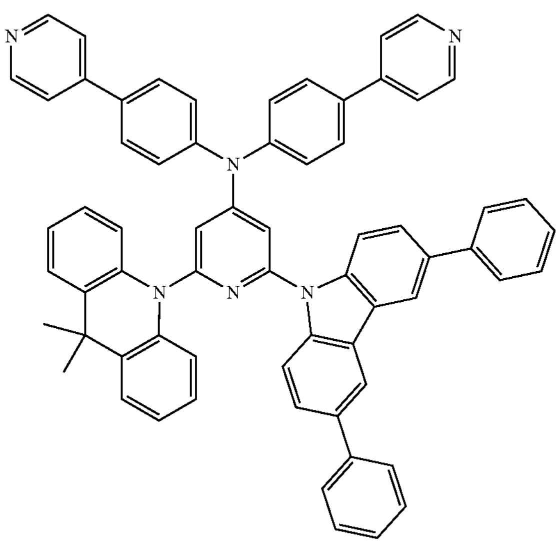
149
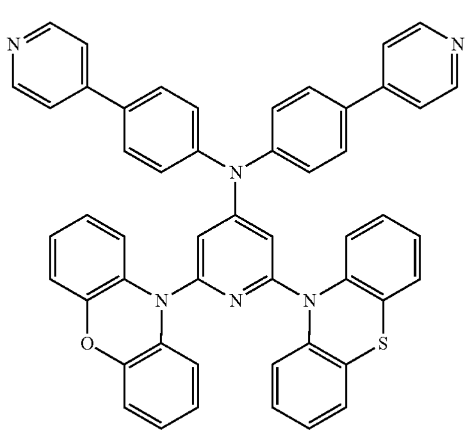
-continued
150
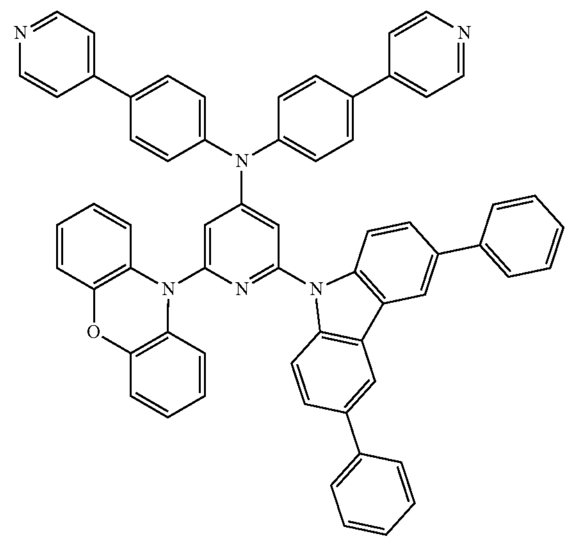
151
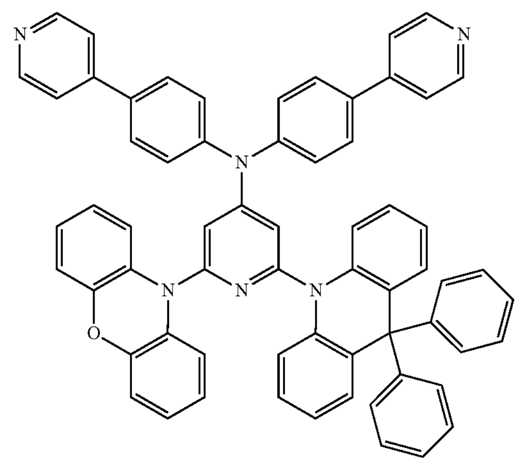
152
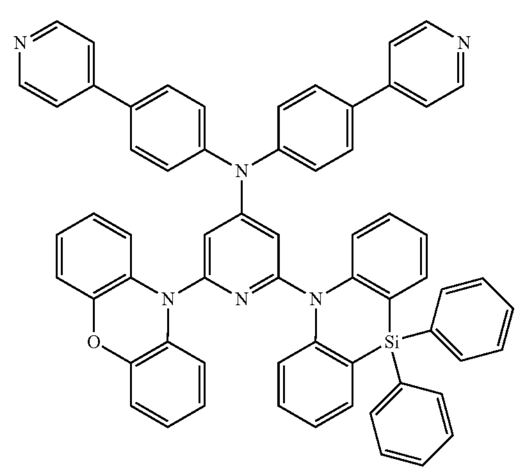

153
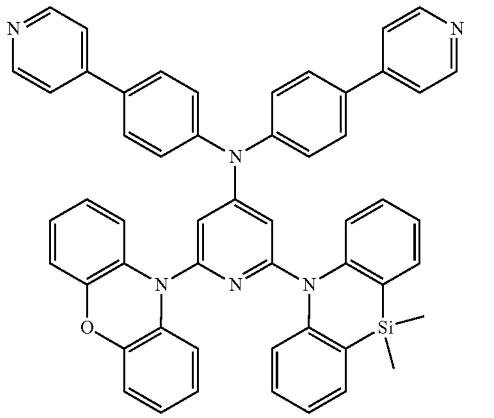
154
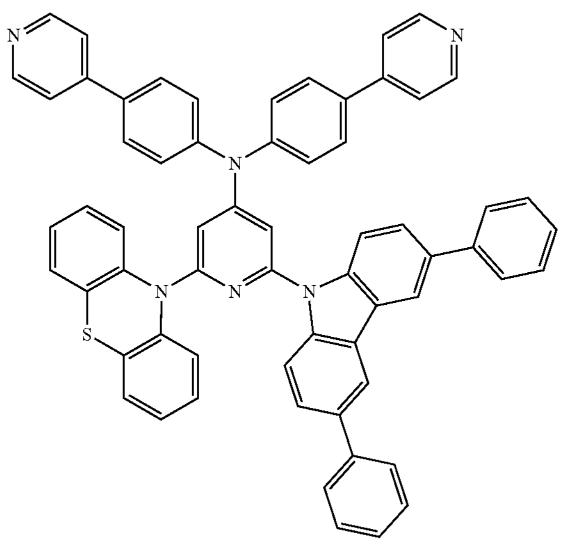
155
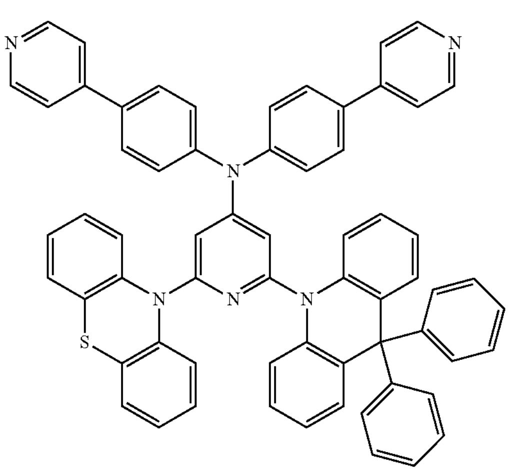
156
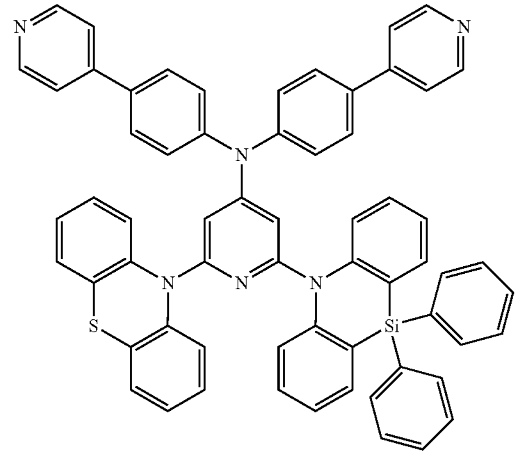
157
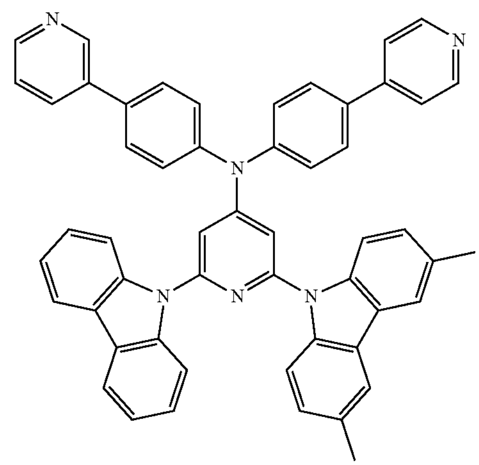
158
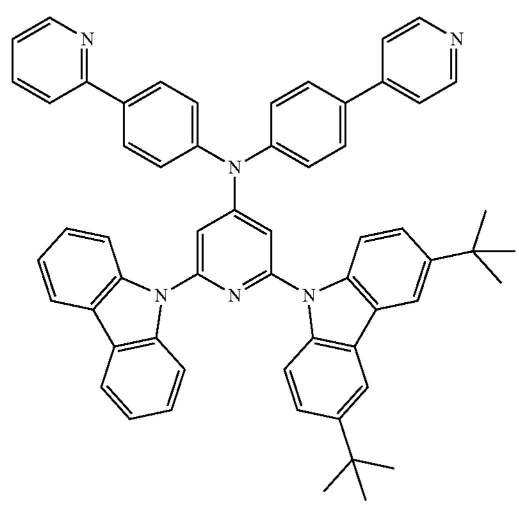

-continued
159
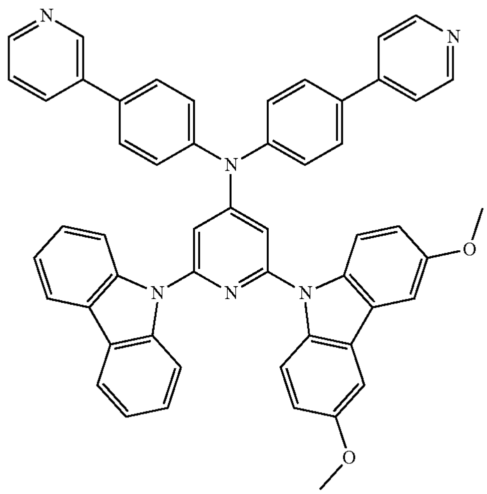
160
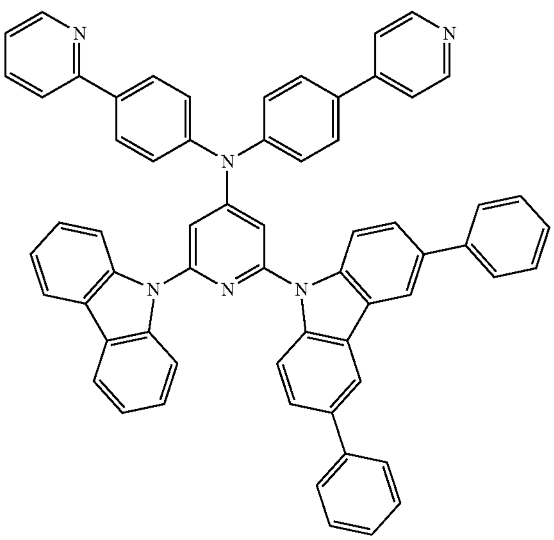
161
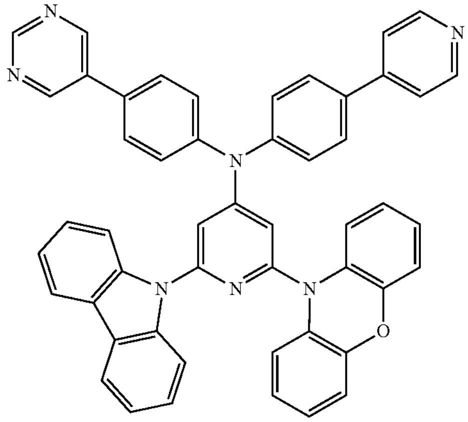
-continued
162
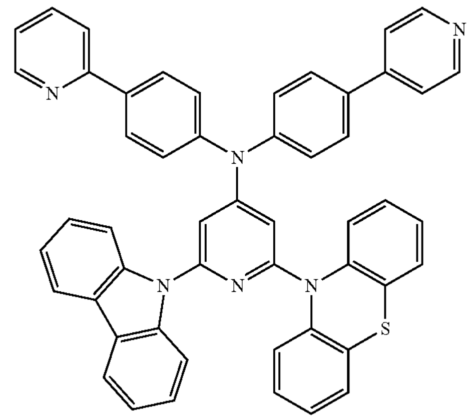
163
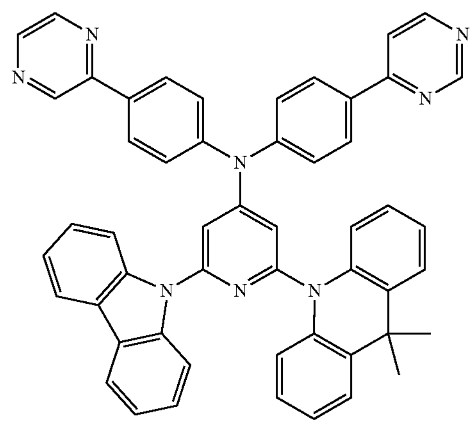
164
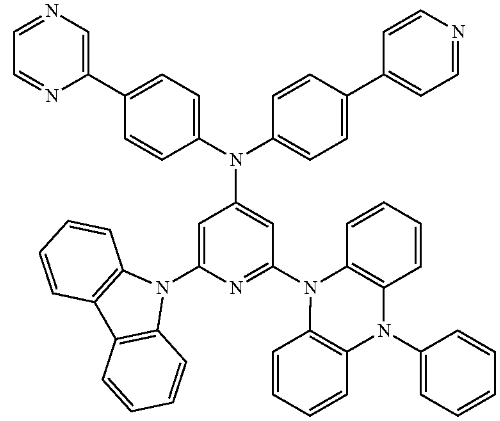

-continued
165
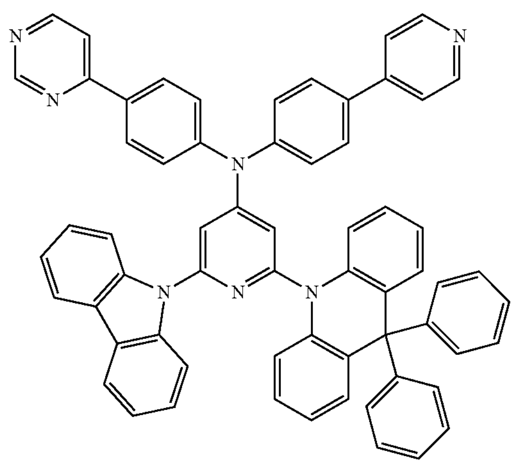
166
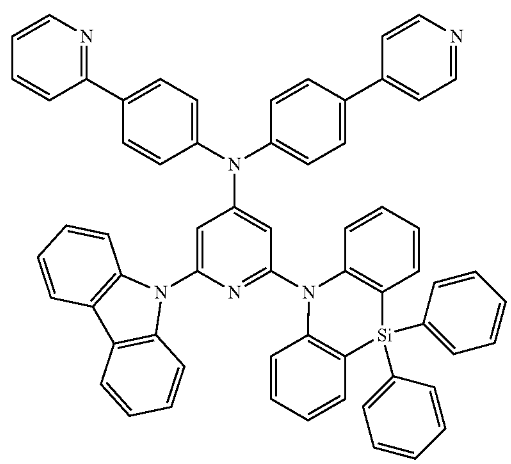
167
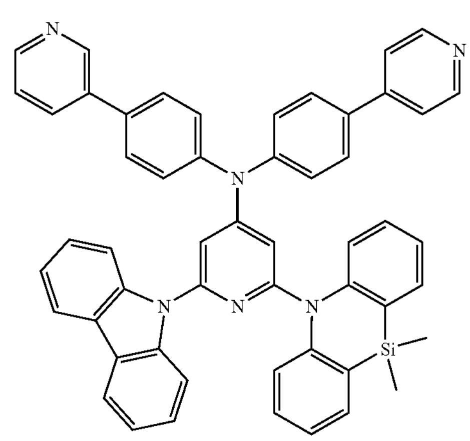
-continued
168
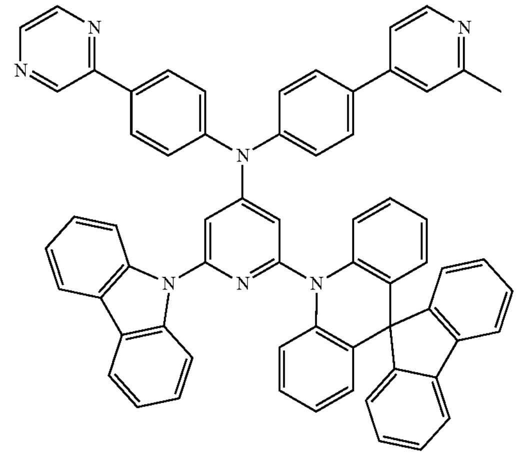
169
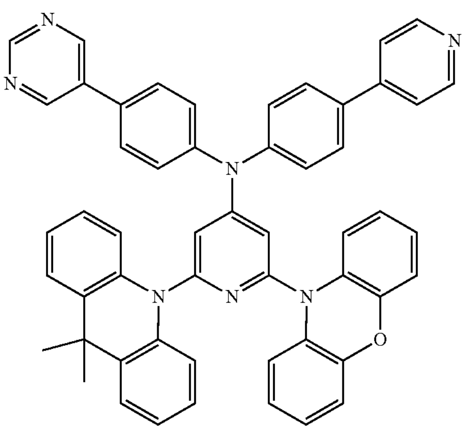
170
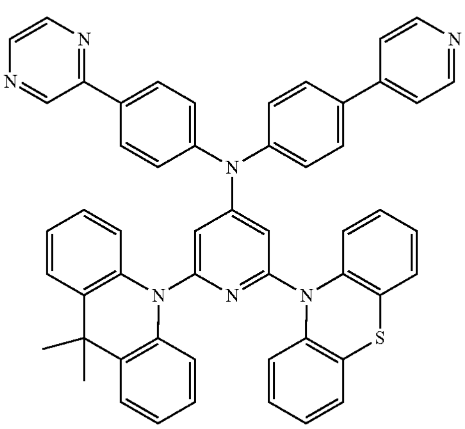

-continued
171
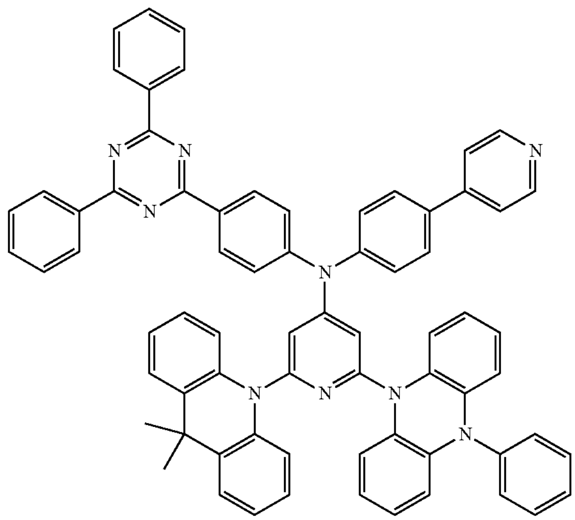
172
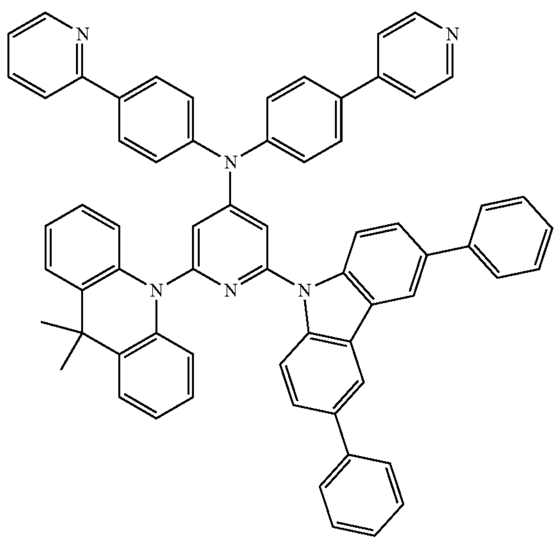
173
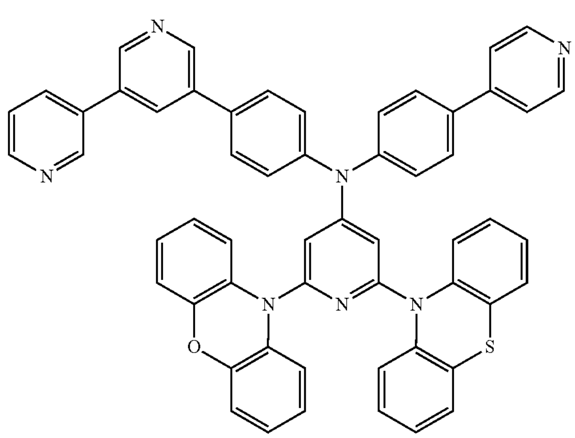
-continued
174
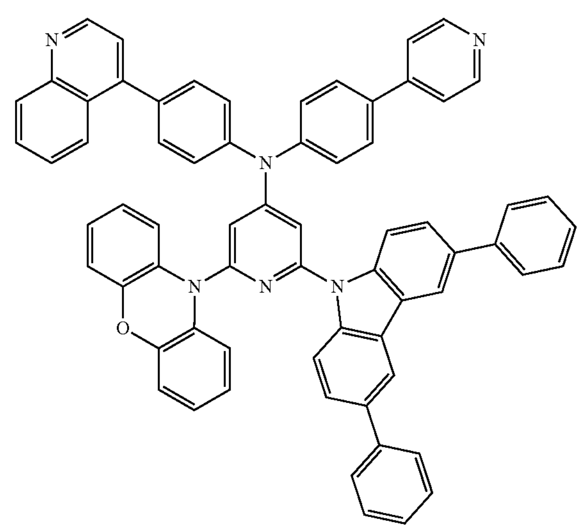
175
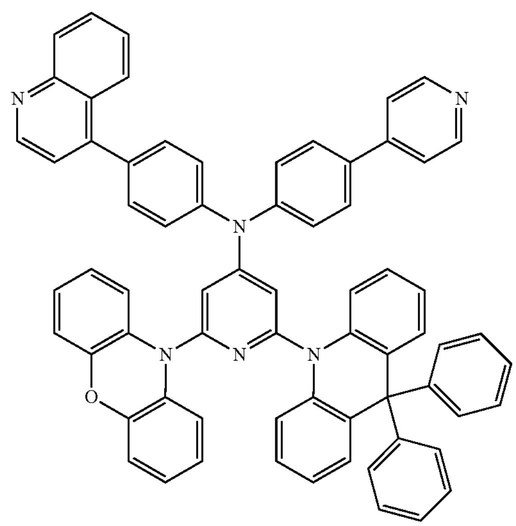
176
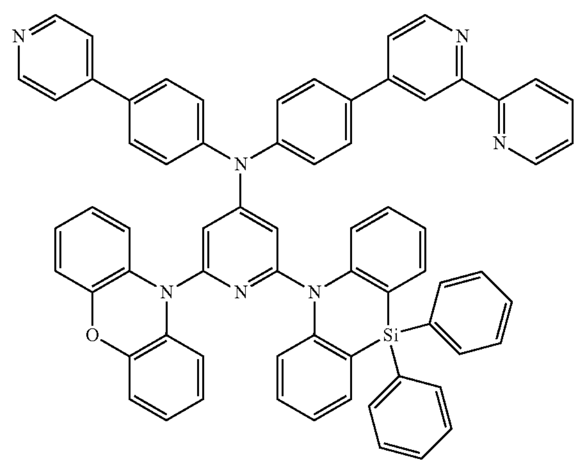

-continued

177

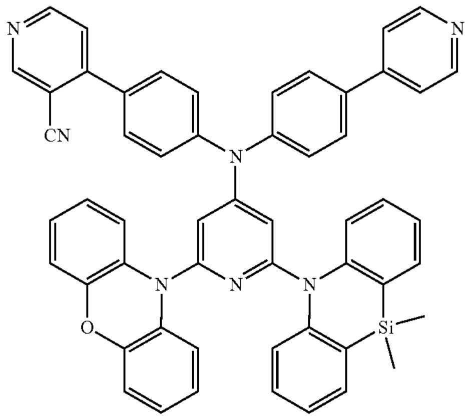

178

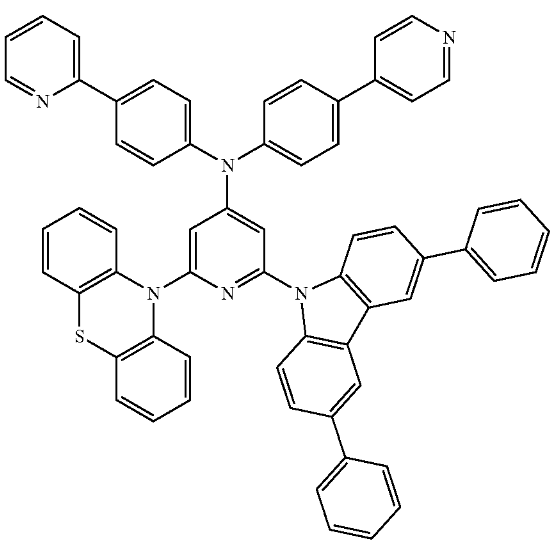

179

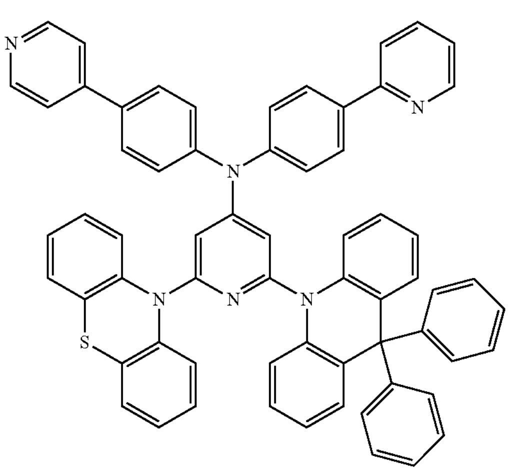

-continued

180

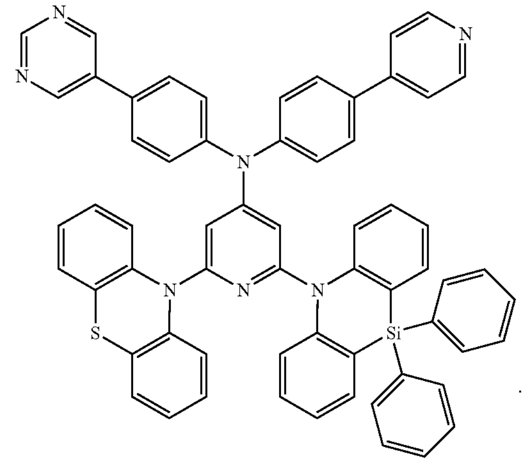

The present disclosure also provides methods for preparing exemplary compound 1, compound 10, compound 11, compound 17, compound 49, and compound 114, as described below.

EXAMPLE 1

Synthesis of Compound 1:

Synthesis of Intermediate M1

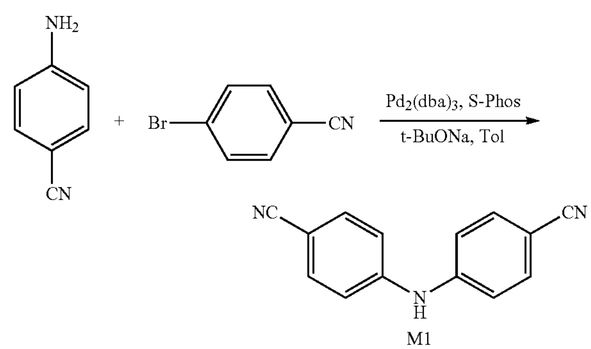

Synthesis of intermediate Ml: p-cyanoaniline (6.50 g, 55 mmol), 4-bromobenzonitrile (10.00 g, 55 mmol), t-BuONa (10.60 g, 110 mmol), $Pd_2(dba)_3$ (504 mg, 0.55 mmol), and S-Phos (2-dicyclohexylphosphine-2', 6'-dimethoxybiphenyl, 452 mg, 1.1 mmol) were sequentially added to 300 mL of anhydrous toluene (Tol) under nitrogen atmosphere, deoxygenated for 10 minutes, and then heated to 80° C. The mixture reacted for 24 hours and then was cooled and suction filtered. The filtrate was collected, added with water, and extracted with dichloromethane. The organic phase was collected, dried over anhydrous sodium sulfate, rotary evaporated to remove the solvent, and then purified through column chromatography to obtain a white solid (9.04 g, 75%).

MALDI-TOF: m/z: calculated: $C_{14}H_9N_3$: 219.24, measured: 218.70.

$^1H$ NMR (400 MHz, $CDCl_3$) δ 7.48 (d, J=8.6 Hz, 4H), 6.97 (d, J=8.7 Hz, 4H), 6.10 (s, 1H).

Synthesis of Intermediate M2-1:

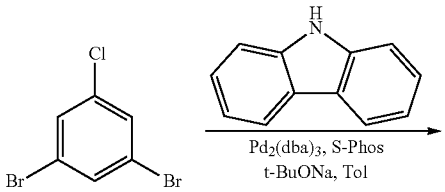

-continued

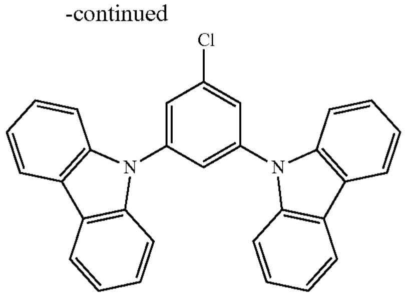

M2-1

Synthesis of intermediate M2-1: 1,3-dibromo-5-chlorobenzene (2.00 g, 7.41 mmol), carbazole (2.60 g, 15.56 mmol), t-BuONa (2.85 g, 29.64 mmol), $Pd_2(dba)_3$ (339 mg, 0.37 mmol), and $P(t\text{-}Bu)_3HBF_4$ (457 mg, 1.11 mmol) were sequentially added to 100 mL of anhydrous toluene under nitrogen atmosphere. After performing deoxygenation for 10 minutes, the temperature was raised to 80° C., and the mixture reacted for 4 hours until a brown black solution was obtained. Then, the solution was cooled and suction filtered. The filtrate was collected, added with water, and extracted with DCM. The organic phase was collected, dried over anhydrous $Na_2SO_4$, rotary evaporated to remove the solvent, and then purified through column chromatography (petroleum ether/DCM, 8/1, V/V) to obtain a white solid M2-1 (2.46 g, 75%).

MALDI-TOF m/z: calculated: $C_{30}H_{19}ClN_2$: 442.94, measured: 442.42.

$^1$H NMR (400 MHz, $CDCl_3$) δ 8.15 (d, J=7.7 Hz, 4H), 7.76 (s, 1H), 7.72 (s, 2H), 7.55 (d, J=8.2 Hz, 4H), 7.46 (t, J=7.6 Hz, 4H), 7.33 (t, J=7.4 Hz, 4H).

Synthesis of Compound 1:

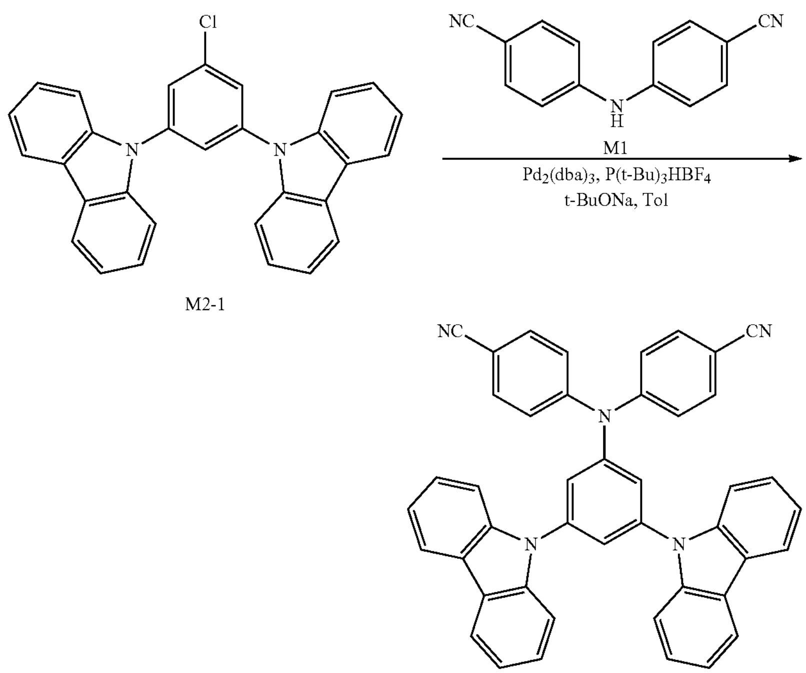

1

Synthesis of compound 1: M2-1 (1.05 g, 2.37 mmol), M1 (623 mg, 2.84 mmol), t-BuONa (910 mg, 9.48 mmol), $Pd_2(dba)_3$ (109 mg, 0.12 mmol), and $P(t\text{-}Bu)_3HBF_4$ (104 mg, 0.36 mmol) were sequentially added to 100 mL of anhydrous toluene under nitrogen atmosphere. After performing deoxygenation for 10 minutes, the temperature was raised to 110° C., and the mixture reacted for 24 hours until a brown black solution was obtained. Then, the solution was cooled and suction filtered. The filtrate was collected, added with water, and extracted with DCM to obtain a brown organic phase. The collected organic phase was dried over anhydrous $Na_2SO_4$, rotary evaporated to remove the solvent, and then purified through column chromatography to obtain a white solid (1.05 g, 71%).

MALDI-TOF: m/z: calculated: C44H27N5: 625.72, measured: 625.02.

$^1$H NMR (400 MHz, $CDCl_3$) δ 8.13 (d, J=7.7 Hz, 4H), 7.60 (s, 1H), 7.51 (d, J=8.2 Hz, 4H), 7.49 (d, J=8.5 Hz, 4H), 7.48 (d, J=8.6 Hz, 4H), 7.44 (t, J=7.9 Hz, 4H), 7.40 (s, 2H), 6.97 (d, J=8.7 Hz, 4H).

Elemental Analysis Results of Compound 1: calculated: $C_{44}H_{27}N_5$ (%): C 84.46, H 4.35, N 11.19; measured: C 84.36, H 4.40, N 11.24.

EXAMPLE 2

Synthesis of Compound 10:
Synthesis of Intermediate M2-10:

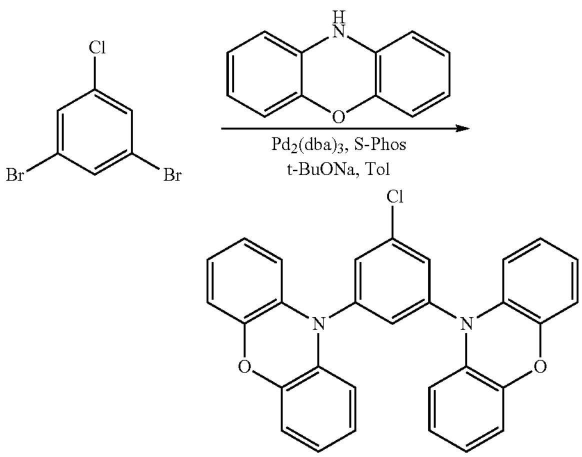

M2-10

Synthesis of intermediate M2-10: 1,3-dibromo-5-chlorobenzene (2.00 g, 7.41 mmol), phenoxazine (2.85 g, 15.56 mmol), t-BuONa (2.85 g, 29.64 mmol), $Pd_2(dba)_3$ (339 mg, 0.37 mmol), and $P(t\text{-}Bu)_3HBF_4$ (457 mg, 1.11 mmol) were sequentially added to 100 mL of anhydrous toluene under nitrogen atmosphere. After performing deoxygenation for 10 minutes, the temperature was raised to 80° C., and the mixture reacted for 4 hours until a brown black solution was obtained. Then, the solution was cooled and suction filtered. The filtrate was collected, added with water, and extracted with DCM. The organic phase was collected, dried over anhydrous $Na_2SO_4$, rotary evaporated to remove the solvent, and then purified through column chromatography (petroleum ether/DCM, 8/1, V/V) to obtain a white solid M2-10 (2.68 g, 76%).

MALDI-TOF m/z: calculated: $C_{30}H_{19}ClN_2O_2$: 474.94, measured: 474.50. $^1H$ NMR (400 MHz, $CDCl_3$) δ7.51 (s, 2H), 7.29 (d, J=7.4 Hz, 4H), 7.20-7.16 (m, 5H), 7.10 (t, J=7.4 Hz, 4H), 7.08-6.99 (m, 4H)

Synthesis of Compound 10:

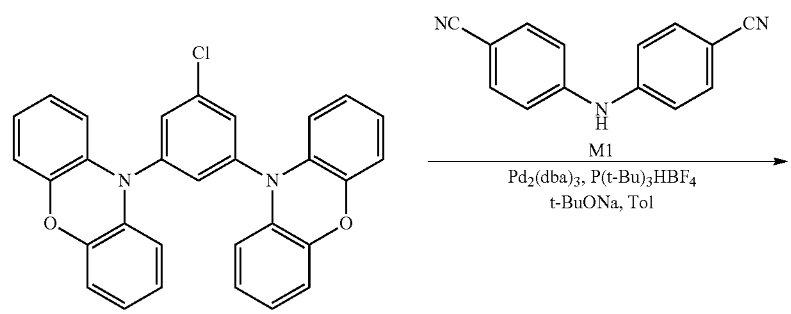

M2-10

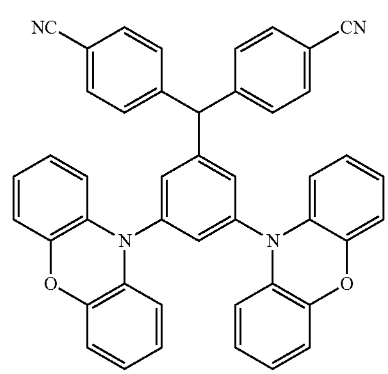

10

Synthesis of compound 10: M2-10 (1.13 g, 2.37 mmol), M1 (623 mg, 2.84 mmol), t-BuONa (910 mg, 9.48 mmol), $Pd_2(dba)_3$ (109 mg, 0.12 mmol), and $P(t\text{-}Bu)_3HBF_4$ (104 mg, 0.36 mmol) were sequentially added to 100 mL of anhydrous toluene under nitrogen atmosphere. After performing deoxygenation for 10 minutes, the temperature was raised to 110° C., and the mixture reacted for 24 hours until a brown black solution was obtained. Then, the solution was cooled and suction filtered. The filtrate was collected, added with water, and extracted with DCM to obtain the brown organic phase. The organic phase was collected, dried over anhydrous $Na_2SO_4$, rotary evaporated to remove the solvent, and then purified through column chromatography to obtain a white solid (1.09 g, 70%).

MALDI-TOF: m/z: calculated: $C_{44}H_{27}N_5O_2$: 657.72, measured: 657.50.

$^1$H NMR (400 MHz, $CDCl_3$) δ 7.58 (s, 1H) 7.49-7.45 (m, 6H), 7.38 (t, J=7.8 Hz, 4H), 7.19 (d, J=8.5 Hz, 4H), 7.14-7.08 (m, 4H), 6.97 (d, J=8.7 Hz, 4H), 6.69 (s, 2H), 6.08 (s,2H).

Elemental Analysis Results of Compound 10: calculated: $C_{44}H_{27}N_5$ (%): C 80.35, H 4.14, N 10.$^{65}$; measured: C 80.26, H 4.20, N 10.68.

EXAMPLE 3

Synthesis of Compound 11:

Synthesis of Intermediate M2-11:

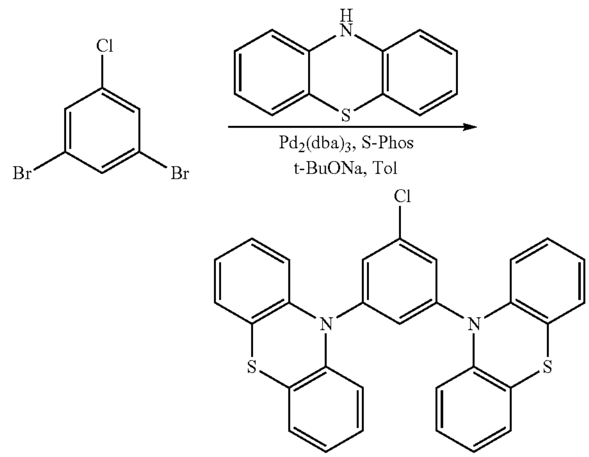

M2-11

The intermediate M2-11 was synthesized in a similar way as the intermediate

M2-10, and a white solid M2-11 was obtained (2.74 g, 73%).

MALDI-TOF m/z: calculated: $C_{30}H_{19}ClN_2S_2$: 507.07, measured: 506.97.

$^1$H NMR (400 MHz, $CDCl_3$) δ 7.34 (s, 2H) 7.19 (d, J=7.4 Hz, 4H), 7.16-7.12 (m, 5H), 7.07 (t, J=7.4 Hz, 4H), 7.02-6.99 (m, 4H).

Synthesis of Compound 11:

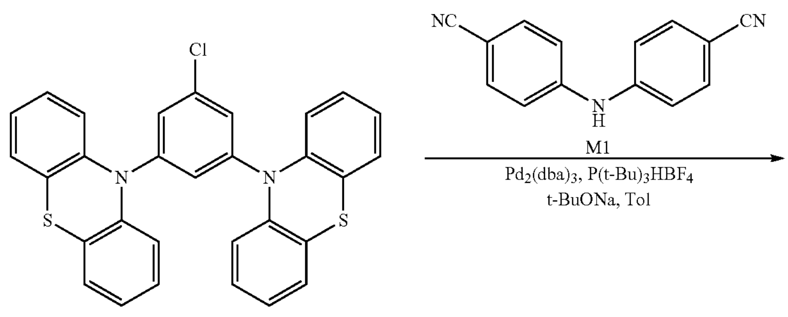

M2-11

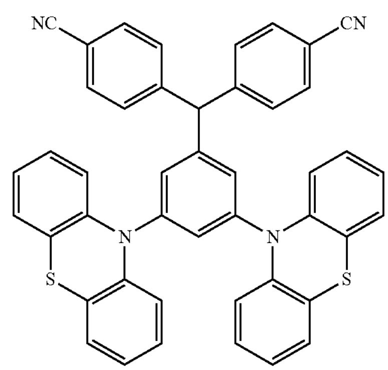

11

The compound 11 was synthesized in a similar way as the compound 10, and a white solid was obtained (1.11 g, 68%).

MALDI-TOF: m/z: calculated: $C_{44}H_{27}N_5S_2$: 689.85, measured: 689.54.

$^1$H NMR (400 MHz, $CDCl_3$) δ 7.63 (s, 1H), 7.45 (td, J=8.6 Hz, 6H), 7.35 (t, J=7.7 Hz, 4H), 7.18 (t, J=8.5 Hz, 4H), 7.10-7.06 (m, 4H), 7.00 (t, J=7.4 Hz, 4H), 6.93 (d, J=7.6 Hz, 2H), 6.59 (s, 2H).

Elemental Analysis Results of Compound 11: calculated: $C_{44}H_{27}N_5$ (%): C 76.61, H 3.94, N 10.15 measured: C 76.55, H 3.99, N 10.10.

EXAMPLE 4

Synthesis of Compound 17:

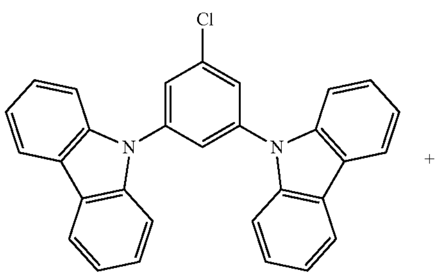

M2-1

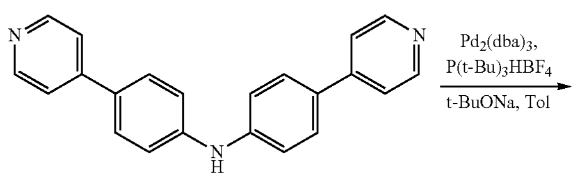

-continued

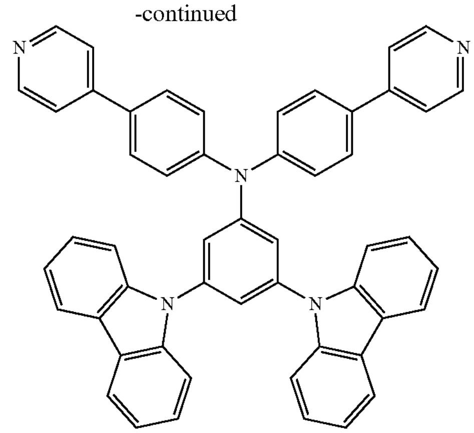

17

Synthesis of compound 17: M2-1 (1.05 g, 2.37 mmol), bis(4-pyridin-4-yl-phenyl)-amine (917 mg, 2.84 mmol), t-BuONa (910 mg, 9.48 mmol), $Pd_2(dba)_3$ (109 mg, 0.12 mmol), and $P(t\text{-}Bu)_3HBF_4$ (104 mg, 0.36 mmol) were sequentially added to 100 mL of anhydrous toluene under nitrogen atmosphere. After performing deoxygenation for 10 minutes, the temperature was raised to 110° C., and the mixture reacted for 24 hours until a brown black solution was obtained. Then, the solution was cooled and suction filtered. The filtrate was collected, added with water, and extracted with DCM to obtain a brown organic phase. The collected organic phase was dried over anhydrous $Na_2SO_4$, rotary evaporated to remove the solvent, and then purified through column chromatography to obtain a white solid (1.44 g, 83%)

MALDI-TOF: m/z: calculated: $C_{52}H_{35}N_5$: 729.87, measured: 729.53.

$^1$H NMR (400 MHz, $CDCl_3$) δ 8.68 (d, J=7.3 Hz, 4H), 8.39-8.33 (m, 4H), 8.13 (d, J=7.7 Hz, 4H), 7.60 (s, 1H), 7.51 (d, J=8.2 Hz, 4H), 7.49 (d, J=8.5 Hz, 4H), 7.48-7.44 (m, 8H), 7.40 (s, 2H), 6.97 (d, J=8.7 Hz, 4H).

Elemental Analysis Results of Compound 17: calculated: $C_{52}H_{35}N_5$ (%): C 85.57, H 4.83, N 9.60; measured: C 85.50, H 4.88, N 9.62.

EXAMPLE 5

Synthesis of Compound 49:

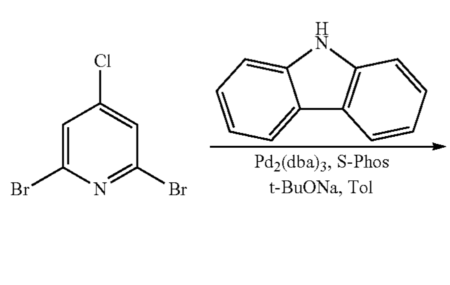

-continued

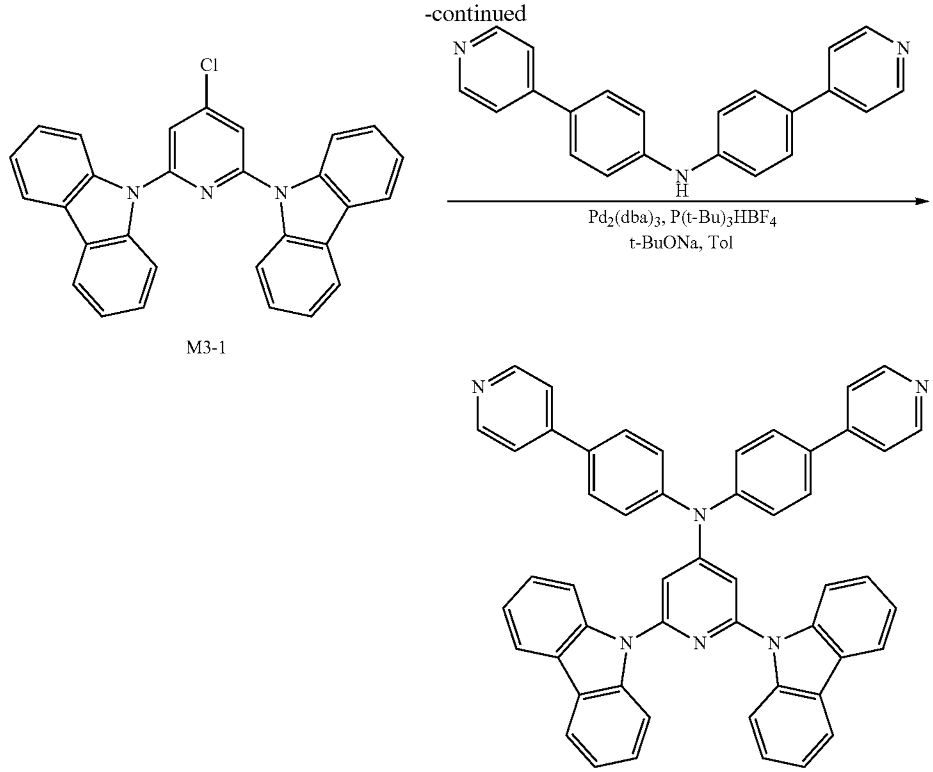

M3-1

49

The intermediate M3-1 was synthesized in a similar way as the intermediate M2-1, and a white solid was obtained (2.57 g, 78%).

MALDI-TOF m/z: calculated: $C_{29}H_{18}ClN_3$: 443.93, measured: 443.52.

[1]NMR (400 MHz, $CDCl_3$) δ 8.18 (d, J=7.7 Hz, 4H), 7.82 (s, 2H), 7.64 (d, J=8.2 Hz, 4H), 7.54 (t, J=7.6 Hz, 4H), 7.39 (t, J=7.4 Hz, 4H).

The compound 49 was synthesized in a similar way as the compound 17, and a white solid was obtained (1.53 g, 88%).

MALDI-TOF: m/z: calculated: $C_{51}H_{34}N_6$: 730.86, measured: 730.49.

[1]NMR (400 MHz, $CDCl_3$) δ 8.73 (d, J=7.2 Hz, 4H), 8.44-8.39 (m, 4H), 8.17 (d, J=7.8 Hz, 4H), 7.69 (d, J=8.2 Hz, 4H), 7.51-7.47 (m, 8H), 7.44 (t, J=8.5 Hz, 4H), 7.40 (s, 2H), 6.98 (d, J=8.7 Hz, 4H).

Elemental Analysis Results of Compound 49: calculated: $C_{51}H_{34}N_6$(%): C 83.81, H 4.69, N 11.50; measured: C 83.77 H 4.72, N 11.51.

EXAMPLE 6

Synthesis of Compound 114:

Synthesis of Intermediate M4:

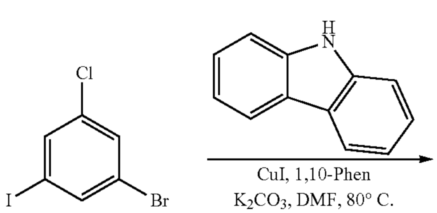

-continued

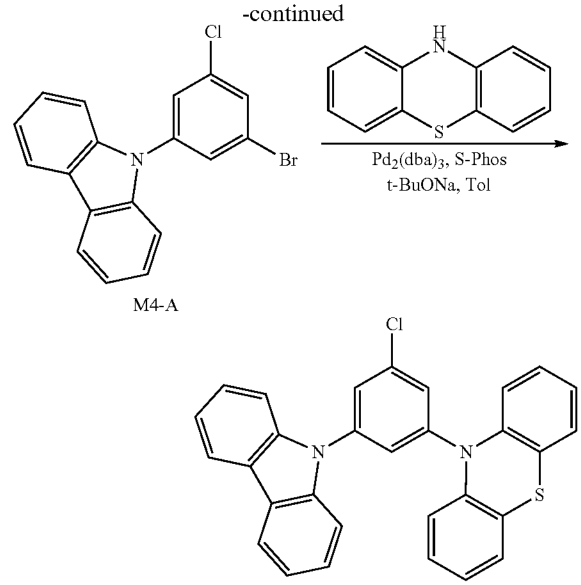

M4-A

M4

Synthesis of compound M4-A: 1-bromo-3-chloro-5-iodobenzene (2.35 g, 7.41 mmol), carbazole (1.24 g, 7.41 mmol), $K_2CO_3$ (4.09 g, 29.64 mmol), CuI (70 mg, 0.37 mmol), and 1,10-Phen (200 mg, 1.11 mmol) were sequentially added to 100 mL of anhydrous DMF under nitrogen atmosphere. After performing deoxygenation for 10 minutes, the temperature was raised to 80° C., and the mixture reacted for 4 hours until a brown black solution was obtained. Then, the solution was cooled and suction filtered. The filtrate was collected, added with water, and extracted with DCM. The organic phase was collected, dried over anhydrous $Na_2SO_4$, rotary evaporated to remove the solvent, and then purified through column chromatography (petroleum ether/DCM, 8/1, V/V) to obtain M4-A (2.12 g, 80%).

MALDI-TOF m/z: calculated: $C_{18}H_{11}BrClN$: 356.64, measured: 356.21.

$^1$H NMR (400 MHz, $CDCl_3$) δ 8.15 (d, J=7.7 Hz, 2H), 7.76 (s, 1H), 7.68 (s, 2H), 7.55-7.49 (m, 4H), 7.29 (t, J=7.4 Hz, 2H).

The intermediate M4 (2.59 g, 70%) was obtained in a similar way as the intermediate M2-1, the intermediate M2-10, and the intermediate M2-11.

MALDI-TOF m/z: calculated: $C_{30}H_{19}ClN_2S$: 475.00, measured: 469.87.

$^1$H NMR (400 MHz, $CDCl_3$) δ 7.34 (s, 2H) 7.26-7.19 (m, 4H), 7.16-7.12 (m, 5H), 7.09 (t, J=7.4 Hz, 4H), 7.02-6.99 (m, 4H).

Synthesis of Compound 114:

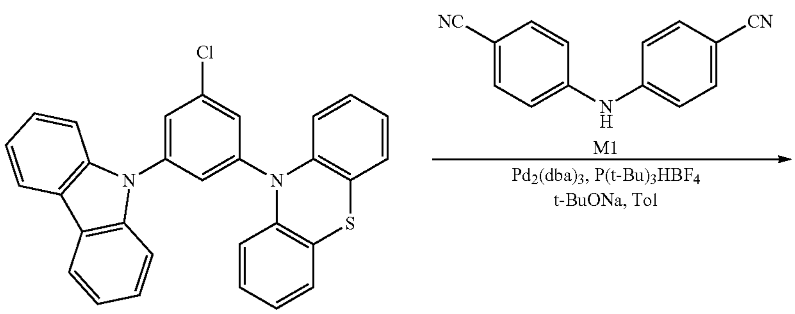

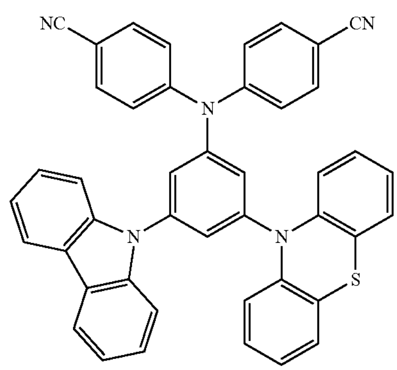

114

The compound 114 was synthesized in a similar way as the compounds 1, 10, and 11, and a white solid was obtained (1.09 g, 75%).

MALDI-TOF: m/z: calculated: $C_{44}H_{27}N_5S$: 657.78, measured: 657.23.

$^1$H NMR (400 MHz, $CDCl_3$) δ 7.64 (s, 1H), 7.47-7.44 (m, 6H), 7.37 (t, J=7.7 Hz, 4H), 7.19 (t, J=8.5 Hz, 4H), 7.09-7.06 (m, 4H), 6.99-6.93 (m, 6H), 6.61 (s, 2H).

Elemental Analysis Results of Compound 114: calculated: $C_{44}H_{27}N5$ S(%): C 80.34, H 4.14, N 10.65; measured: C 80.29, H 4.10, N 10.69.

Regarding compound 1, compound 10, compound 11, compound 17, compound 49 and compound 114, by adopting density functional theory (DFT), distributions of molecular frontier orbits HOMO and LUMO were optimized and calculated by the Gaussian 09 program package under the B3LYP/6-31 G(d) level. Meanwhile, the singlet energy level S1 and the triplet energy level T1 of the molecule were calculated based on the time-dependent density functional theory (TDDFT).

In Table 1 are shown the calculated values of HOMO, LUMO and other parameters and measured values of $T_g$ of compound 1, compound 10, compound 11, compound 17, compound 49 and compound 114.

TABLE 1

Performance parameters of compounds

| Compound | HOMO (ev) | LUMO (ev) | $S_1$ (ev) | $T_1$ (ev) | $T_g$ (° C.) |
|---|---|---|---|---|---|
| Compound 1 | −5.71 | −1.93 | 3.39 | 2.76 | 139 |
| Compound 10 | −5.50 | −1.88 | 3.22 | 2.61 | 136 |
| Compound 11 | −5.41 | −1.83 | 3.20 | 2.58 | 135 |

TABLE 1-continued

Performance parameters of compounds

| Compound | HOMO (ev) | LUMO (ev) | $S_1$ (ev) | $T_1$ (ev) | $T_g$ (° C.) |
|---|---|---|---|---|---|
| Compound 17 | −5.44 | −1.54 | 3.45 | 2.78 | 145 |
| Compound 49 | −5.45 | −1.65 | 3.42 | 2.82 | 149 |
| Compound 114 | −5.68 | −1.90 | 3.36 | 2.74 | 142 |

Note:
$S_1$ represents singlet state energy level,
$T_1$ represents triplet state energy level, and
$T_g$ represents glass transition temperature.

As can be seen from Table 1, the compounds of the present disclosure have higher singlet and triplet energy levels, and are suitable as the host material in the light-emitting layer. In addition, the compounds of the present disclosure also have a relatively higher glass transition temperatures, and thus a stable thin film is more likely to be formed during device preparation, which can improve the stability of the device.

According to an embodiment of the compound of the present disclosure, the singlet energy level S1 of the compound is higher than the singlet energy level S1 of the guest material, and the triplet energy level T1 of the host material is higher than the triplet level T1 of the guest material.

The present disclosure also provides a display panel, and the display panel includes an organic light emitting device. The organic light emitting device includes an anode, a cathode arranged opposite to the anode, and a light-emitting layer disposed between the anode and the cathode. A light-emitting material of the light-emitting layer includes one or more compounds according to the present disclosure.

According to an embodiment of the display panel of the present disclosure, the light-emitting material of the light-emitting layer includes a host material and a guest material, and the host material is one or more compounds according to the present disclosure.

According to an embodiment of the display panel of the present disclosure, the light-emitting layer includes a red light-emitting layer, and the host material is a red light host material.

According to an embodiment of the display panel of the present disclosure, the light-emitting layer includes a green light-emitting layer, and the host material is a green light host material.

According to an embodiment of the display panel of the present disclosure, the organic light-emitting device further includes one or more of a hole injection layer, a hole transmission layer, an electron blocking layer, a hole blocking layer, an electron transmission layer, or an electron injection layer.

The hole injection layer, the hole transmission layer, and the electron blocking layer may be made of a material selected from 2,2'-dimethyl-N,N-bis(1-naphthyl)-N,N-diphenyl[1,1-biphenyl]-4,4'-diamine (α-NPD), 4,4', 4"-tris(carbazol-9-yl)-triphenylamine (TCTA), 1,3-dicarbazole-9-yl benzene (mCP), 4,4'-bis(9-carbazole)biphenyl (CBP), 3,3'-bis(N-carbazolyl)-1,1'-biphenyl (mCBP), 2,3,6,7,10,11-hexacyano-1,4,5,8,9,12-hexaazatriphenylene (HATCN), 4,4'-cyclohexylidenebis[N,N-bis(4-methylphenyl)aniline] (TAPC), N,N-diphenyl-N,N'-(1-naphthyl)-1, 1'-biphenyl-4, 4'-diamine (α-NPB), N,N'-bis (naphthalen-2-yl)-N,N'-di (phenyl)biphenyl-4,4'-diamine (NPB), poly(3,4-ethylenedioxythiophene)-polystyrenesulfonate (PEDOT: PSS), polyvinyl carbazole (PVK), 9-phenyl-3,9-bicarbazolyl (CCP), or molybdenum trioxide ($MoO_3$). However, the material is not limited thereto.

The hole blocking layer, the electron transmission layer, and the electron injection layer may be each made of a material selected from 2,8-bis(diphenylphosphinyl)dibenzothiophene (PPT), $TSPO_1$, 1,3,5-tris(1-phenyl-1H-benzimidazol-2-yl)benzene (TPBi), 2,8-bis(diphenylphosphinyl) dibenzofuran (PPF), bis[2-(diphenylphosphino)phenyl] ether oxide (DPEPO), lithium fluoride (LiF), 4,6-bis(3,5-di-3-pyridylphenyl)-2-methylpyrimidine (B3PYMPM), 4,7-diphenyl-1,10-phenanthroline (Bphen), 1,3,5-tris[(3-pyridyl)-3-phenylbenzene (TmPyBP), tris[2,4,6-trimethyl-3-(3-pyridyl)phenyl]borane (3TPYMB), 1,3-bis(3,5-dipyridine-3-yl-phenyl]benzene (B3PYPB), 1,3-bis[3,5-di(pyridin-3-yl)phenyl]benzene (BMPYPHB), 2,4,6-Tris(biphenyl-3-yl)-1,3,5-triazine (T2T), diphenylbis(4-(pyridin-3-yl)phenyl) silane (DPPS), cesium carbonate ($Cs_2O_3$), bis(2-methyl-8-quinolinolato-N1,O8)-(1,1'-Biphenyl-4-olato)aluminum (BAlq), 8-hydroxyquinoline lithium (Liq), and tris(8-hydroxyquinoline) aluminum ($Alq_3$). However, the material is not limited thereto.

In an embodiment of the display panel according to the present disclosure, the light-emitting layer includes the host material and the guest material. The host material is selected from the group consisting of 2,8-bis(diphenylphosphinyl) dibenzothiophene, 4,4'-Bis (9-carbazolyl)-1,1'-biphenyl, 3,3'-bis(N-carbazolyl)-1,1'-biphenyl, 2,8-bis(diphenylphosphino) dibenzofuran, bis(-(9H-carbazolyl-9-yl) phenyl) diphenylsilane, 9-(4-tert-butylphenyl)-3,6-bis(triphenylsilyl)-9H-carbazole, bis(2-diphenylphosphino)phenyl) ether oxide, 1,3-bis[3,5-bis(pyridin-3-yl) phenyl]benzene, 4,6-bis (3,5-bis(3-pyridyl) phenyl)-2-methylpyrimidine, 9-(3-(9H-carbazolyl-9-yl)phenyl)-9H-carbazole-3-carbonitrile, 9-phenyl-9[4-(triphenylsilicyl)phenyl]-9H-fluorene, 1,3,5-tris(1-phenyl-1H-benzimidazol-2-yl)benzene, diphenyl[4-(triphenylsilicyl)phenyl]phosphine, 4,4', 4"-tris(carbazol-9-yl) triphenylamine, 2,6-dicarbazolyl-1,5-pyridine, polyvinylcarbazole, and polyfluorene, and combinations thereof. The guest material may be selected from the group consisting of a fluorescent material, a phosphorescent material, a thermally activated delayed fluorescent material, an aggregation-inducing luminescent material, and combinations thereof.

In the display panel according to the present disclosure, in an embodiment, the anode of the organic light-emitting device may be made of a metal, such as copper, gold, silver, iron, chromium, nickel, manganese, palladium, platinum, and alloys thereof. In an embodiment, the anode may be made of a metal oxide, such as indium oxide, zinc oxide, indium tin oxide (ITO), indium zinc oxide (IZO), etc. In an embodiment, the anode may be made of a conductive polymer, such as polyaniline, polypyrrole, poly(3-methylthiophene) and the like. In addition to the anode material mentioned above, the anode may also be made of any suitable materials known in the related art, as long as the material of the anode is conductive to hole injection.

In the display panel according to the present disclosure, the cathode of the organic light-emitting device may be made of a metal, such as aluminum, magnesium, silver, indium, tin, titanium, and alloys thereof. The cathode may also be made of a multiple-layer metal material, such as LiF/Al, $LiO_2$/Al, $BaF_2$/Al, etc. In addition to the cathode materials listed above, the cathode may also be made of any suitable materials known in the related art, as long as the material of the cathode is conductive to electron injection.

Figure 2:
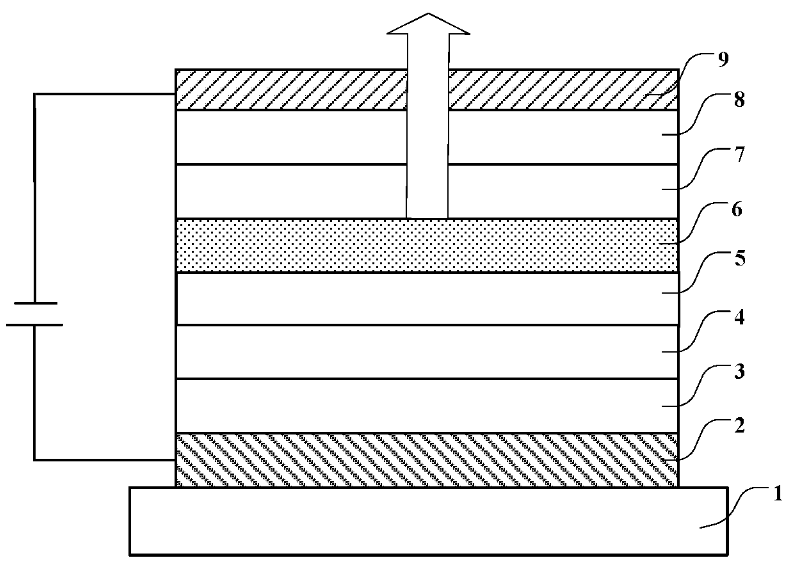
FIG. 2 is a structural schematic diagram of an OLED device according to an embodiment of the present disclosure.

In the display panel provided by the present disclosure, an organic light-emitting element is schematically shown in FIG. 2, including: a substrate 1, an ITO anode 2, a hole injection layer 3, a first hole transport layer 4, a second hole transport layer 5, a light-emitting layer 6, a first electron transport layer 7, a second electron transport layer 8, and a cathode 9 (silver electrode).

The organic light-emitting display device can be manufactured by methods known in the related art, which are not described in detail herein. In the present disclosure, the organic light-emitting display device is manufactured by forming an anode on a transparent or opaque smooth substrate, forming an organic thin layer on the anode, and further forming a cathode on the organic thin layer. The organic thin layer can be formed by a known method such as vapor deposition, sputtering, spin coating, dipping, ion plating, and the like.

A method for manufacturing the organic light-emitting device of the display panel according to the present disclosure is described in detail below.

EXAMPLE 7

The present example provides an organic light emitting device having the following structure:

ITO (10 nm)/HAT-CN (10 nm)/NPB (40 nm)/TAPC (10 nm)/Compound 1: $Ir(MDQ)_2(acac)$ (20 nm)/TPBi (30 nm)/LiF (2 nm)/Al (100 nm).

In the above structure of the device, ITO was used as the anode material; HAT-CN was used as a hole injection layer material, and NPB and TAPC were used as first and second hole transmission layer materials, respectively; the light-emitting layer was made of a host material (Compound 1) and a guest material ($Ir(MDQ)_2(acac)$) doped into the host material in a ratio; TPBi was used as a material of the electron transmission layer; LiF was used as a material of the electron injection layer; and Al was used as the cathode material.

The device was manufactured by the following steps:

1) A glass substrate 1 was cut into a size of 50 mm×50 mm×0.7 mm, and subjected to ultrasonic cleaning in acetone, isopropyl alcohol, and deionized water respectively for 30 minutes, and then cleaned under UV ozone for 30 minutes. The obtained glass substrate with an indium tin oxide (ITO) anode 1 having a thickness of 10 nm was mounted in a vacuum deposition apparatus;

2) the hole injection layer material HAT-CN was deposited on the ITO anode layer 2 by vacuum evaporation, to form the hole injection layer 3 having a thickness of 10 nm;

3) the hole transmission layer material NPB was deposited on the hole injection layer 3 by vacuum evaporation, to form the first hole transmission layer 4 having a thickness of 40 nm;

4) the hole transmission material TAPC was deposited on the first hole transmission layer 4 by vacuum evaporation, to form the second hole transmission layer 5 having a thickness of 10 nm;

5) the light-emitting layer 6 having a thickness of 20 nm was formed on the second hole transmitting layer 5 by vacuum evaporation, and in the light-emitting layer 6, the compound 1 of the present disclosure was used as a host material, and Ir(MDQ)2(acac) was used as a dopant (guest material) doped with a doping ratio of 3% by weight;

6) the electron-transmitting material TPBi was deposited on the light-emitting layer 6 by vacuum evaporation, to form the electron transmission layer 7 having a thickness of 30 nm;

7) the electron-transmitting material LiF was deposited on the electron-transmitting layer 6 by vacuum evaporation, to form the electron-injecting layer 8 having a thickness of 2 nm; and 8) Aluminum (Al) electrode having a thickness of 100 nm was formed on the electron transmission layer 8 by vacuum evaporation, as the cathode 9.

The compounds for manufacturing the OLED devices have the following structures:

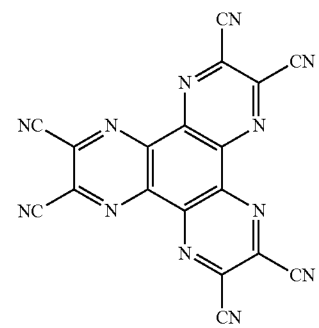

HAT—CN

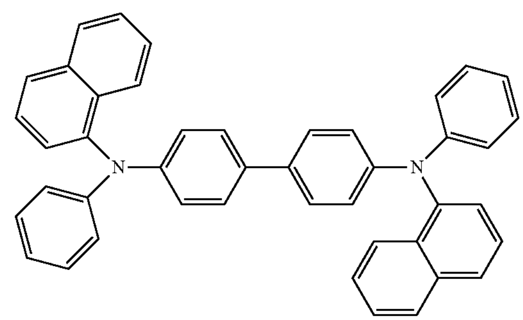

NPB

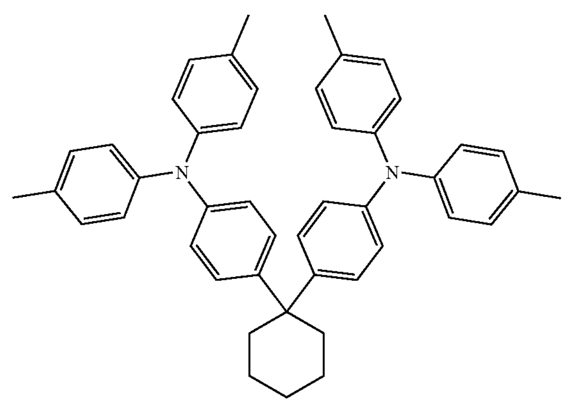

TAPC

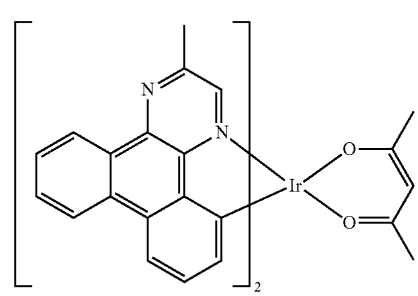

$Ir(MDQ)_2$ acac

-continued

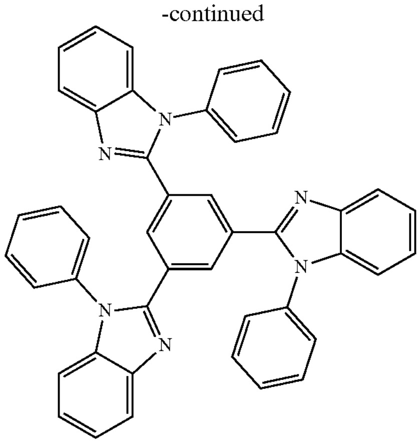

TPBi

EXAMPLE 8

This example differs from Example 7 in that compound 1 was replaced with compound 10.

EXAMPLE 9

This example differs from Example 7 in that compound 1 was replaced with compound 11.

EXAMPLE 10

This example differs from Example 7 in that compound 1 was replaced with compound 17.

EXAMPLE 11

This example differs from Example 7 in that compound 1 was replaced with compound 49.

EXAMPLE 12

This example differs from Example 7 in that compound 1 was replaced with compound 114.

Comparative Example 1

This comparative example differs from Example 7 in that compound 1 was replaced with compound mCP.

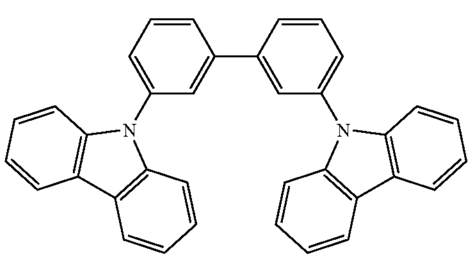

mCP

Performances of the organic electroluminescent devices are shown in Table 2.

TABLE 2

| Device | Compound | $V_{turn\text{-}on}$ [V] | CE(max) (cd/A) | PE(max) (lm/W) | CIE (x, y) |
|---|---|---|---|---|---|
| D1 | 1 | 3.45 | 20.9 | 18.9 | (0.61, 0.39) |
| D10 | 10 | 3.39 | 21.5 | 20.1 | (0.59, 0.40) |
| D11 | 11 | 3.32 | 22.0 | 20.9 | (0.60, 0.40) |
| D17 | 17 | 3.38 | 22.9 | 21.2 | (0.61, 0.40) |
| D49 | 49 | 3.32 | 23.7 | 22.5 | (0.61, 0.40) |
| D114 | 114 | 3.33 | 21.8 | 20.2 | (0.60, 0.40) |
| Comparative Device 1 | mCP | 3.68 | 18.7 | 15.6 | (0.60, 0.40) |

As can be seen from Table 2, the organic light-emitting devices according to the present disclosure have lower driving voltages and higher light-emitting efficiency, in which the driving voltages are smaller than 3.50V, the current efficiencies (CE(max)) are greater than 20cd/A, and the power efficiencies (PE(max)) are greater than 18 lm/W. The performances of these devices are all improved when compared with the comparative device 1. The reasons are in that the compounds of the present disclosure have the bipolar characteristics of simultaneous transmitting holes and electrons, and thus these compounds are beneficial to the charge transmission balance in the light-emitting layer, to widen the exciton recombination region and improving device efficiency.

Figure 3:
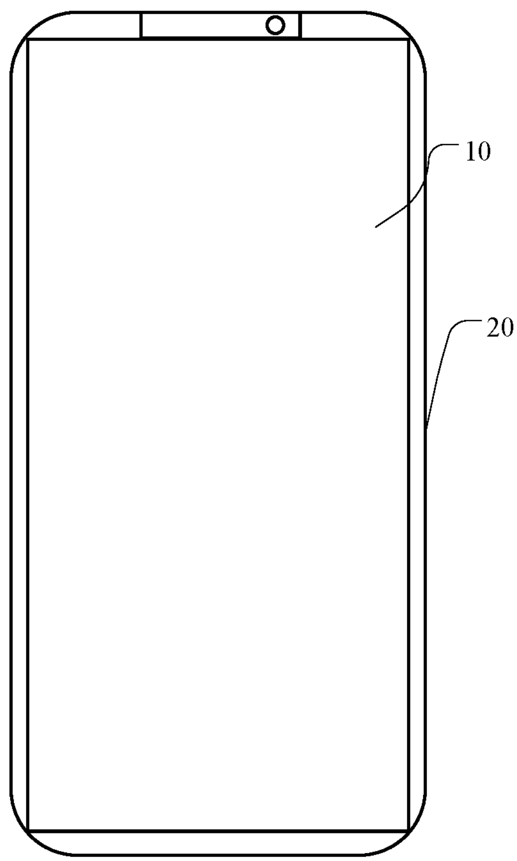
FIG. 3 is a schematic diagram of a display apparatus according to an embodiment of the present disclosure.

The present disclosure also provides a display apparatus including the organic light-emitting display panel described above. The organic light-emitting apparatus can be display screens of mobile phone, computer, liquid crystal display television, smart watch, smart car, VR or AR helmet display screen, and other smart devices. FIG. 3 is a schematic diagram of a display apparatus according to an embodiment of the present disclosure, in which the reference sign 10 denotes a display panel of mobile phone, and the reference sign 20 represents the display apparatus.

What is claimed is:

1. A compound having a structure represented by Chemical Formula 1:

Chemical Formula 1

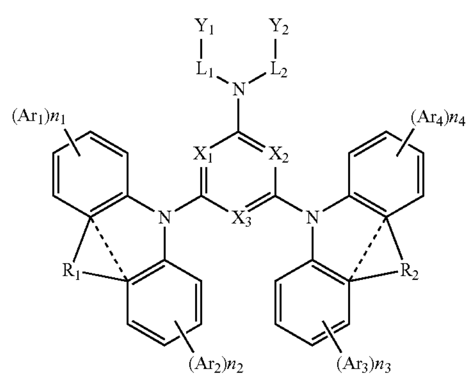

wherein $Ar_1$, $Ar_2$, $Ar_3$ and $Ar_4$ are each independently one or more selected from the group consisting of hydrogen, deuterium, C1-C20 alkyl, C1-C20 alkoxy, C1-C20 alkylthiol, C3-C20 cycloalkyl, a substituted or unsubstituted C6-C40 aryl, and a substituted or unsubstituted C5-C40 heteroaryl, n1, n2, n3, and n4 are each an integer independently selected from 0, 1, or 2;

$R^1$ and $R^2$ are each independently selected from the group consisting of —C(R)$_2$—, —O—, —S—, —N(R)—, and —Si(R)$_2$—, wherein R is selected from the group consisting of C1-C20 alkyl, C1-C20 alkoxy, C1-C20 alkylthiol, C3-C20 cycloalkyl, a substituted or unsubstituted C6-C30 aryl, and a substituted or unsubstituted C5-C30 heteroaryl;

$X_1$, $X_2$ and $X_3$ are each C or N;

$L_1$ and $L_2$ are each independently selected from the group consisting of phenylene, naphthylene, anthrylene, phenanthrylene, pyrenylene, and biphenylene;

$Y_1$ and $Y_2$ are each an electron-withdrawing group, and $Y_1$ and $Y_2$ are each independently selected from an N-heterocyclic group, a cyano-containing group, a carbonyl-containing group, a sulfone-containing group, a phosphoroso- or phosphinothioyl-containing group, or a boron-heterocyclic group.

2. The compound according to claim 1, wherein $Y_1$ and $Y_2$ are identical.

3. The compound according to claim 1, wherein the compound has the following structure:

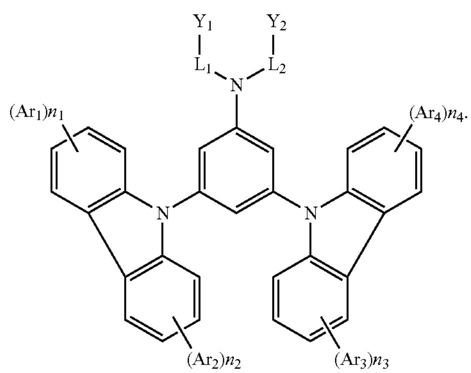

4. The compound according to claim 3, wherein the compound has the following structure:

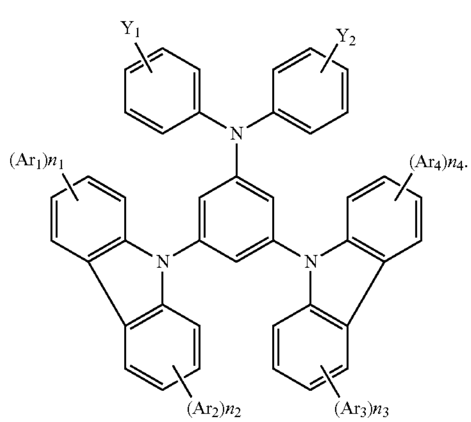

5. The compound according to claim 1, wherein the compound has the following structure:

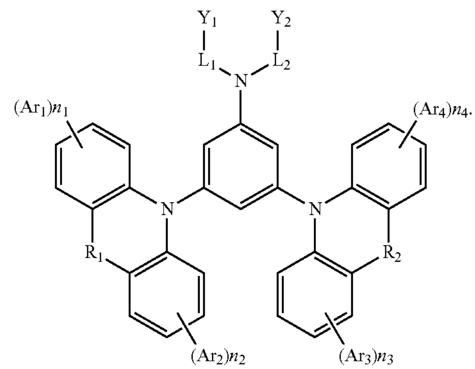

6. The compound according to claim 5, wherein the compound has any one of the following structures:

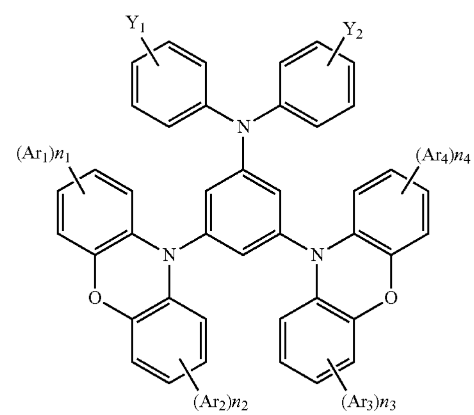

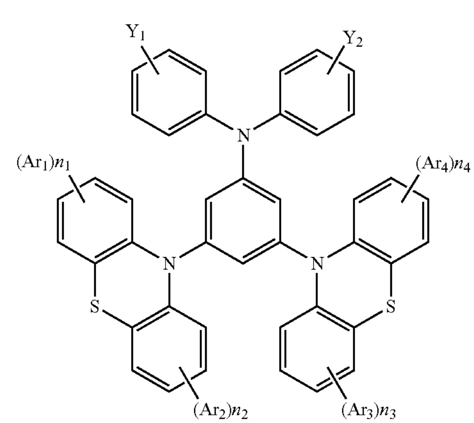

-continued
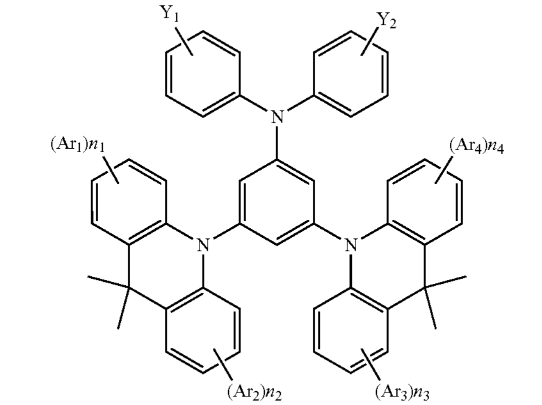
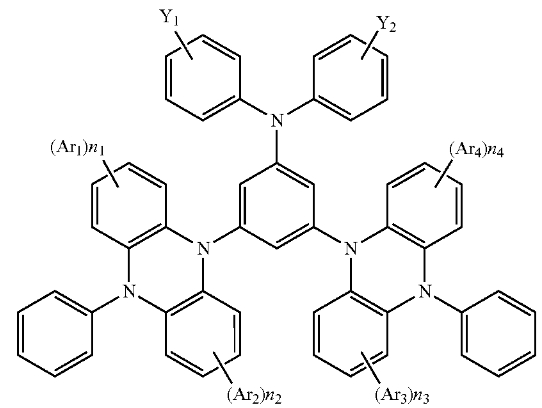
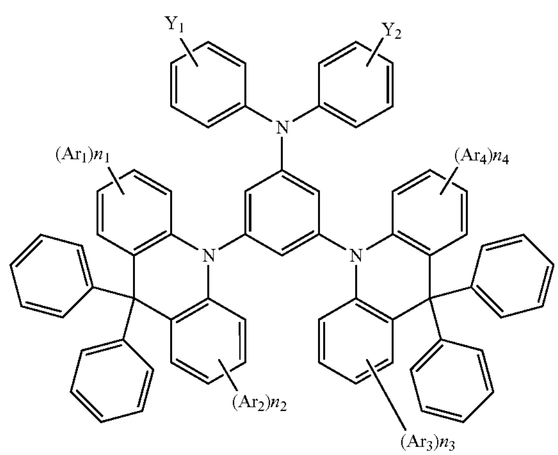
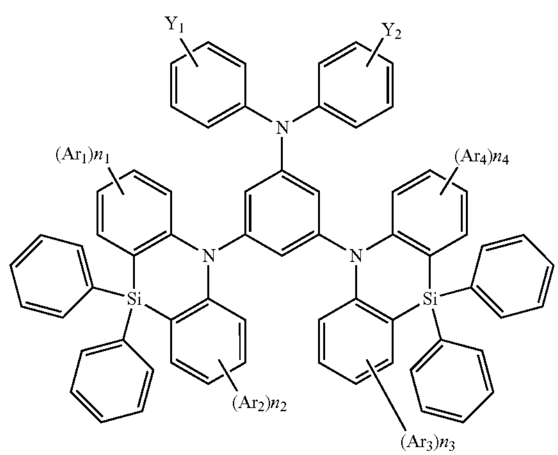
-continued
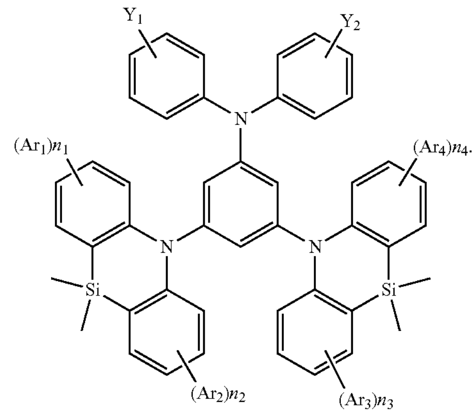
7. The compound according to claim 1, wherein the N-containing heterocyclic group is any one of the following groups:
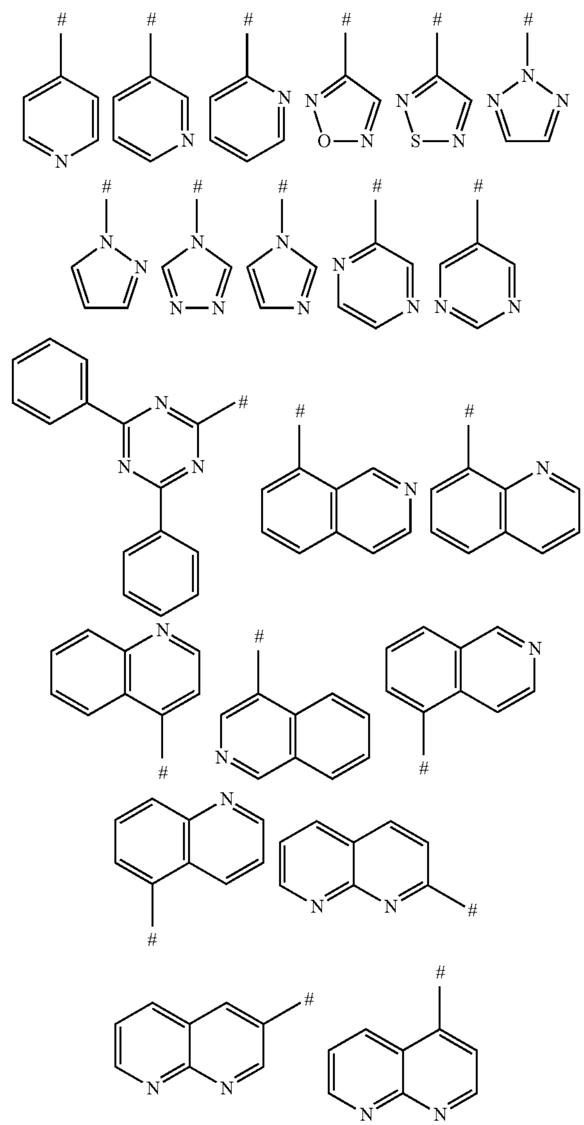

-continued
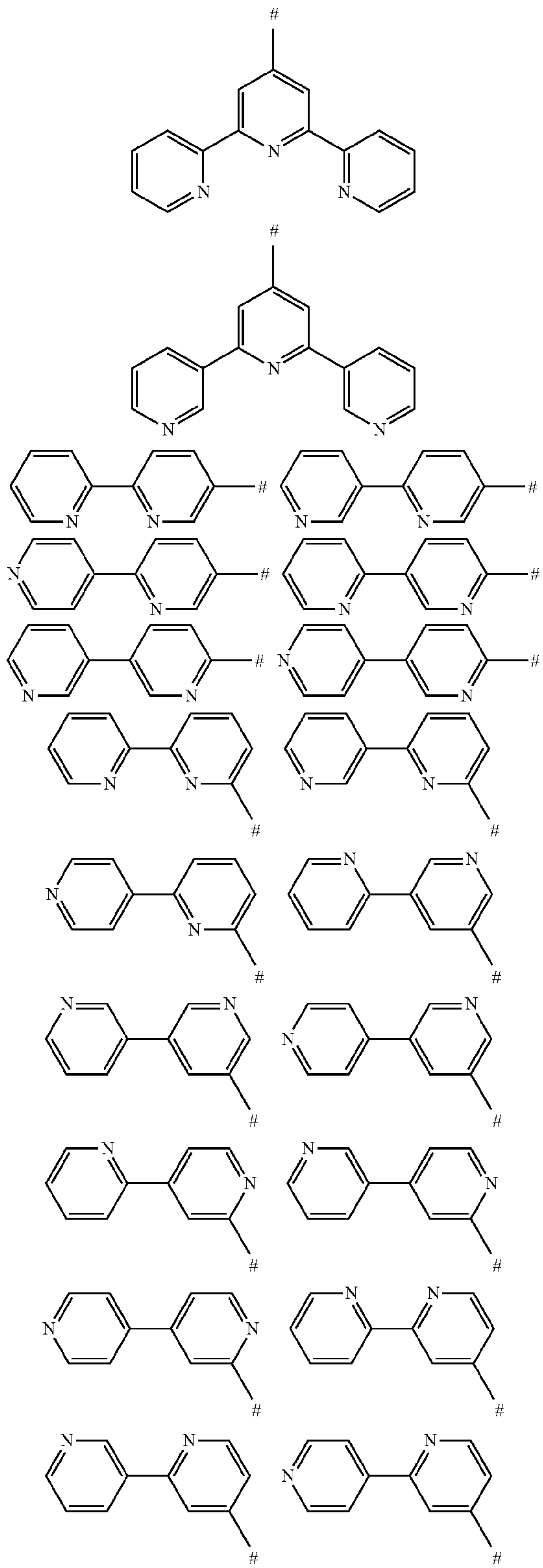
wherein # indicates a position bonding to the Chemical Formula 1.
8. The compound according to claim 1, wherein the cyano-containing group is any one of the following groups:
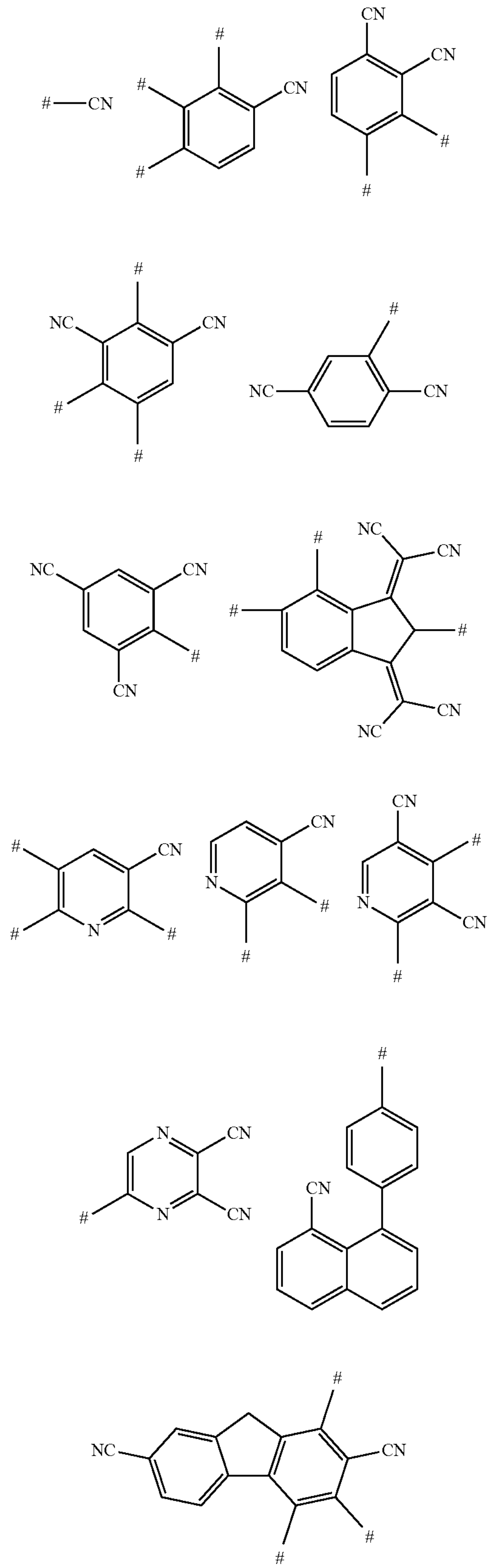

-continued
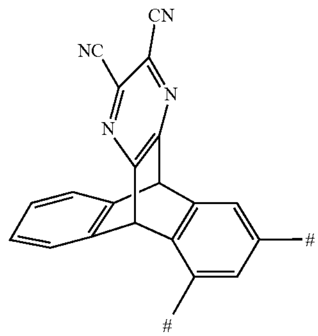
wherein # indicates a position bonding to the Chemical Formula 1.
9. The compound according to claim 1, wherein the carbonyl-containing group is any one of the following groups:
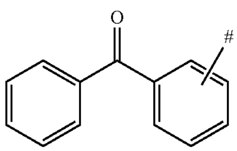
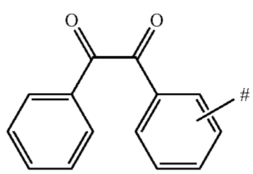
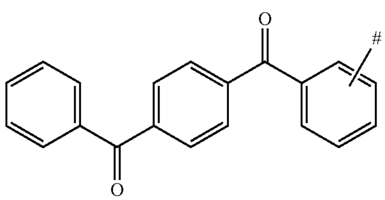
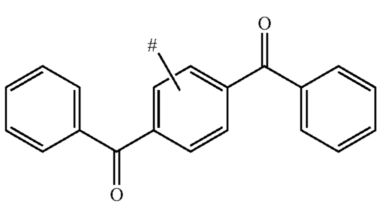
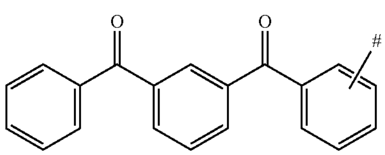
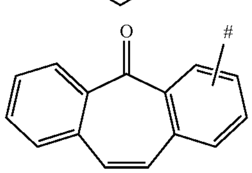
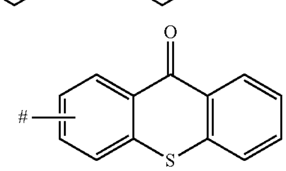
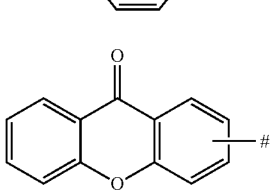
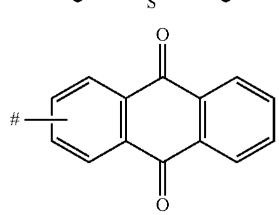
-continued
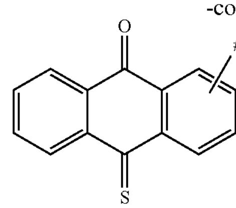
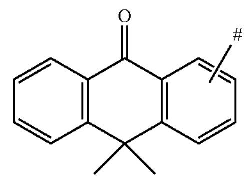
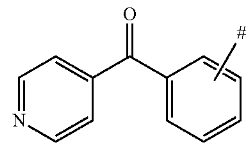
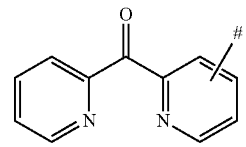
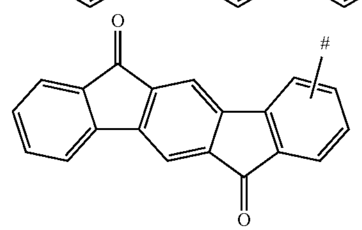
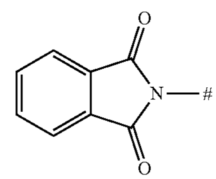
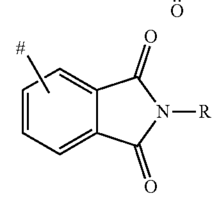
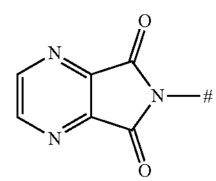
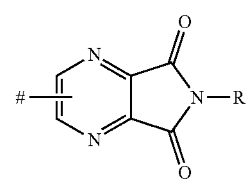
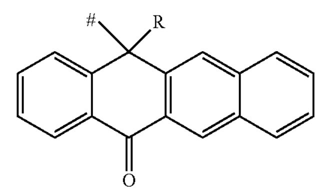
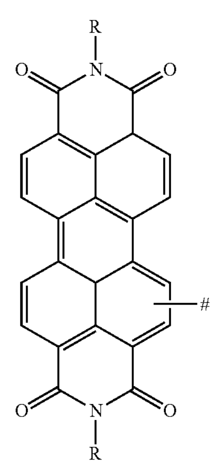
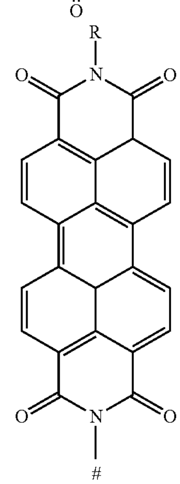
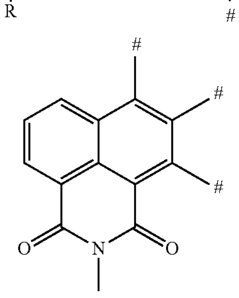

wherein # indicates a position bonding to the Chemical Formula 1; and

R is C1-C20 alkyl, C1-C20 alkoxy, C1-C20 alkylthiol, C2-C20 alkenyl, C2-C20 alkynyl, C3-C20 cycloalkyl, C6-C40 aryl, or C4-C40 heteroaryl.

10. The compound according to claim 1, wherein the sulfone-containing group is any one of the following groups:

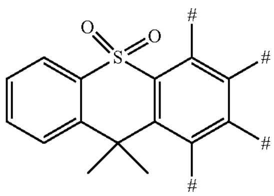

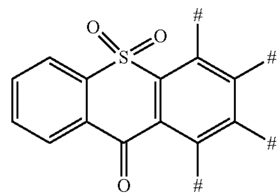

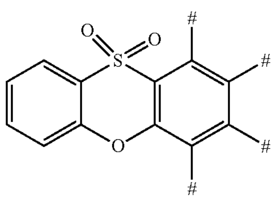

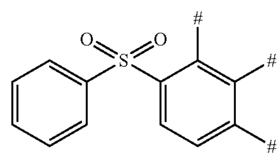

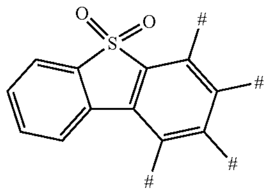

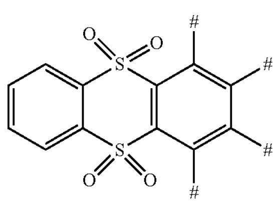

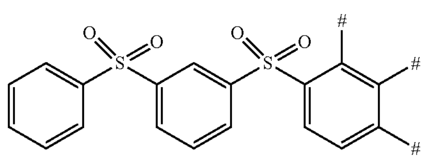

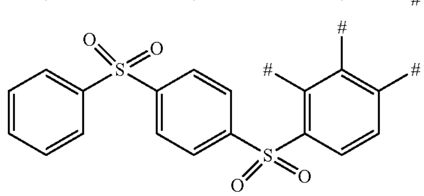

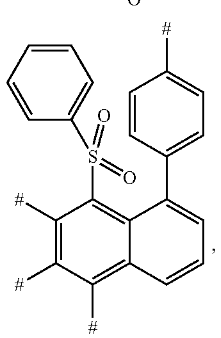

wherein # indicates a position bonding to the Chemical Formula 1.

11. The compound according to claim 1, wherein the phosphoroso- or phosphinothioyl-containing group is any one of the following groups:

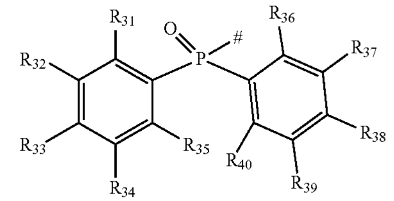

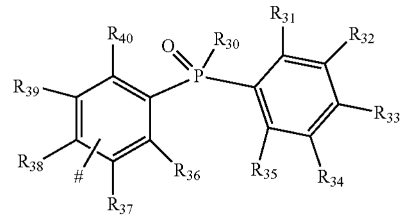

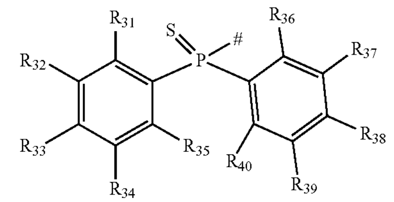

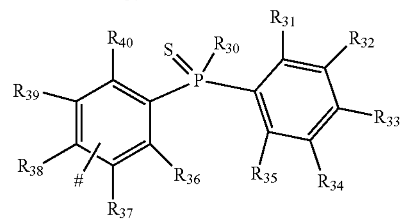

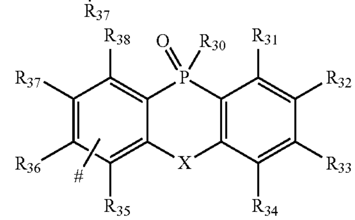

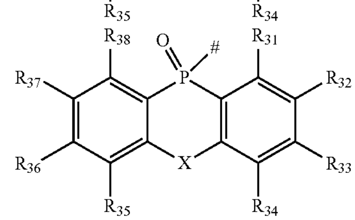

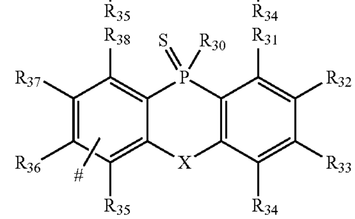

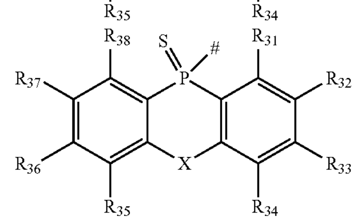

wherein X is O, S, —$BR_{41}$, —$C(R_{41})_2$, —$Si(R_{41})_2$, or —$NR_{41}$;

$R_{30}$, $R_{31}$, $R_{32}$, $R_{33}$, $R_{34}$, $R_{35}$, $R_{36}$, $R_{37}$, $R_{38}$, $R_{39}$, $R_{40}$, and $R_{41}$ are each independently selected from the group consisting of hydrogen, a substituted or unsubstituted C1-C20 alkyl, a substituted or unsubstituted C1-C20 alkoxy, a substituted or unsubstituted C1-C20 alkylthiol, a substituted or unsubstituted C3-C20 cycloalkyl, a substituted or unsubstituted C3-C20 heterocyclic group, a substituted or unsubstituted C6-C40 aryl, and a substituted or unsubstituted C2-C40 heteroaryl; and # indicates a position bonding to the Chemical Formula 1.

12. The compound according to claim 1, wherein the boron-heterocyclic group is any one of the following groups:

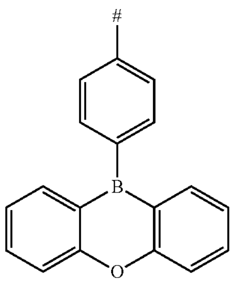

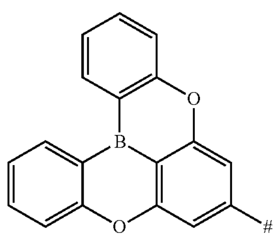

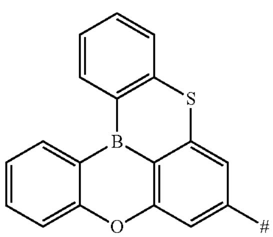

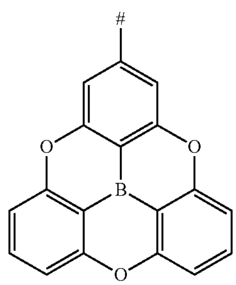

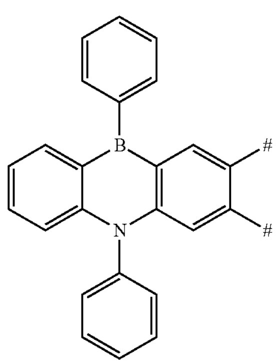

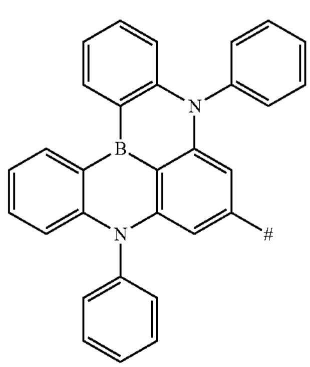

-continued

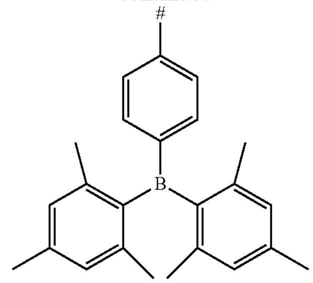

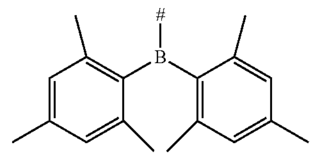

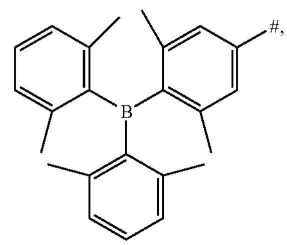

wherein # indicates a position bonding to the Chemical Formula 1.

13. The compound according to claim 1, wherein at least one of X1, $X_2$ or $X_3$ is N.

14. The compound according to claim 1, wherein $R^1$ and $R^2$ are each independently selected from the group consisting of —C(R)$_2$—, —N(R)—, and —Si(R)—; and $L_1$ and $L_2$ are each phenylene.

15. The compound according to claim 1, wherein $Ar_1$, $Ar_2$, $Ar_3$ and $Ar_4$ are each the substituted or unsubstituted C6-C40 aryl, or the substituted or unsubstituted C5-C40 heteroaryl; and $Y_1$ and $Y_2$ are each the N-containing heterocyclic group.

16. The compound according to claim 1, wherein the compound is any one of the following compounds:

1

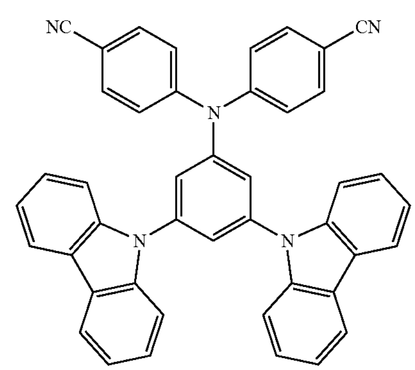

-continued
2
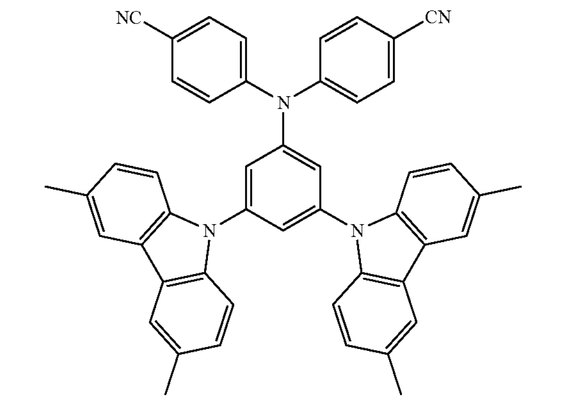
3
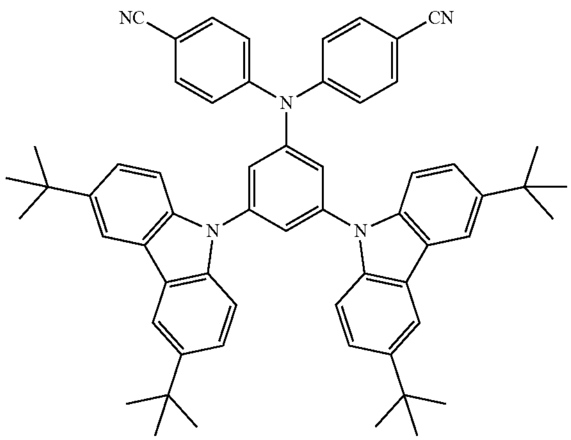
4
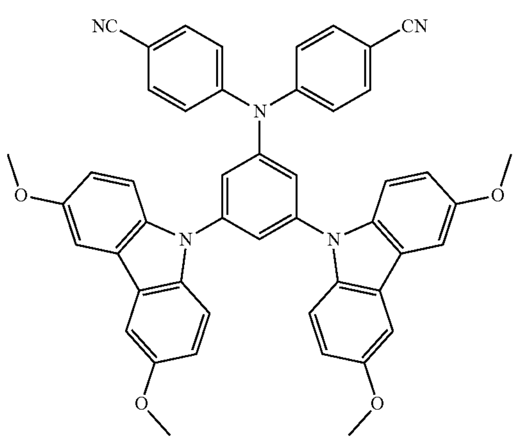
5
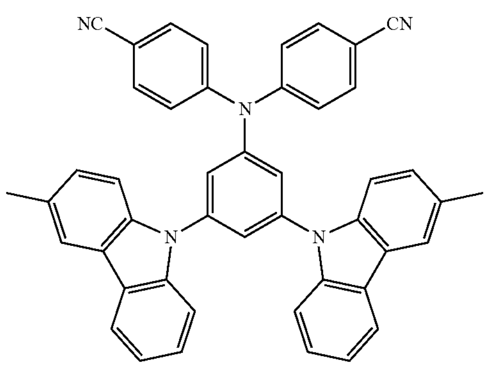
-continued
6
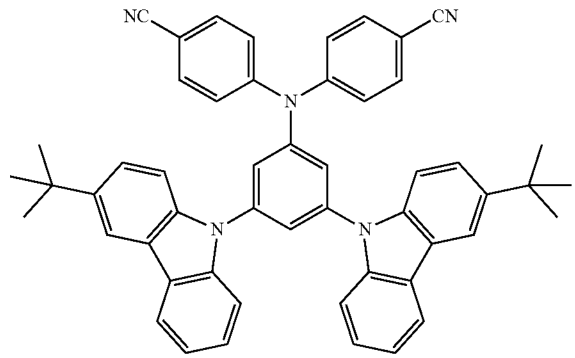
7
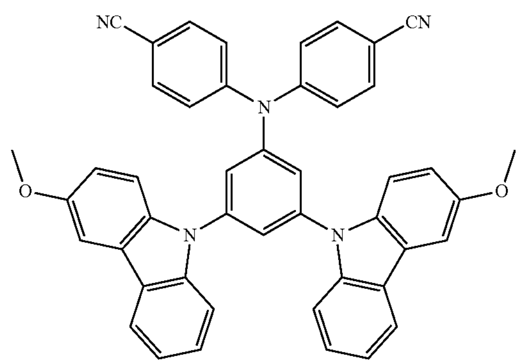
8
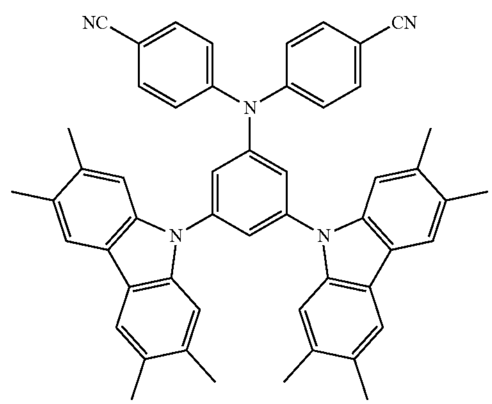
9
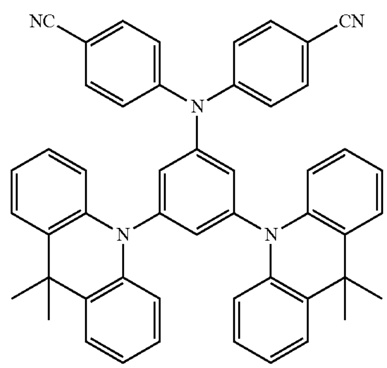

10
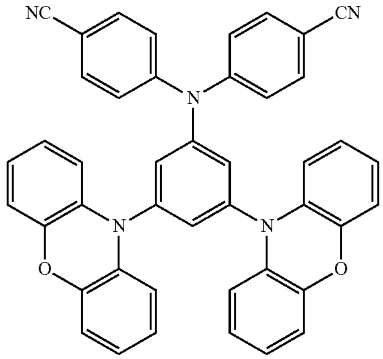
11
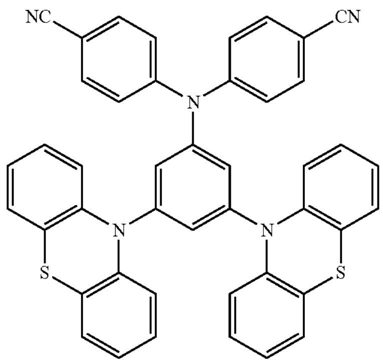
12
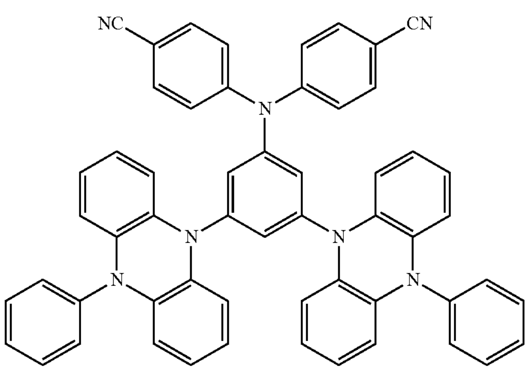
13
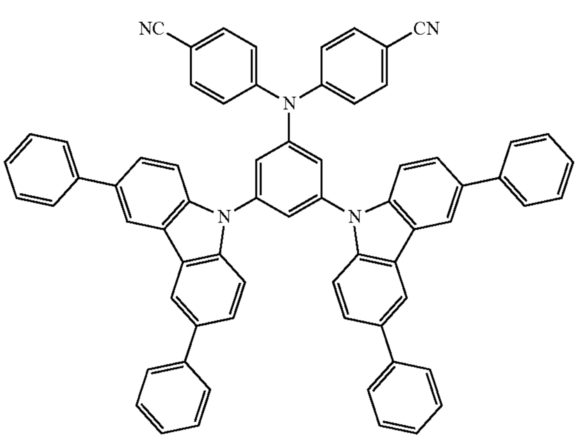
14
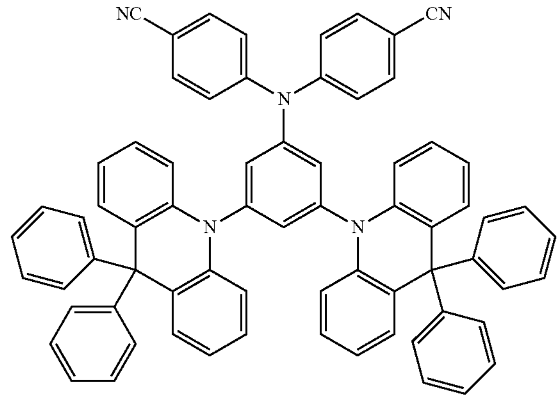
15
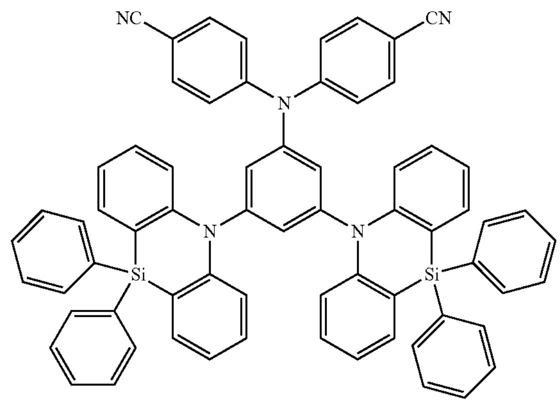
16
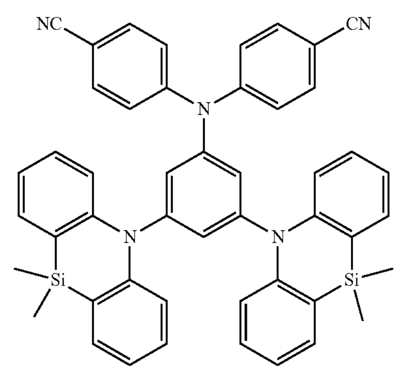
17
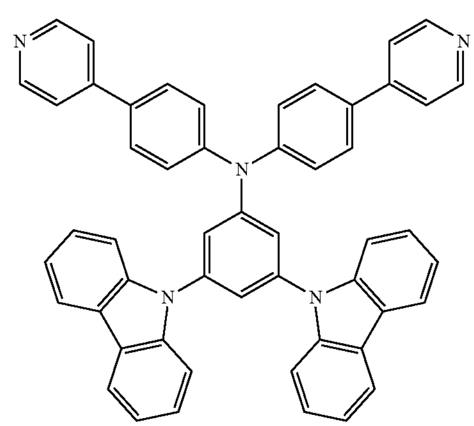

-continued
18
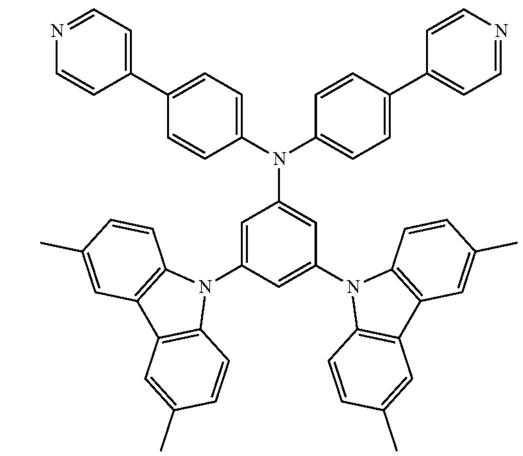
19
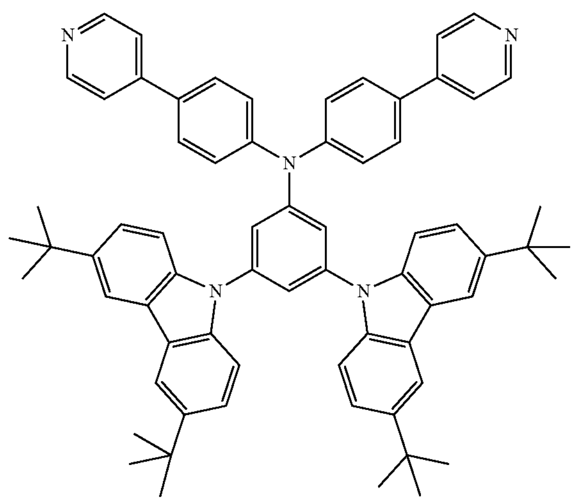
20
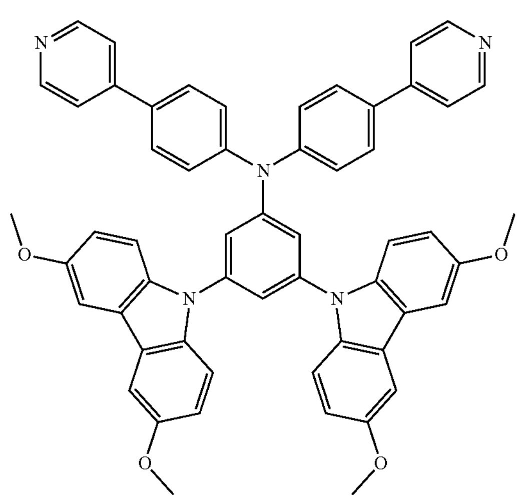
-continued
21
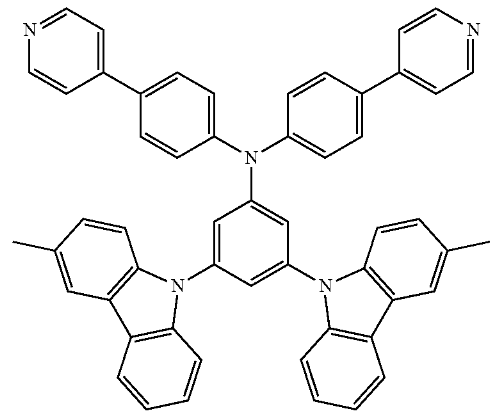
22
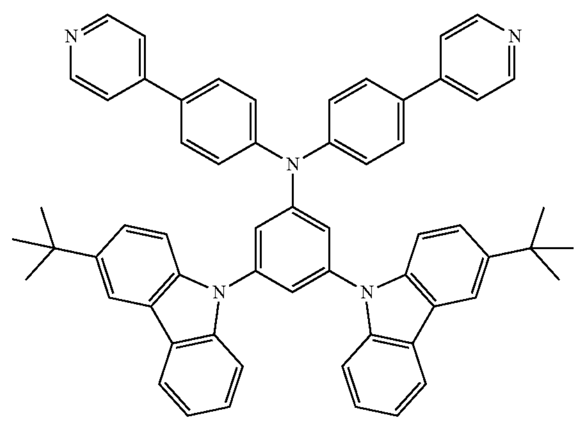
23
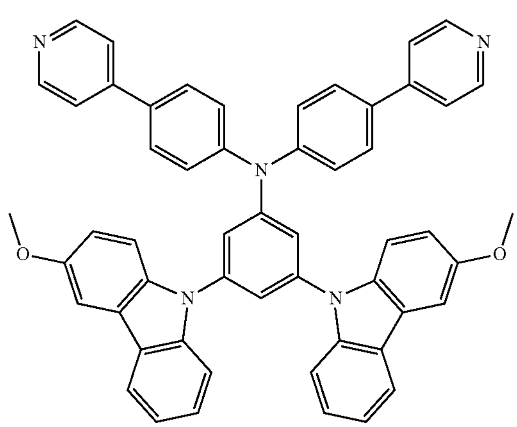

-continued
24
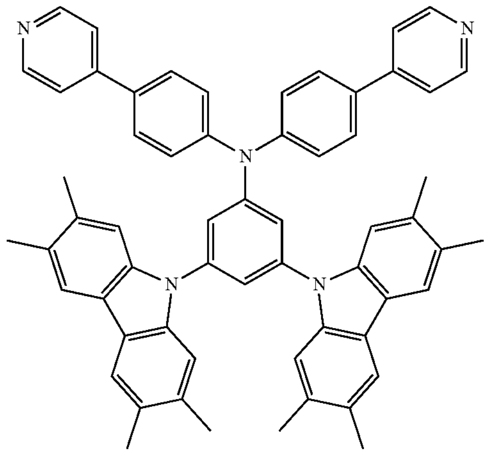
25
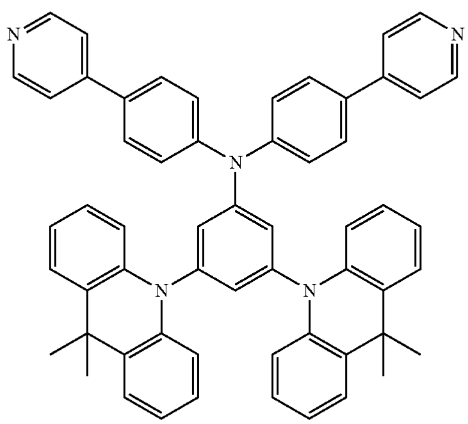
26
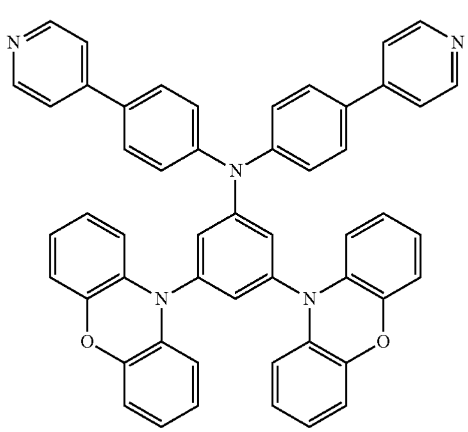
-continued
27
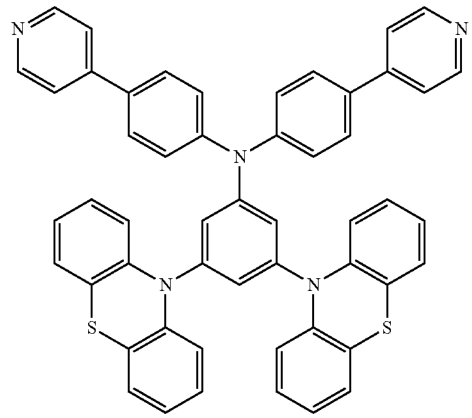
28
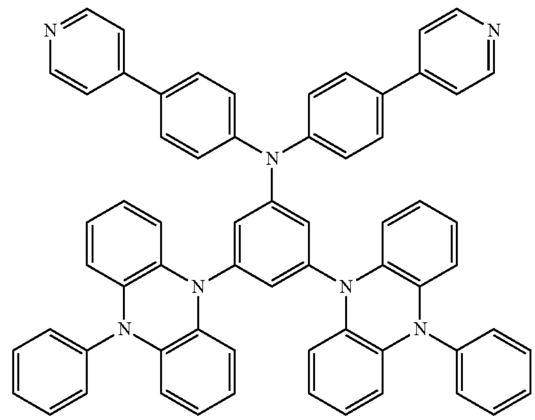
29
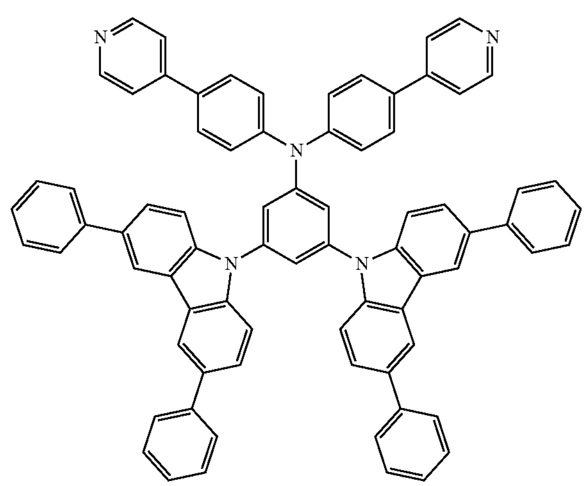

30
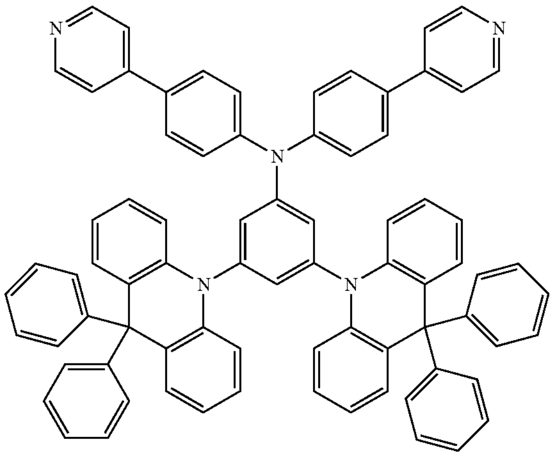
31
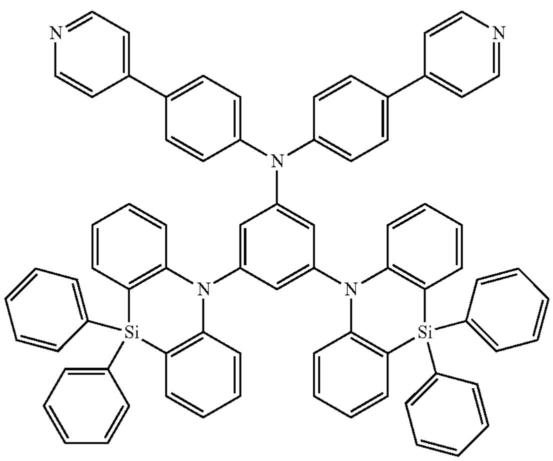
32
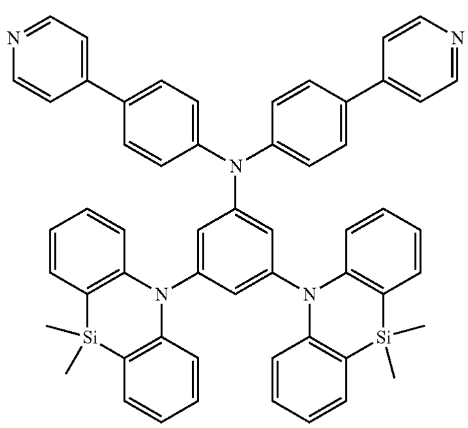
33
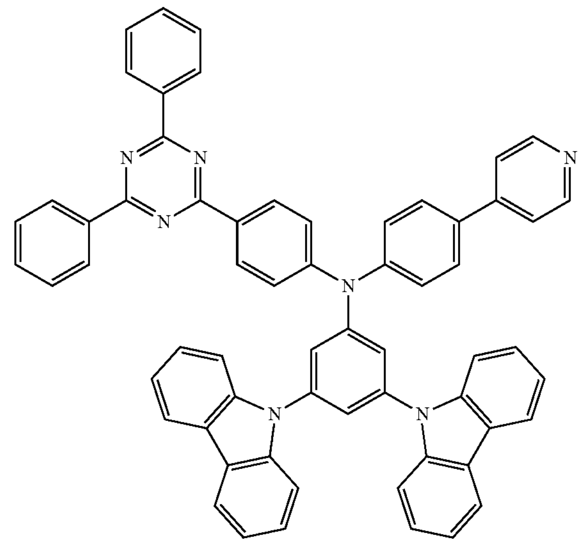
34
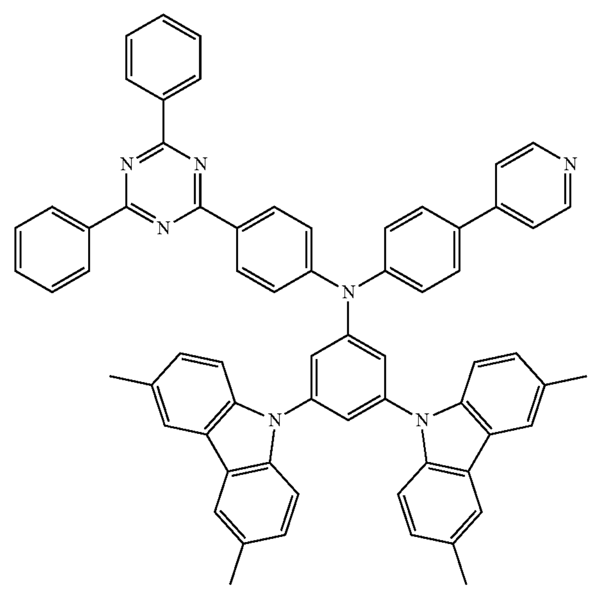

-continued
35
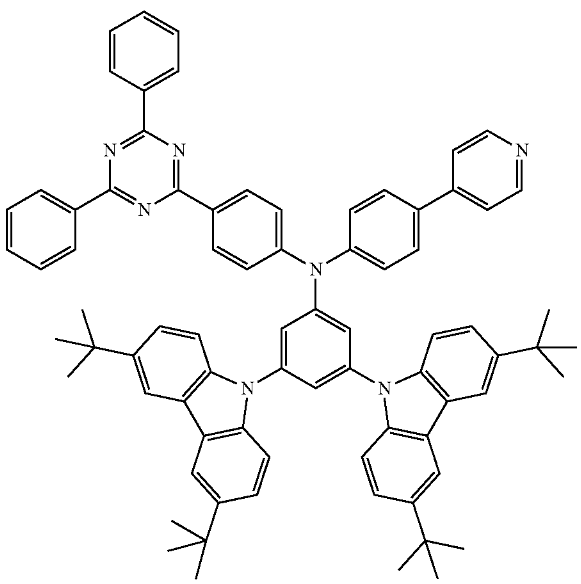
36
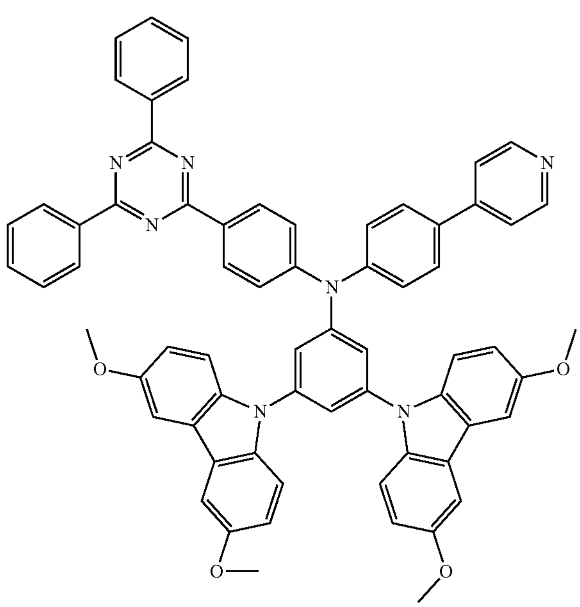
-continued
37
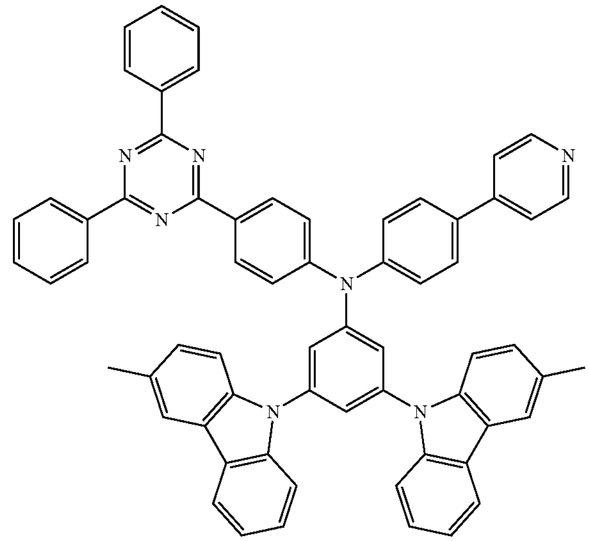
38
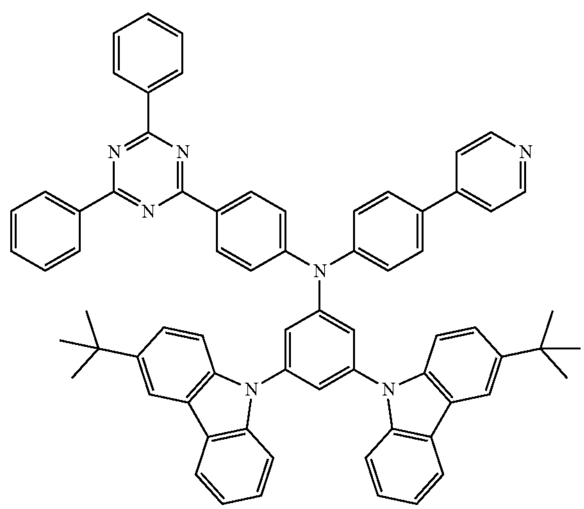
39
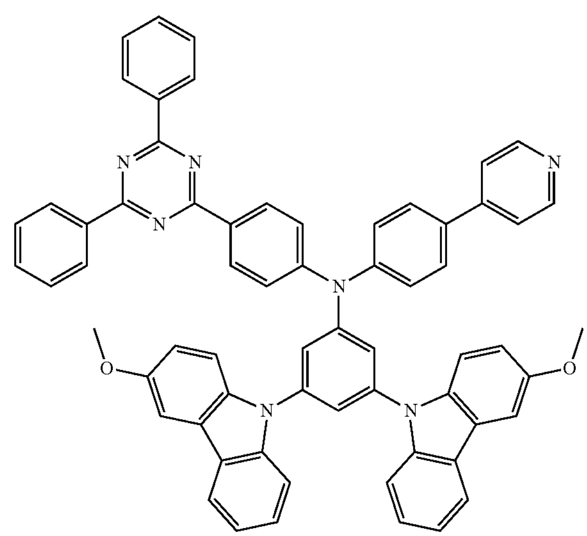

40
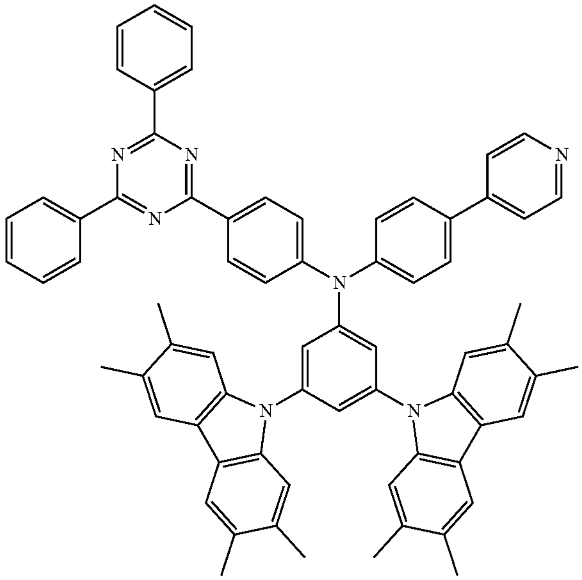
41
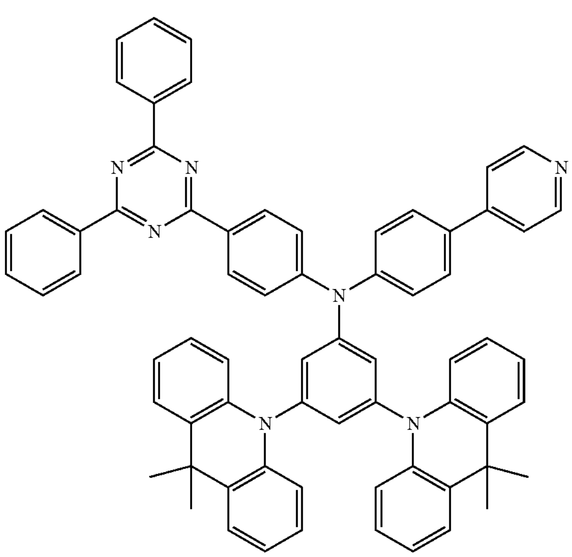
42
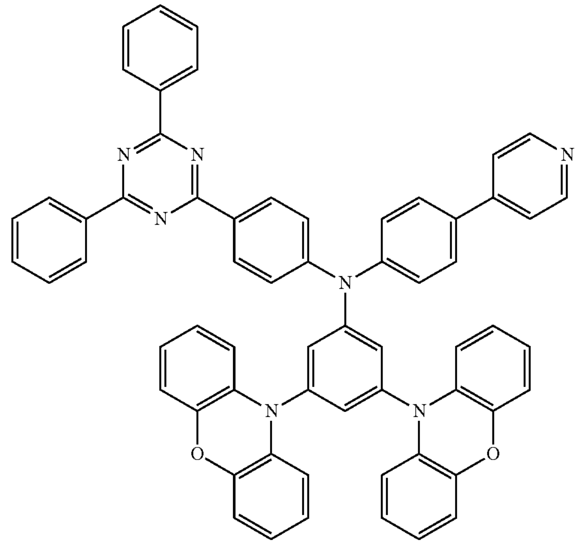
43
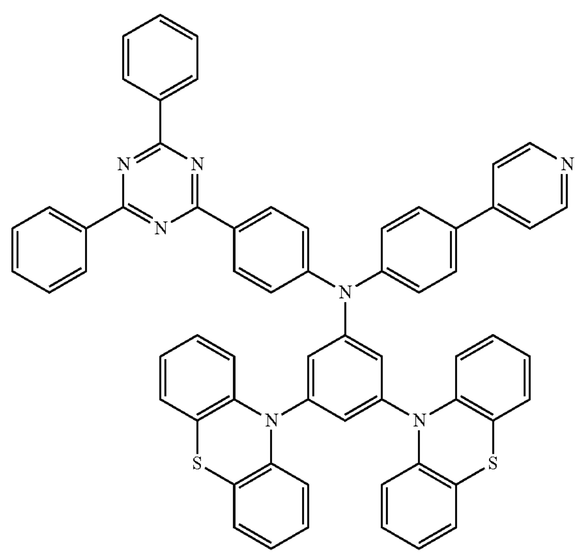

44
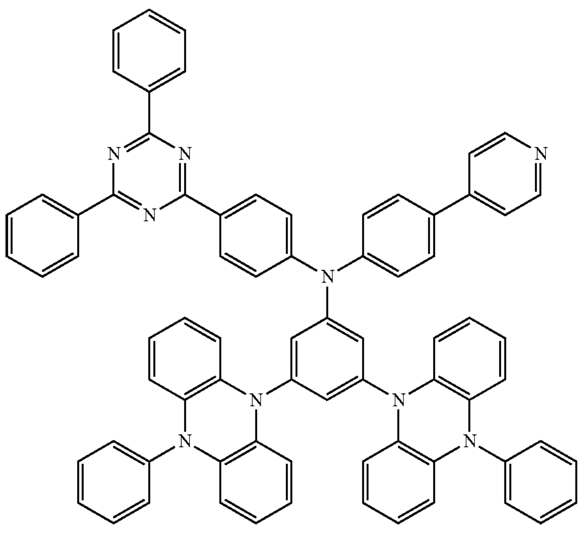
45
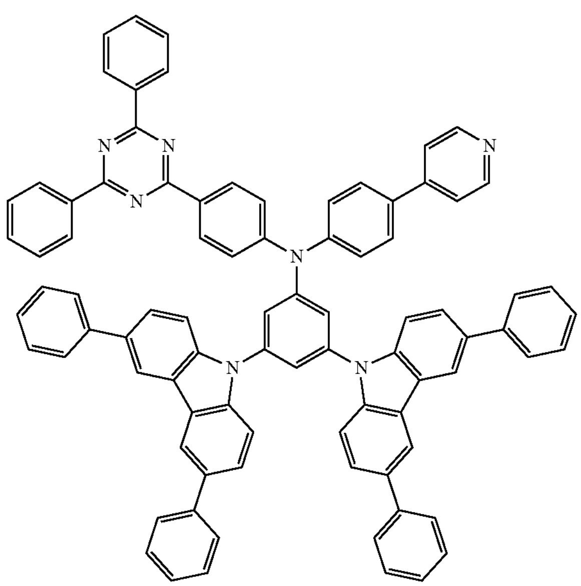
46
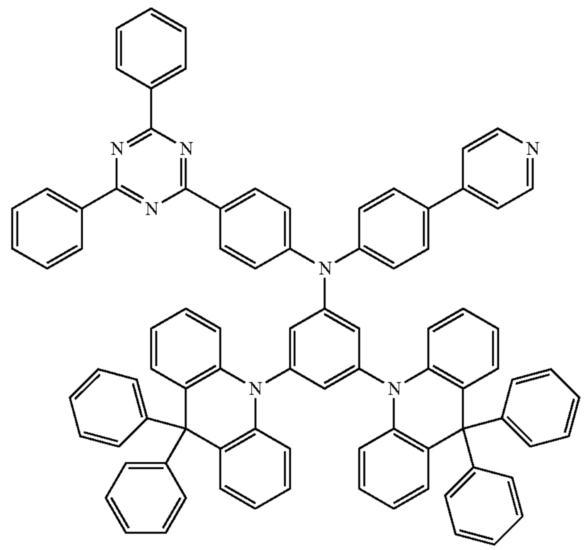
47
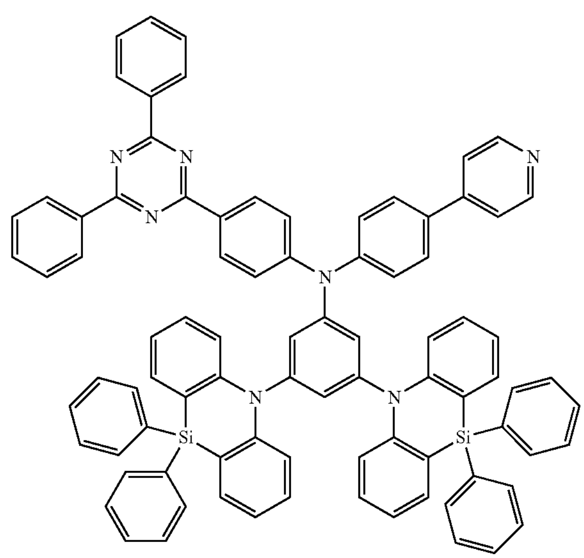

48
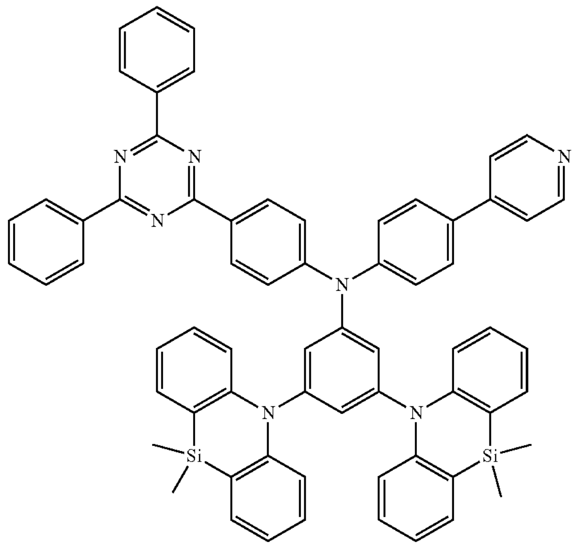
49
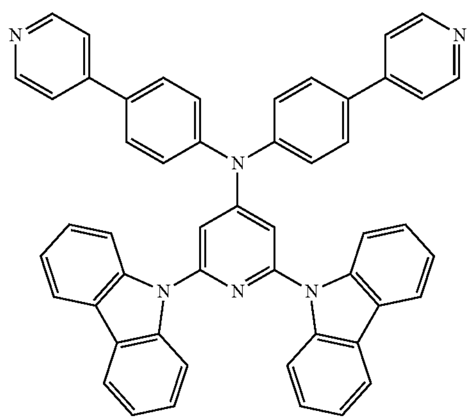
50
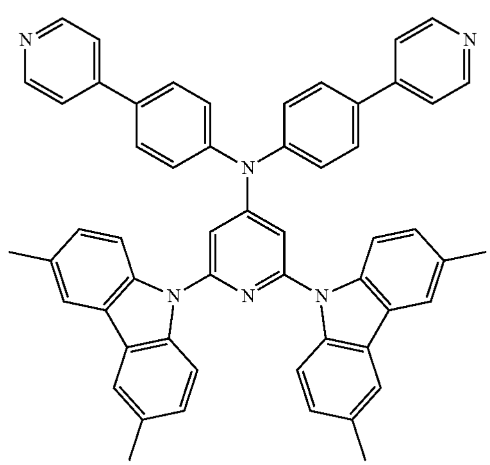
51
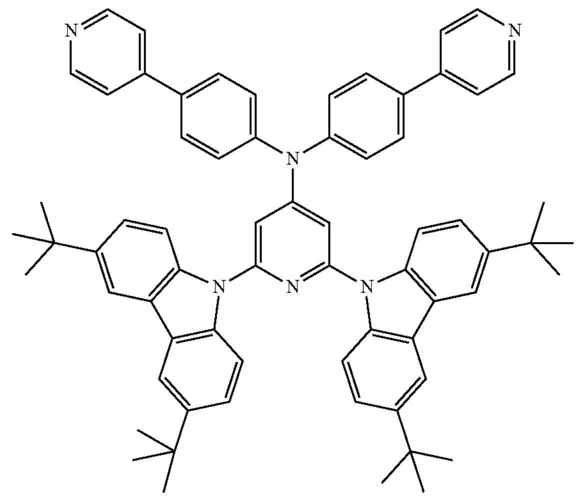
52
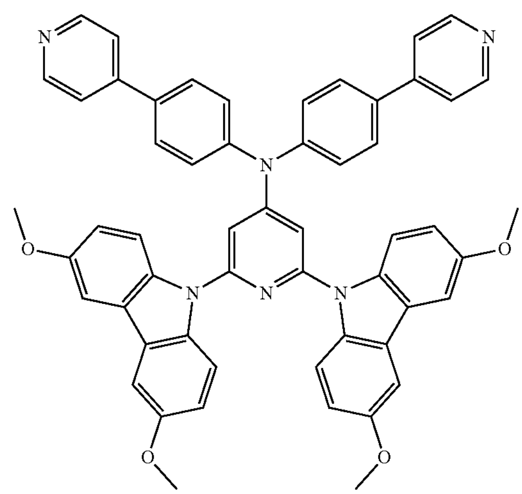
53
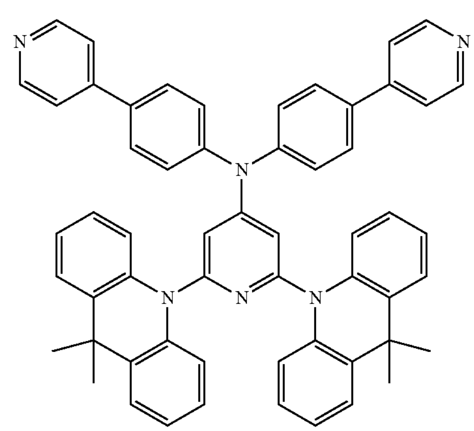

-continued
54
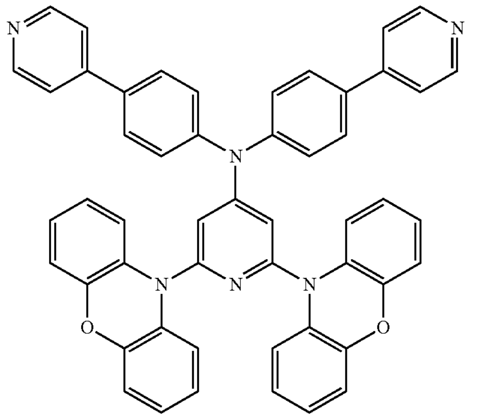
55
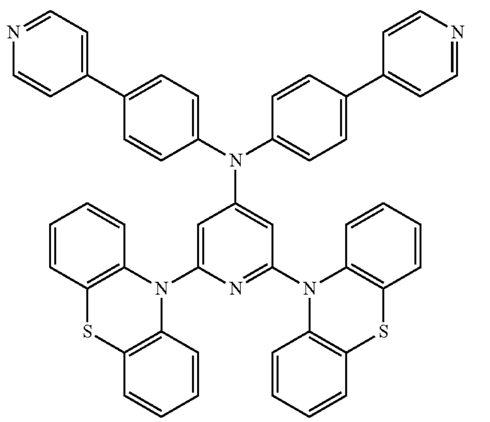
56
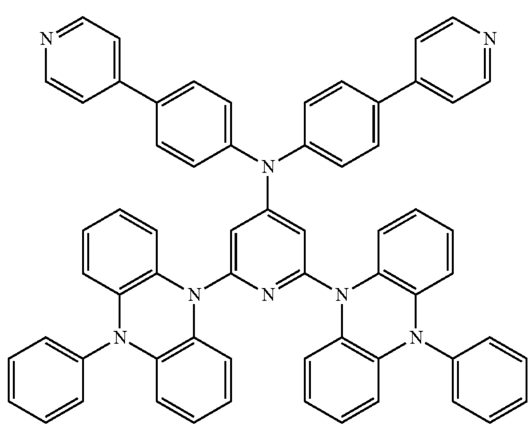
-continued
57
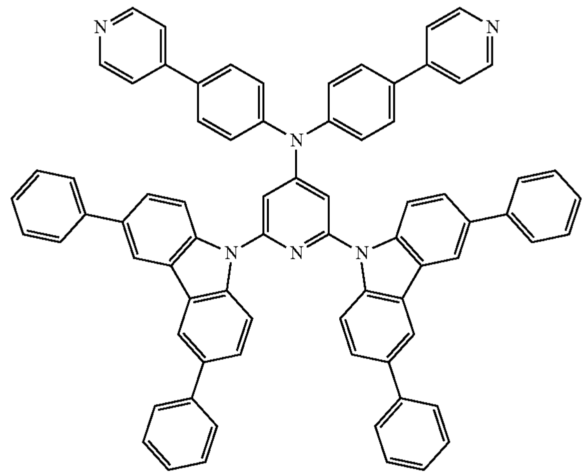
58
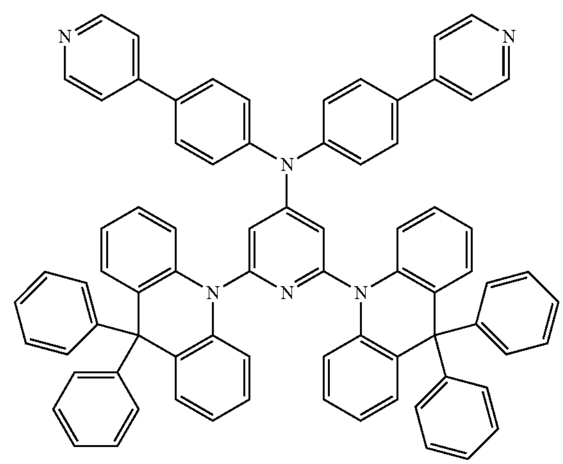
59
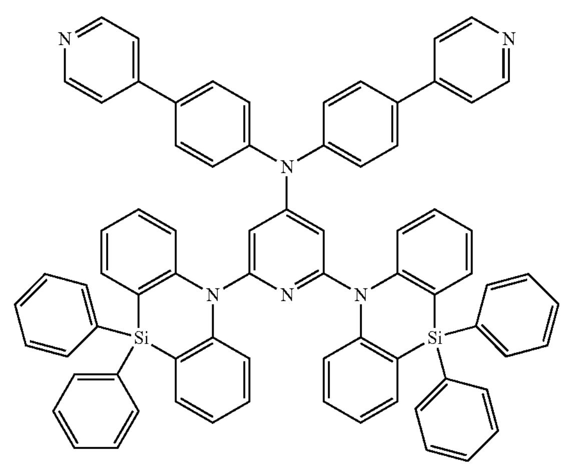

60
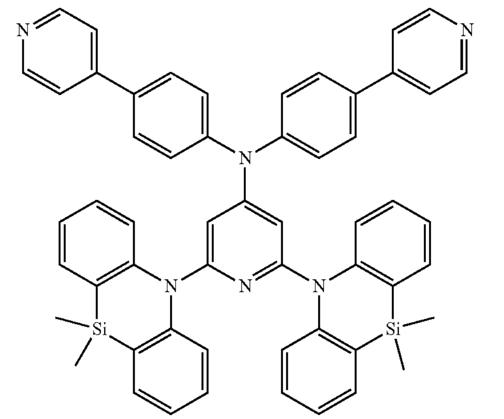
61
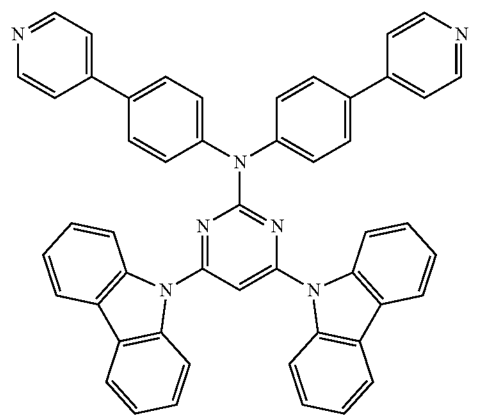
62
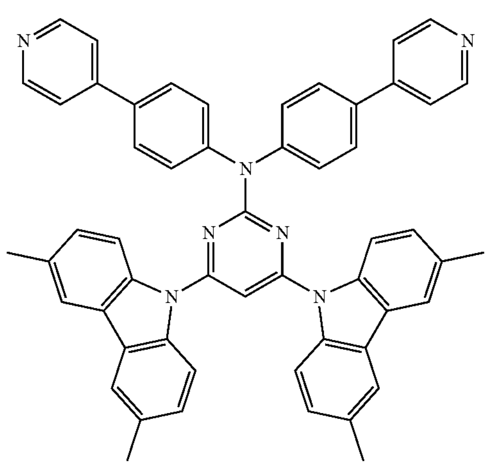
63
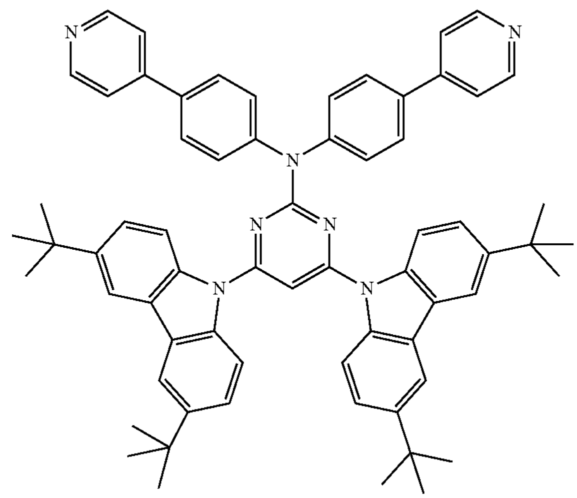
64
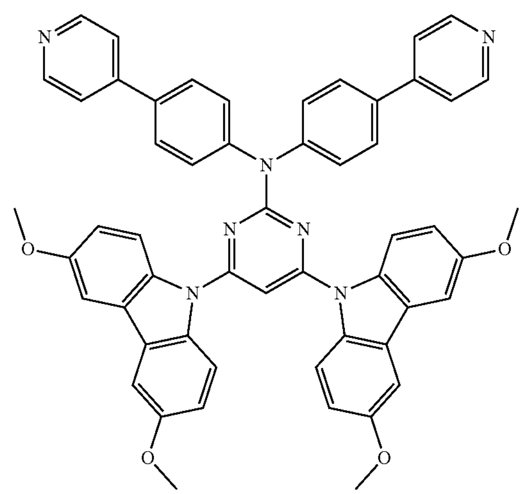
65
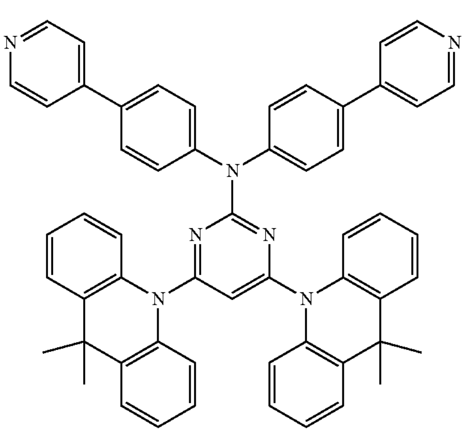

-continued
66
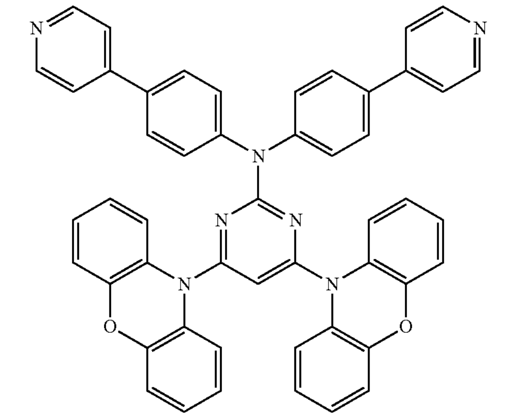
67
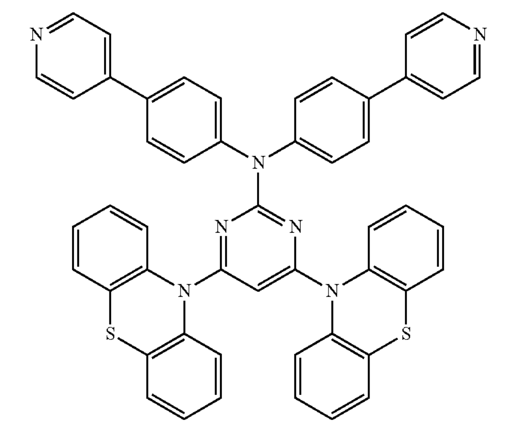
68
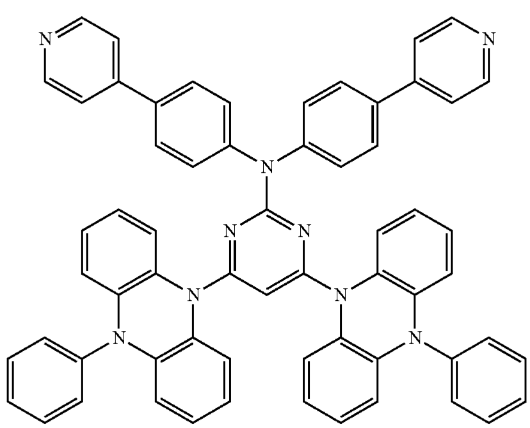
-continued
69
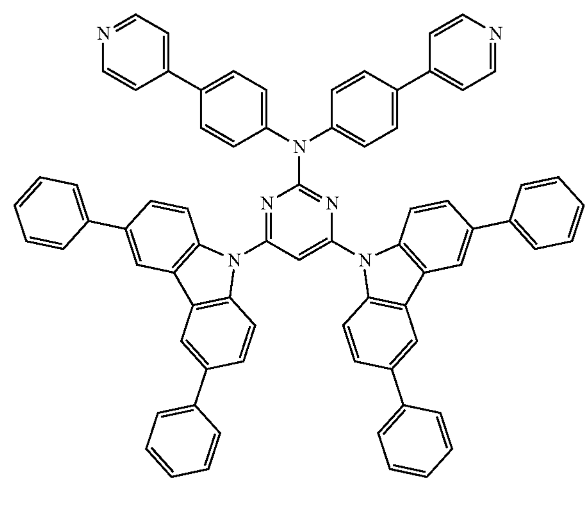
70
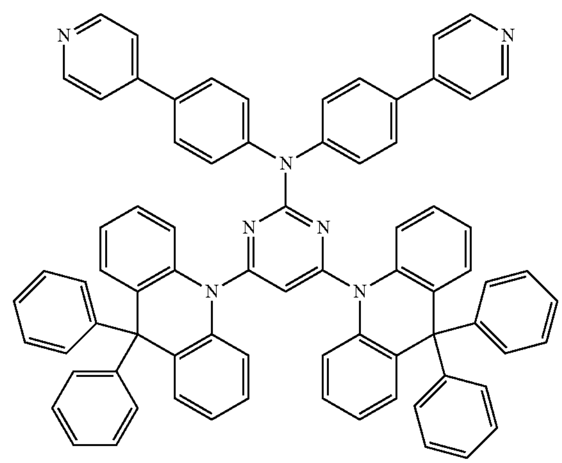
71
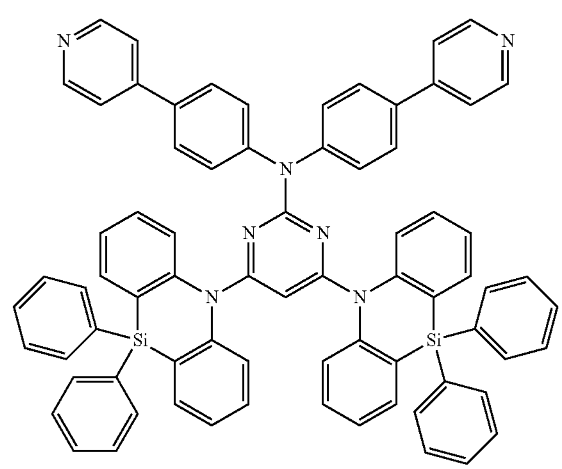

-continued
72
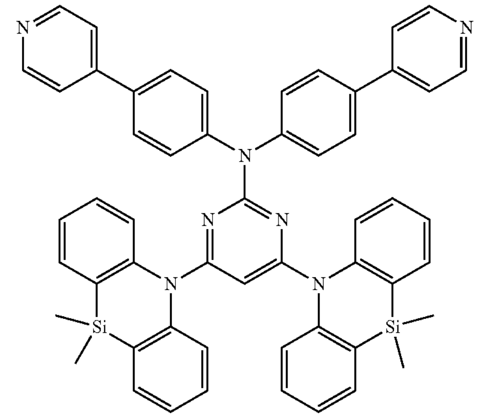
73
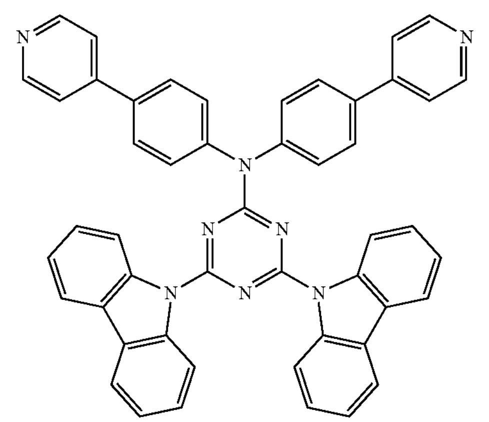
74
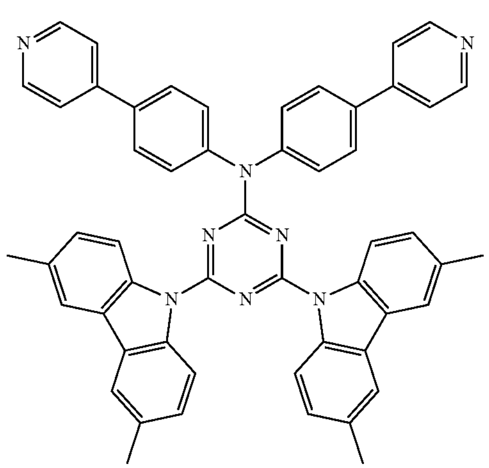
-continued
75
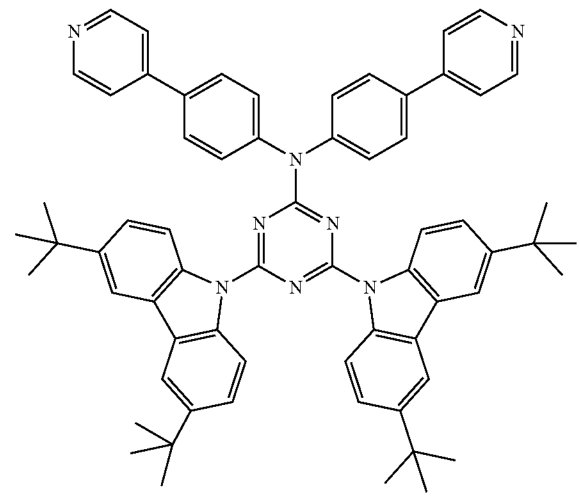
76
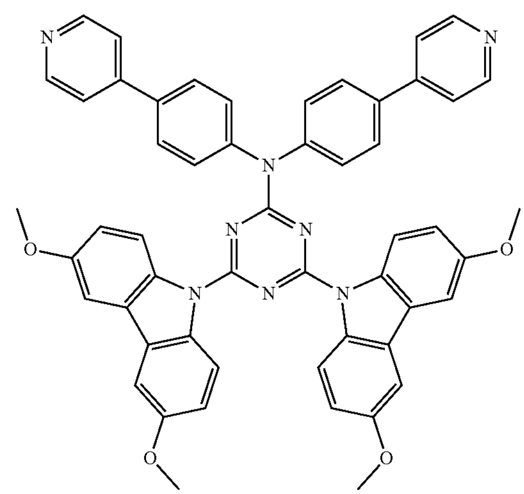
77
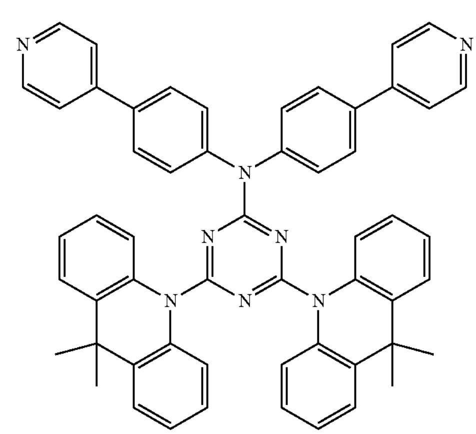

-continued
78
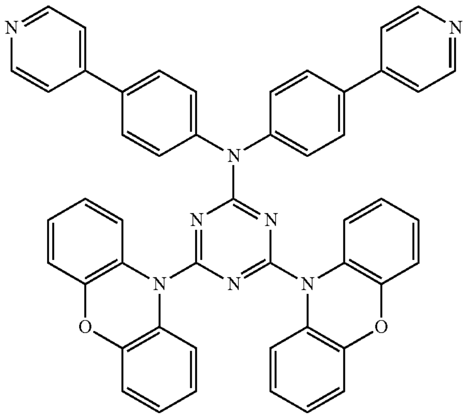
79
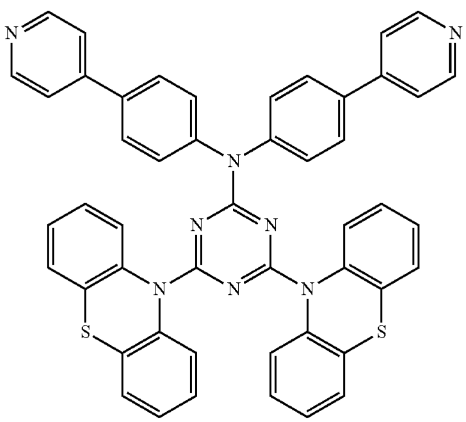
80
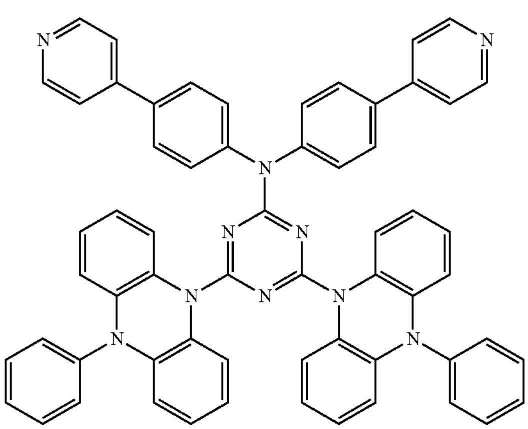
-continued
81
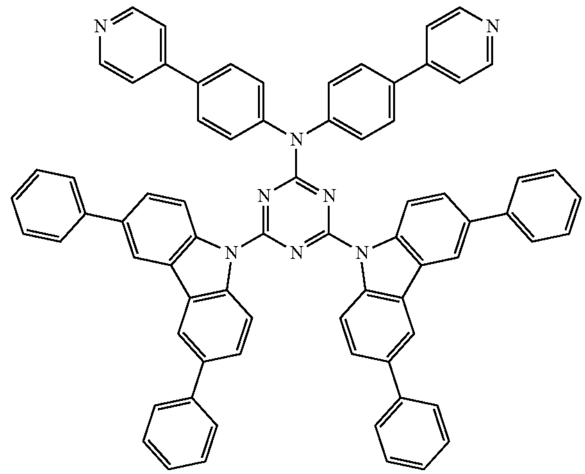
82
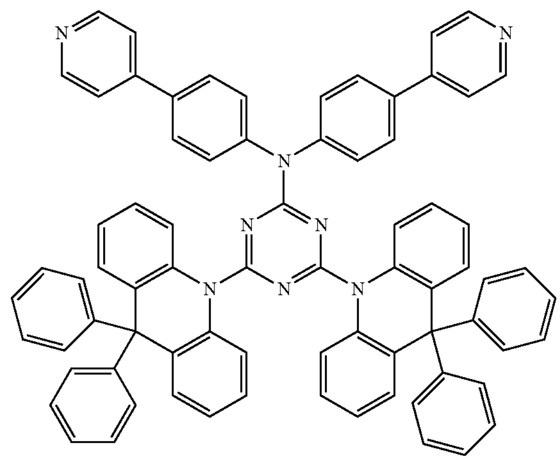
83
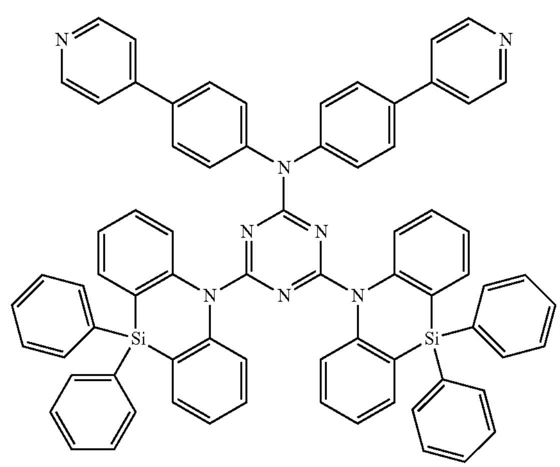

-continued
84
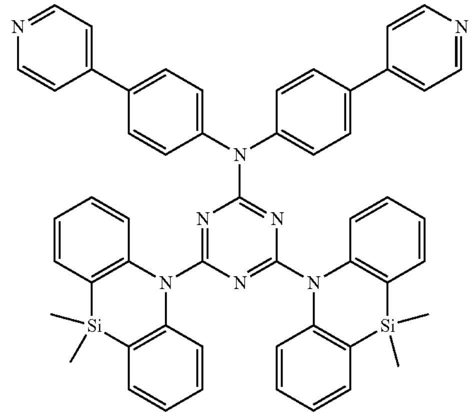
85
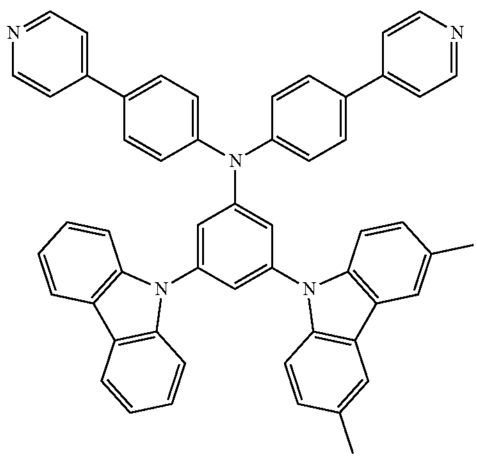
86
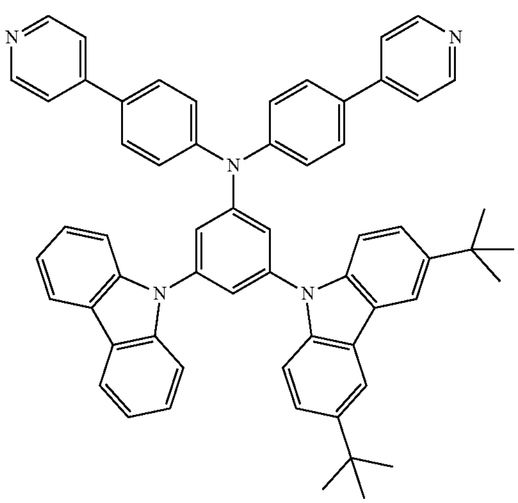
-continued
87
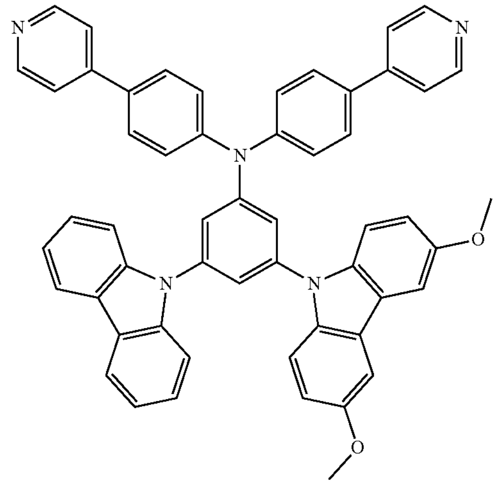
88
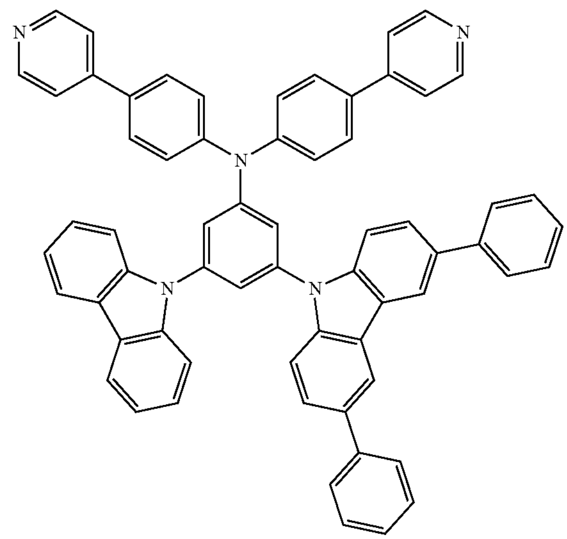
89
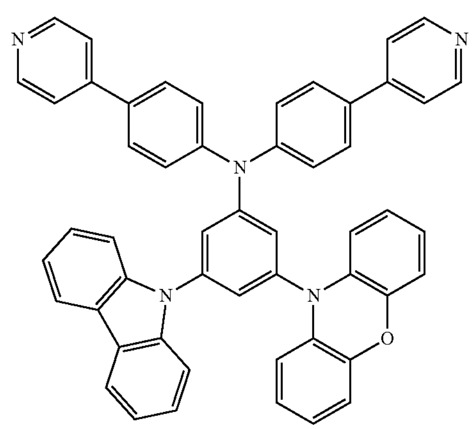

-continued
90
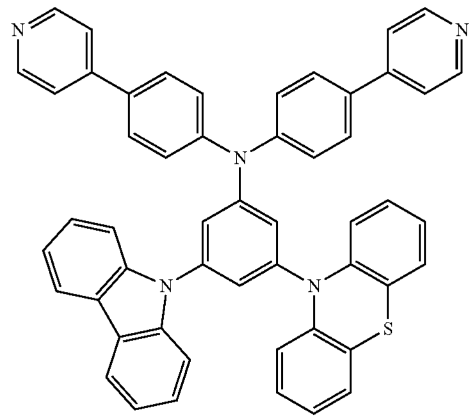
91
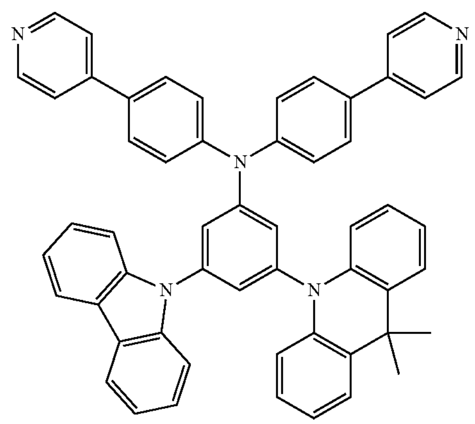
92
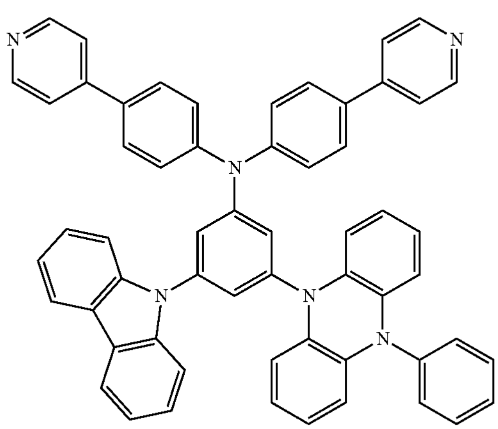
-continued
93
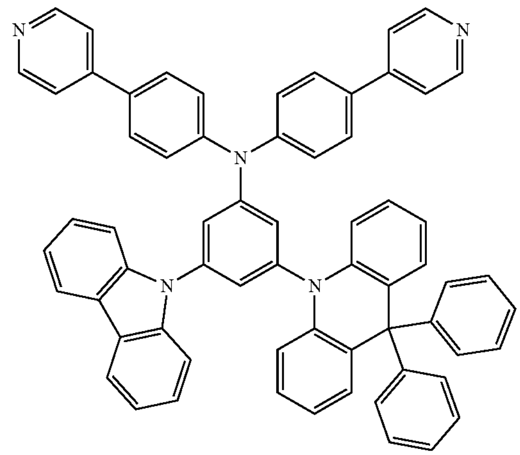
94
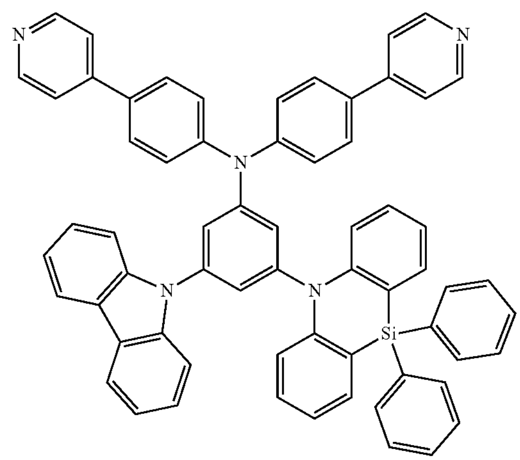
95
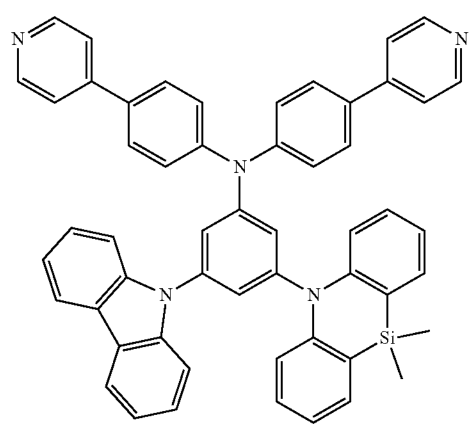

-continued
96
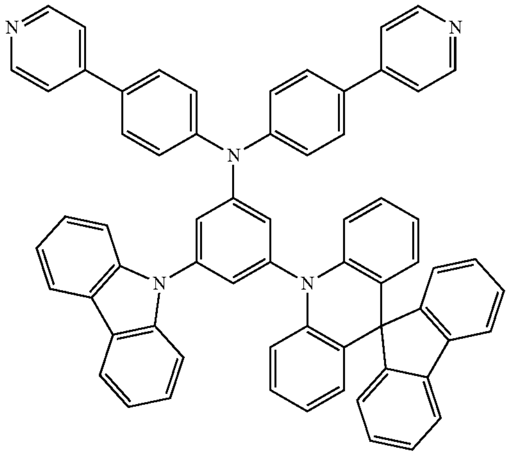
97
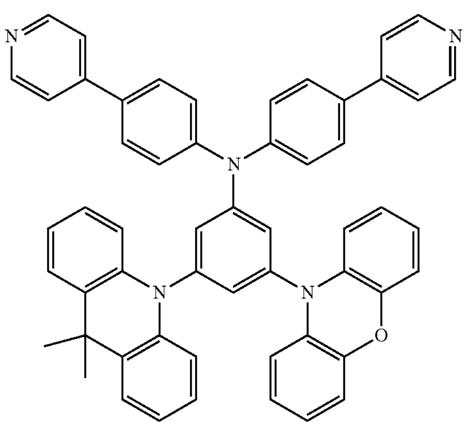
98
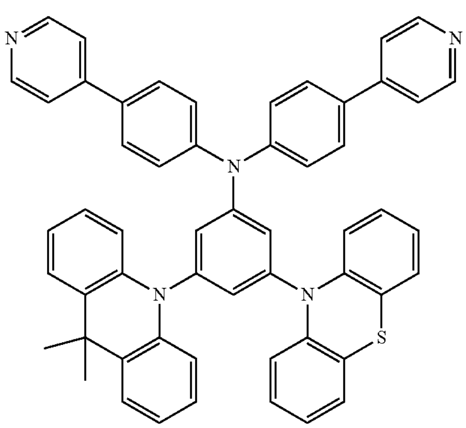
-continued
99
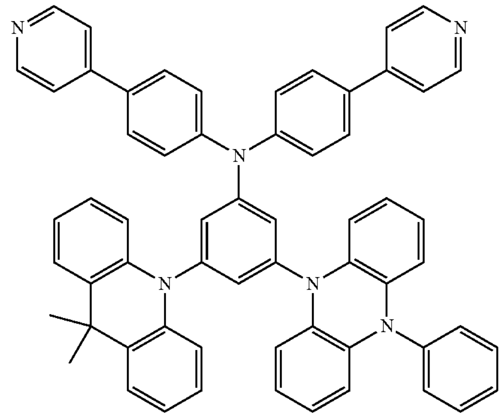
100
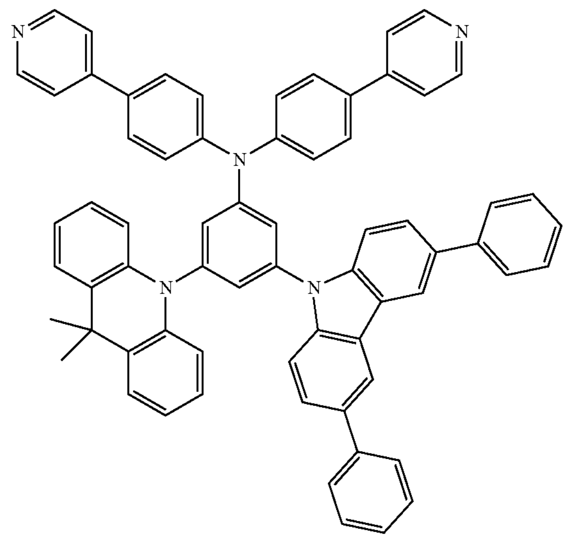
101
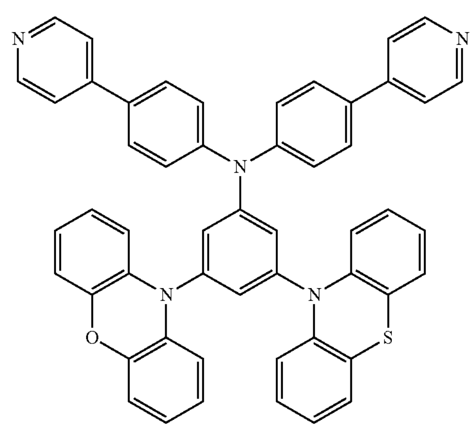

-continued
102
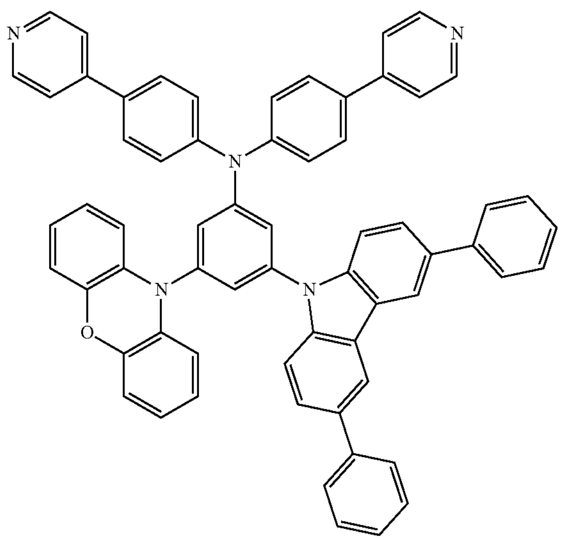
103
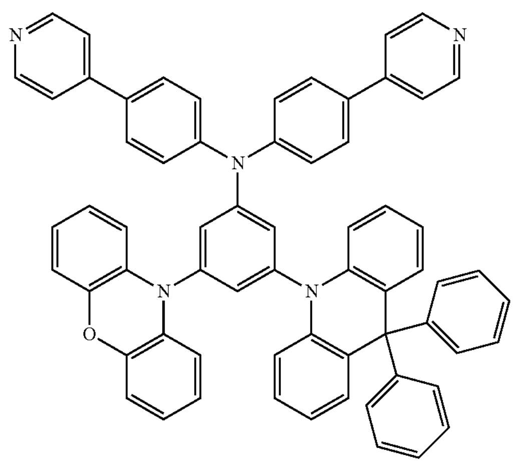
104
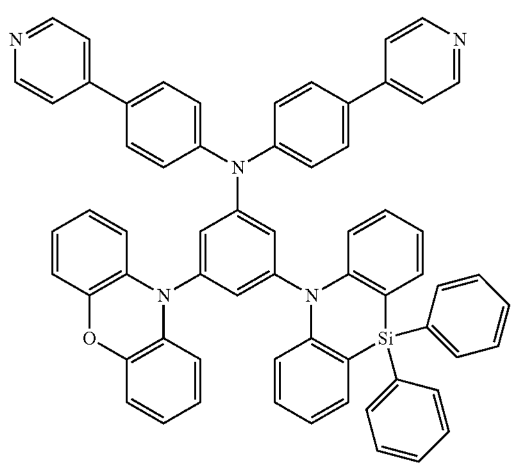
-continued
105
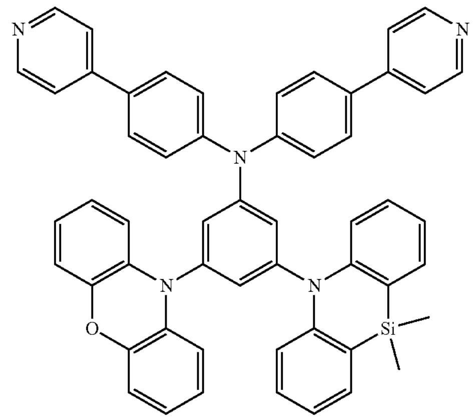
106
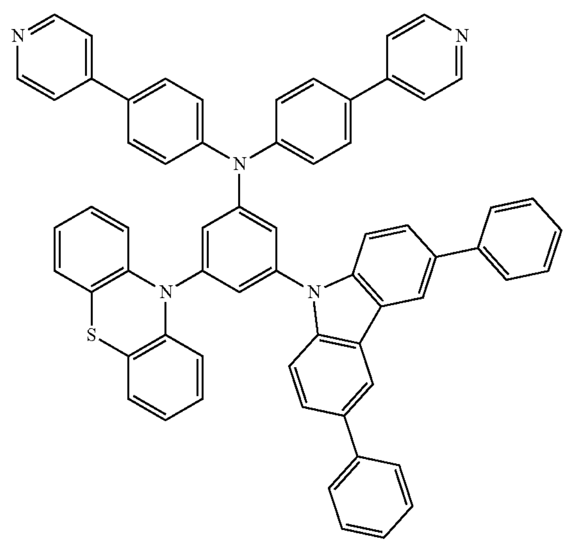
107
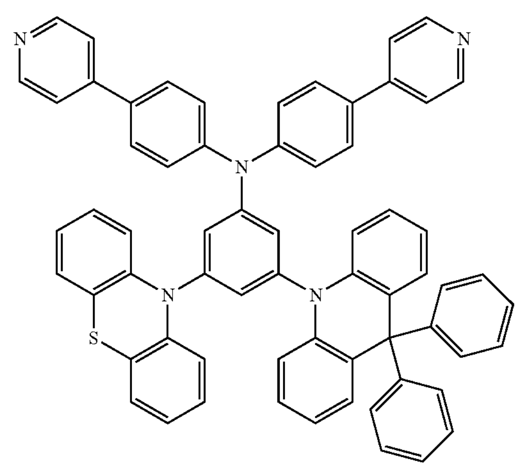

-continued
108
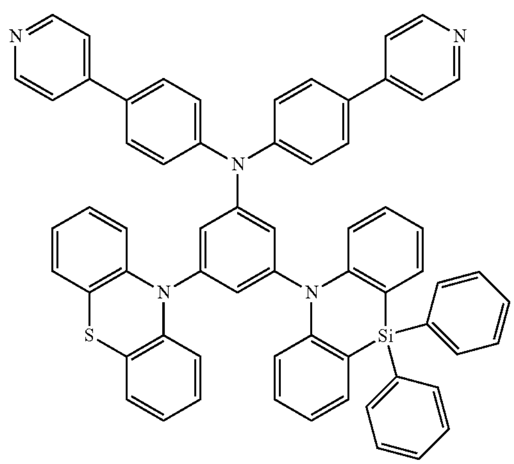
109
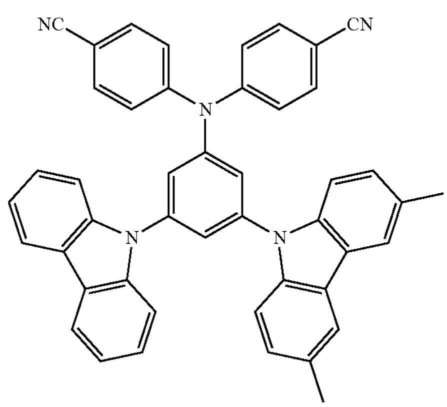
110
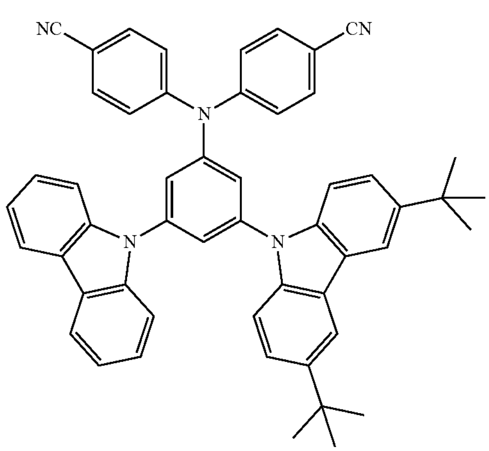
-continued
111
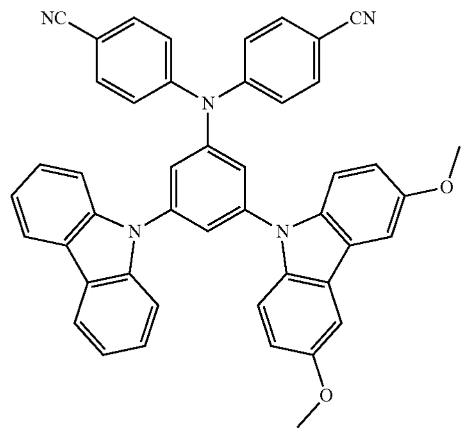
112
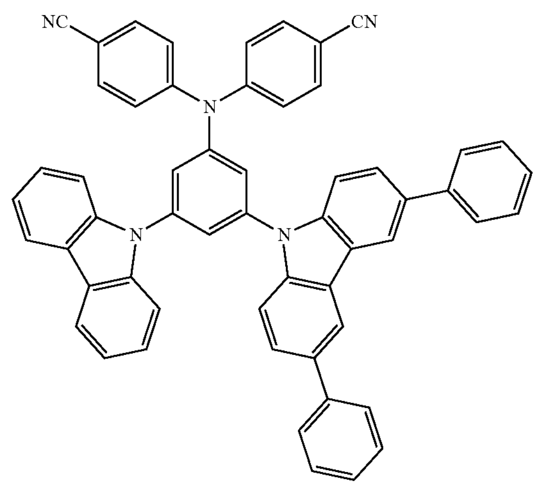
113
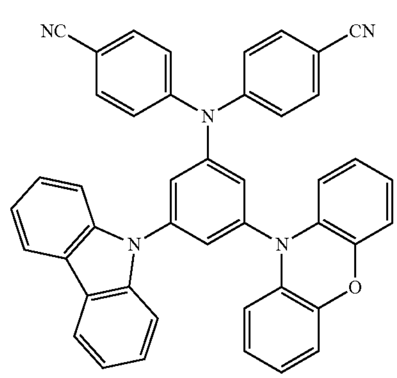

114
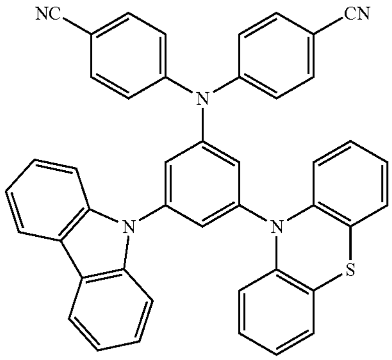
115
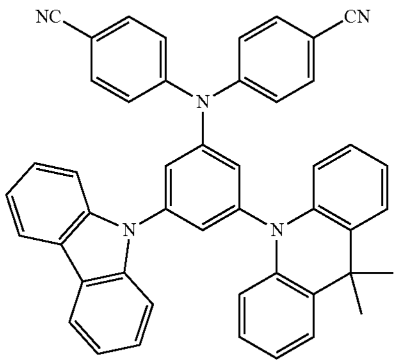
116
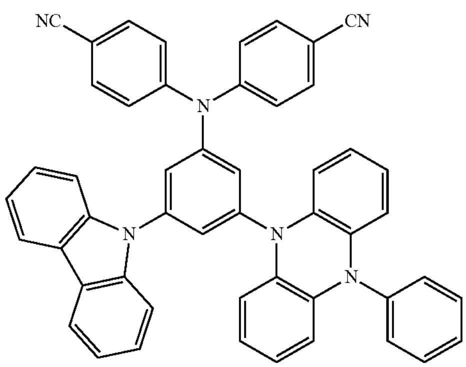
117
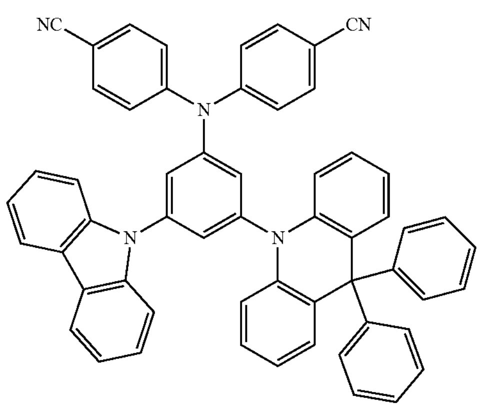
118
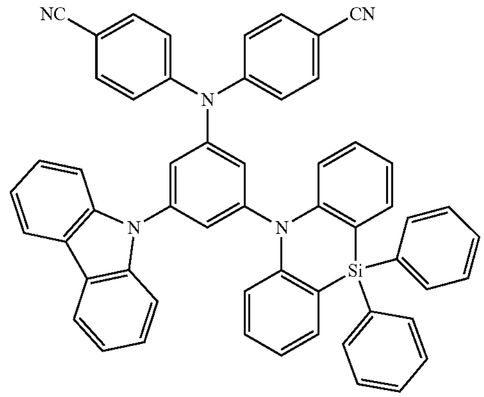
119
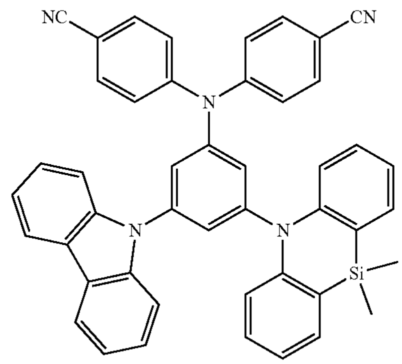
120
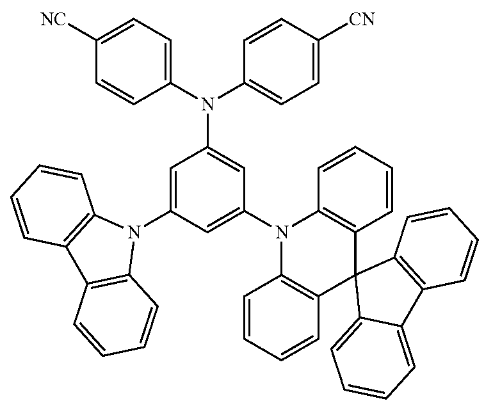
121
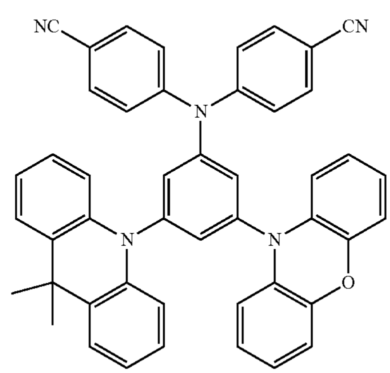

-continued
122
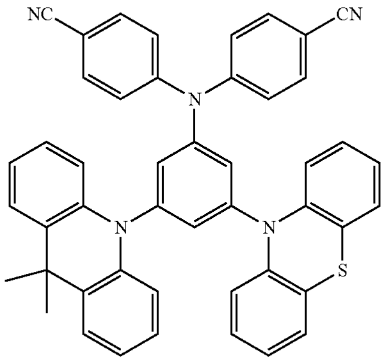
123
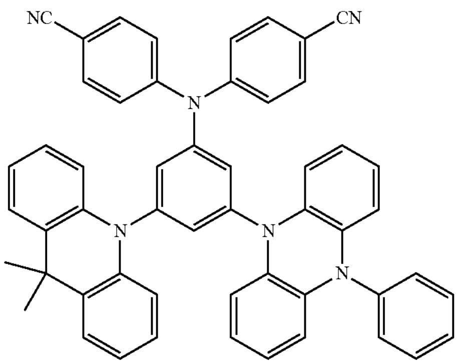
124
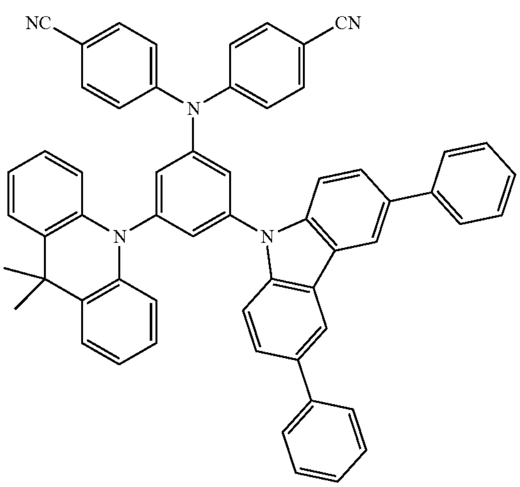
125
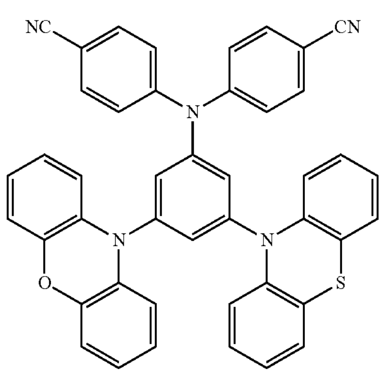
-continued
126
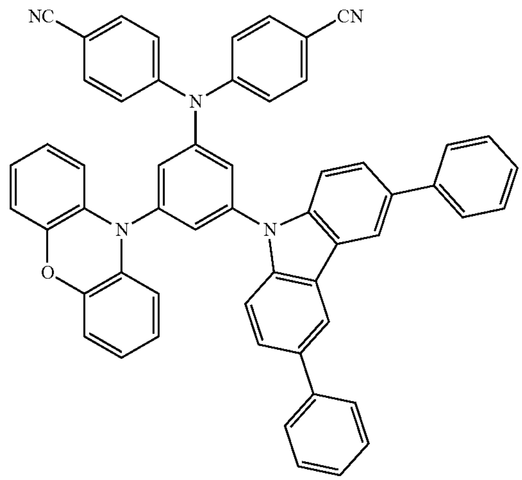
127
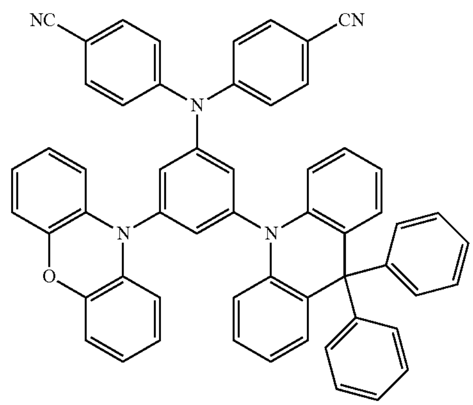
128
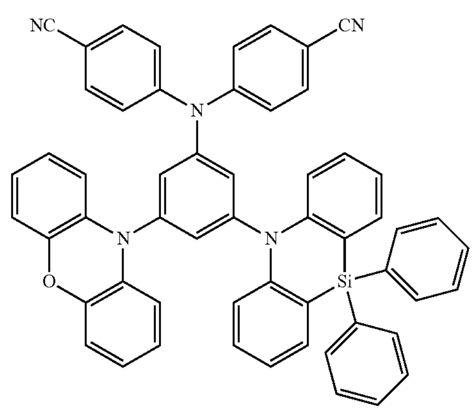
129
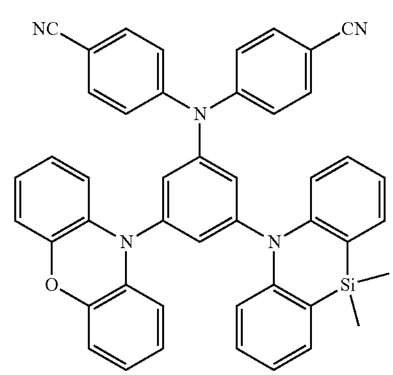

-continued
130
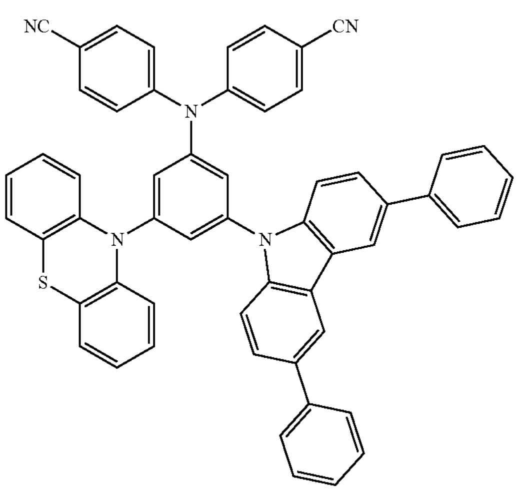
131
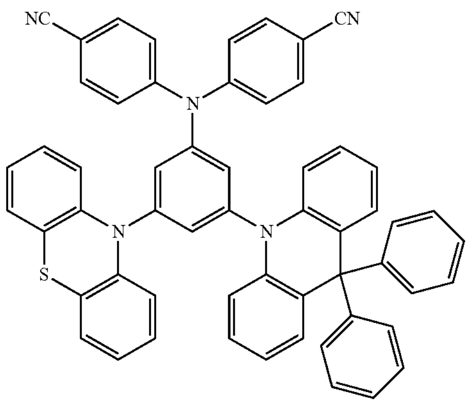
132
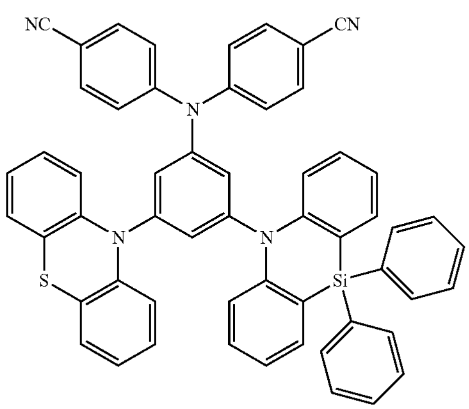
-continued
133
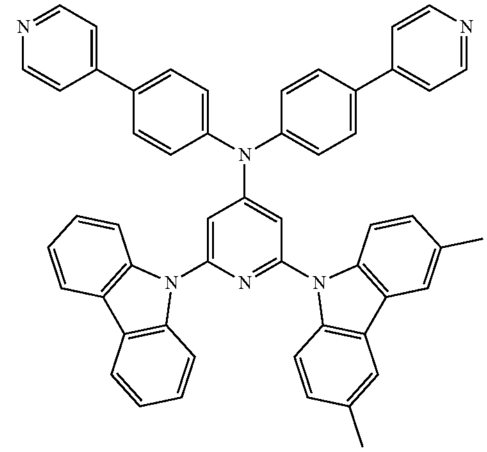
134
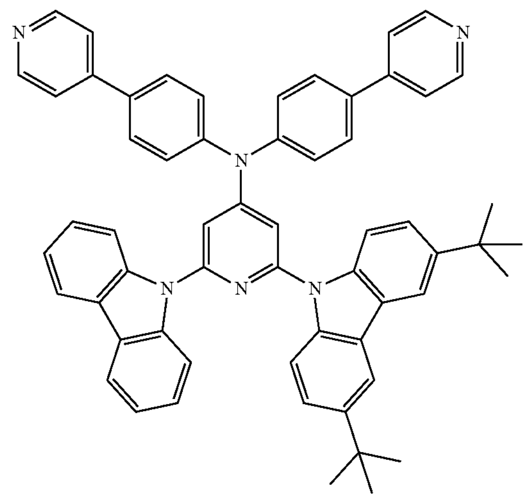
135
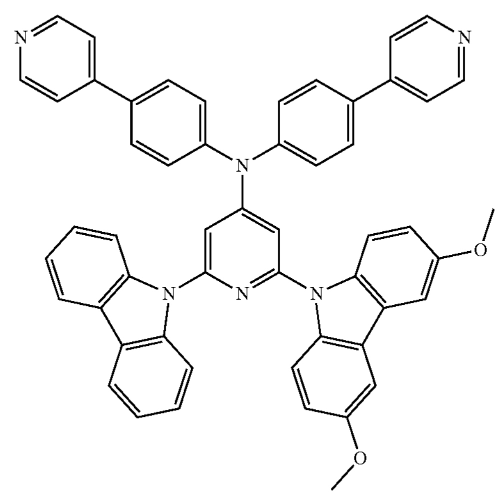

-continued
136
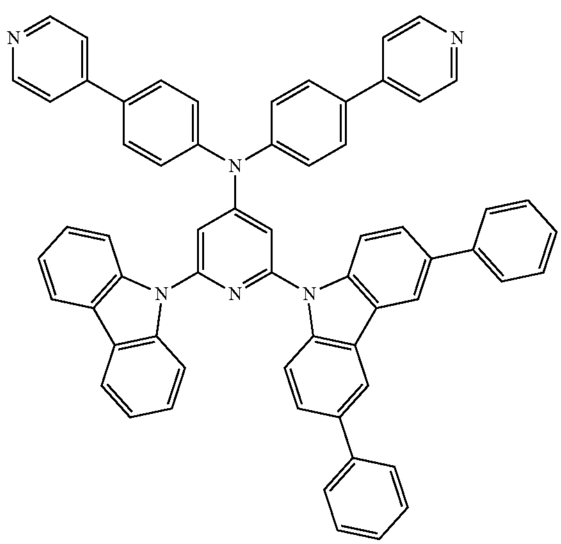
137
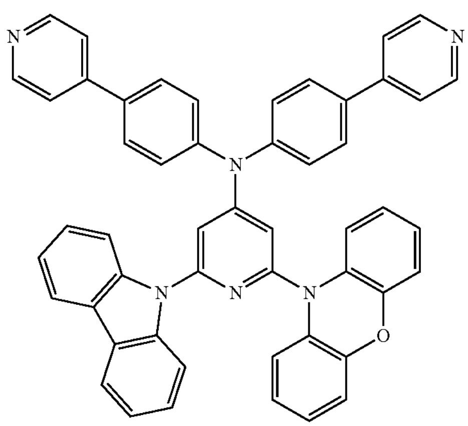
138
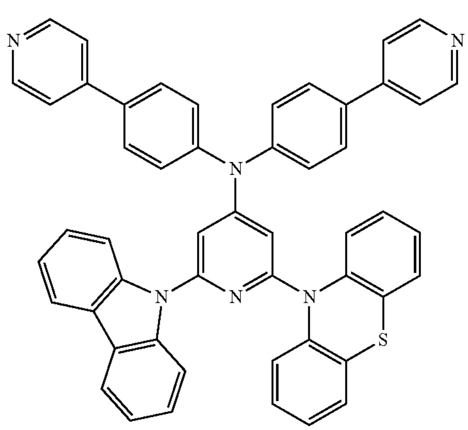
-continued
139
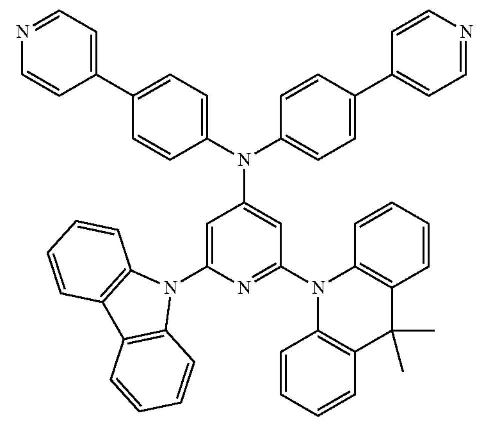
140
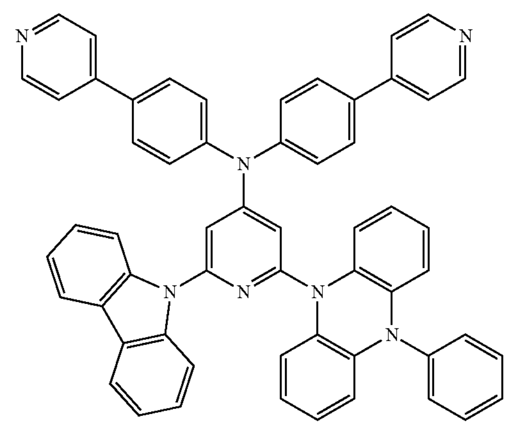
141
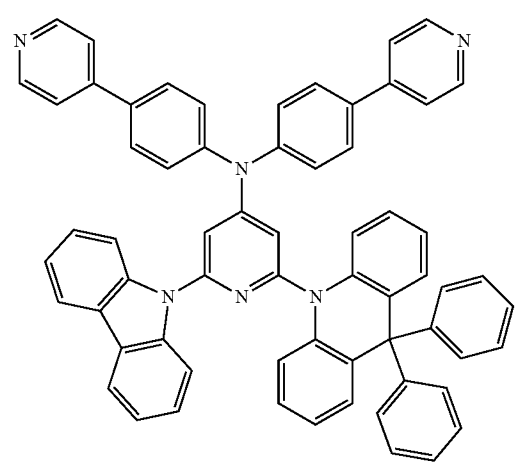

-continued
142
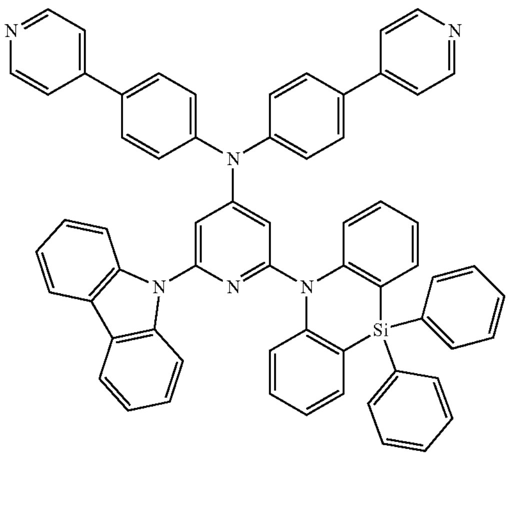
143
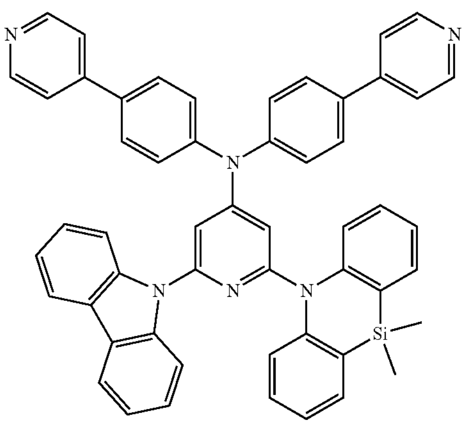
144
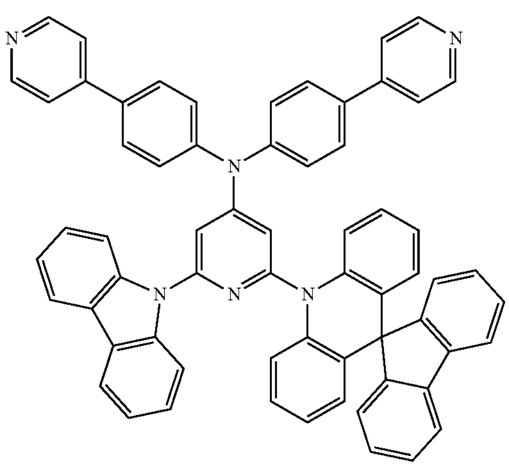
-continued
145
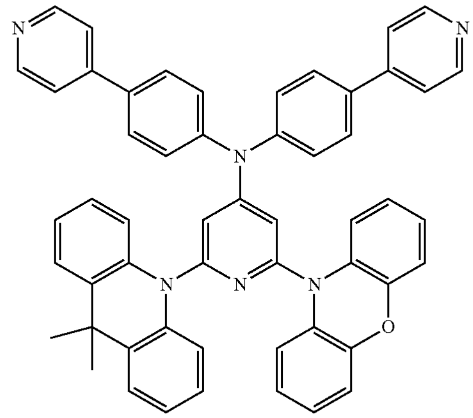
146
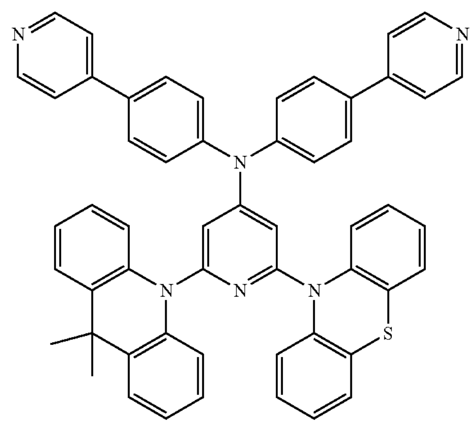
147
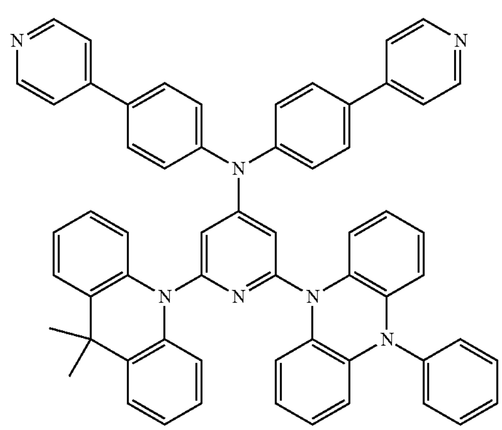

-continued
148
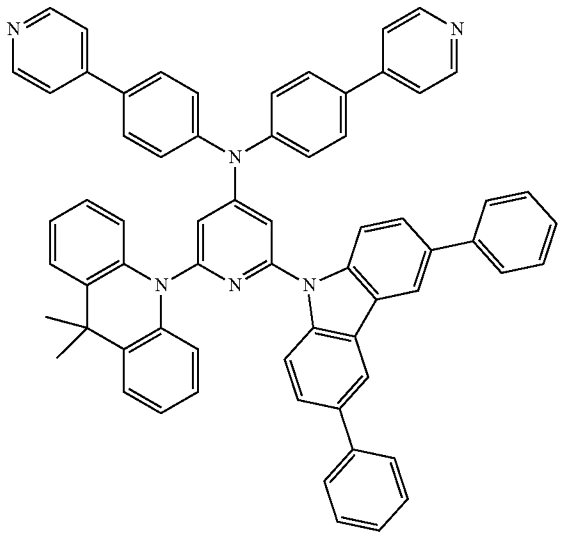
149
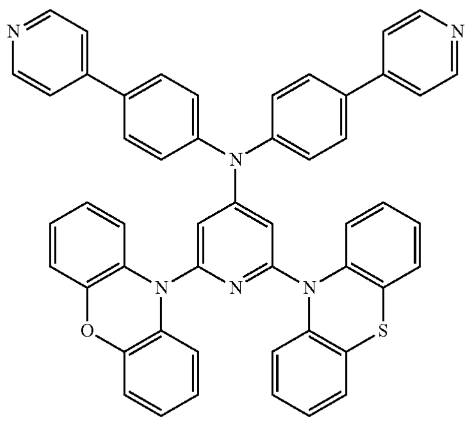
150
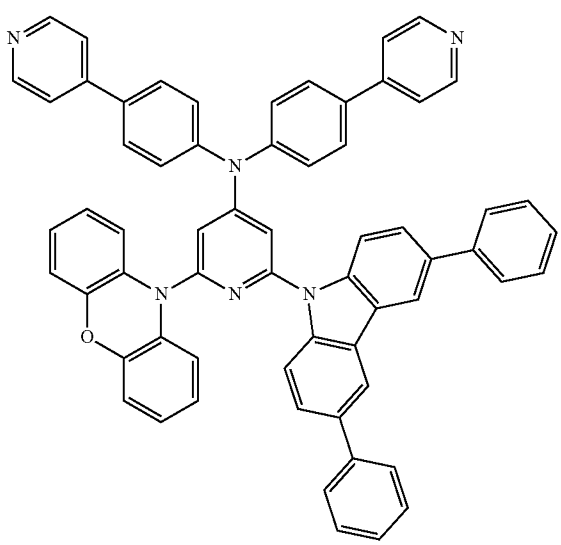
-continued
151
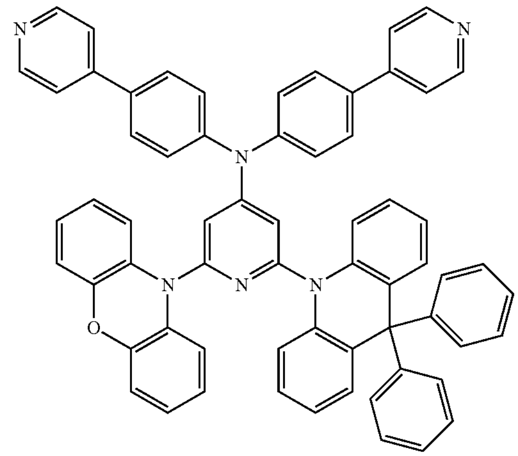
152
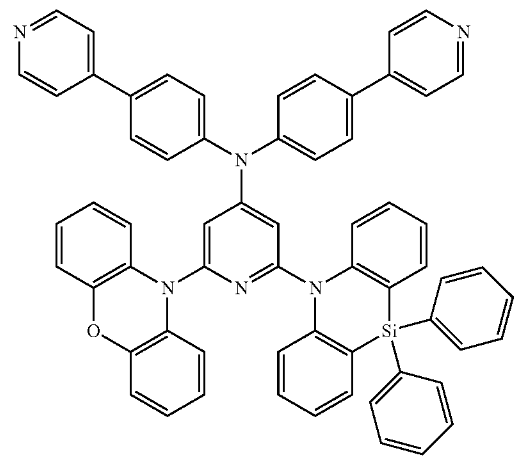
153
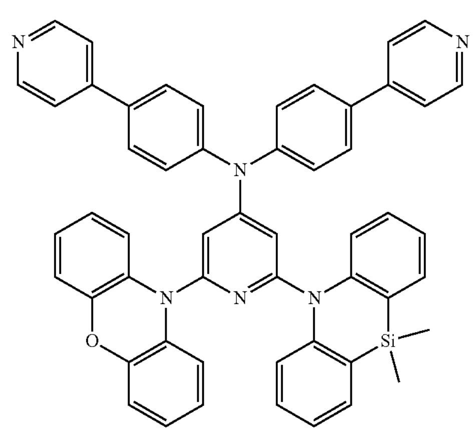

154
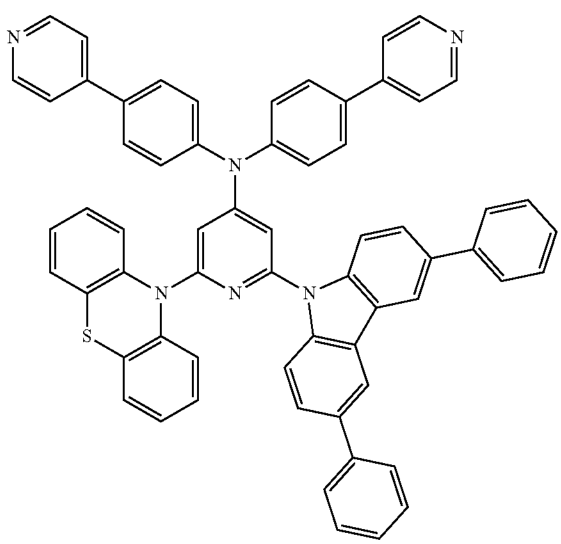
155
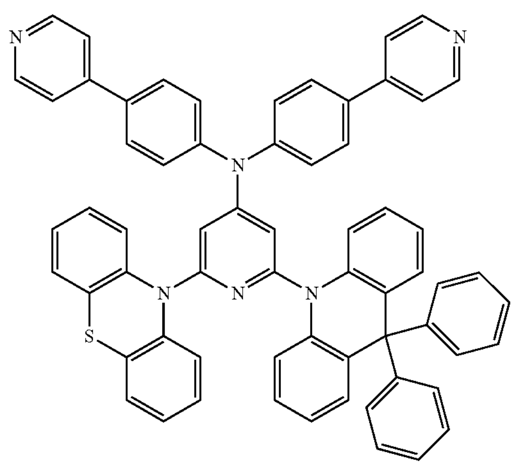
156
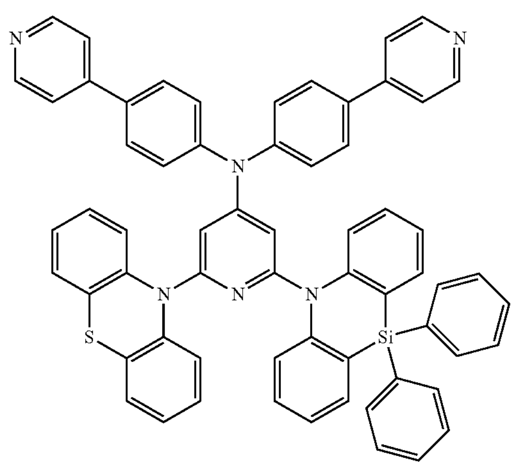
157
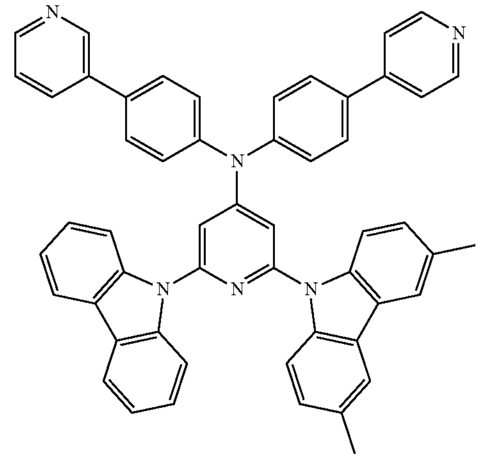
158
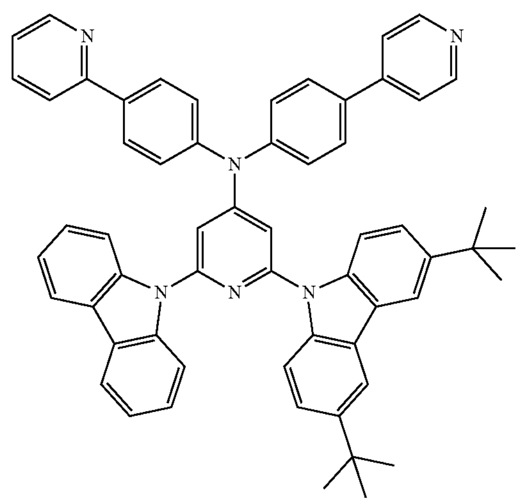
159
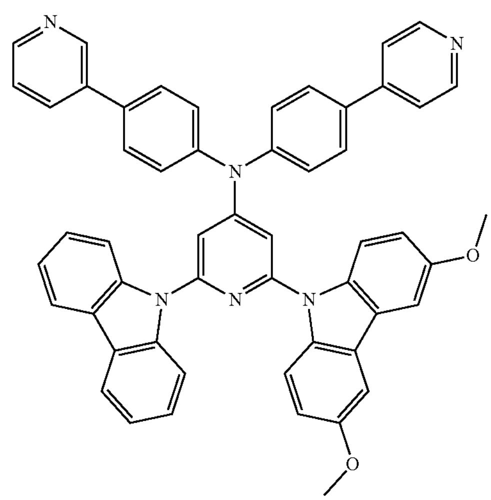

-continued
160
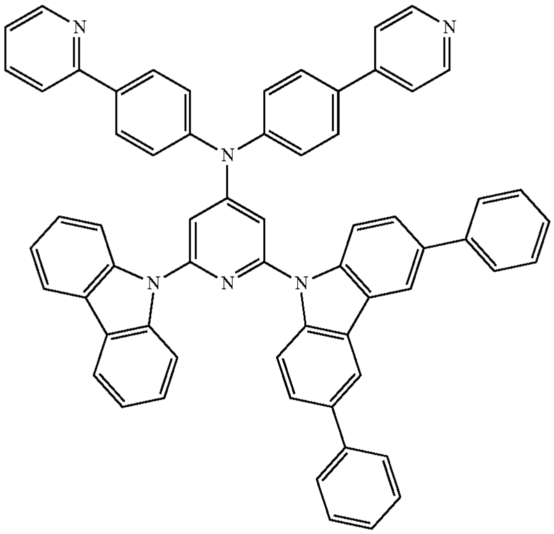
161
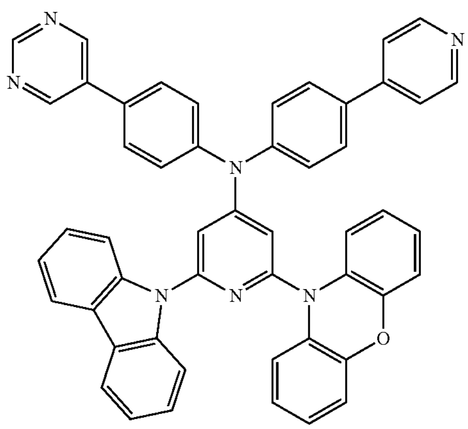
162
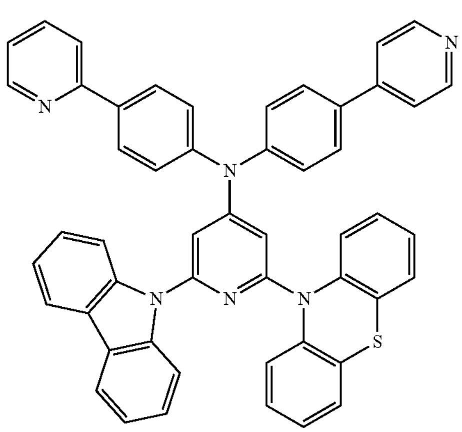
-continued
163
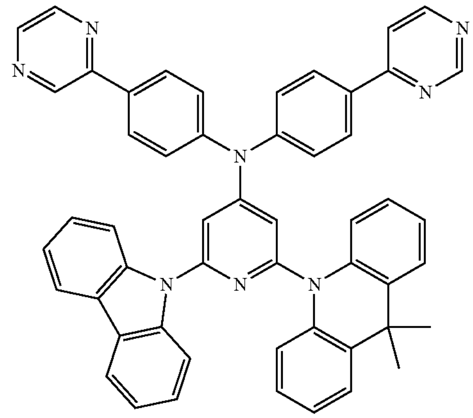
164
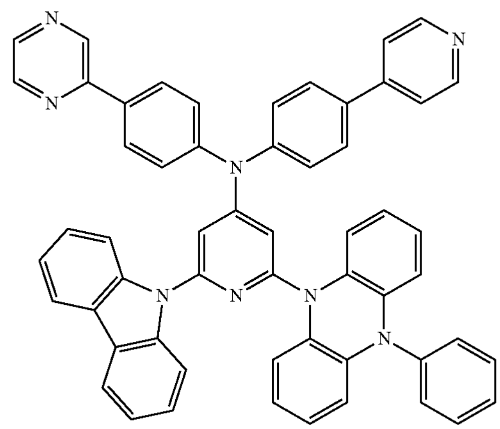
165
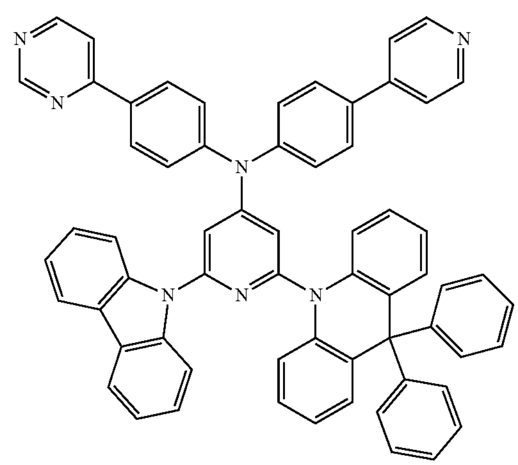

-continued
166
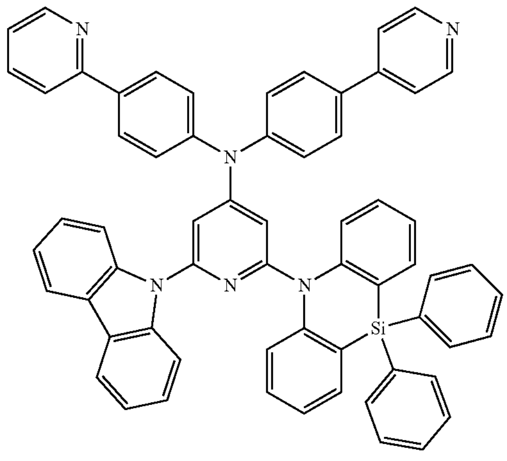
167
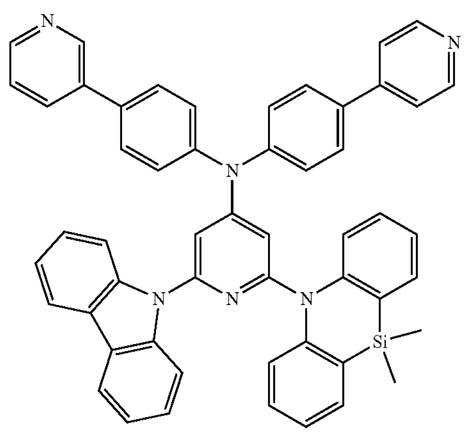
168
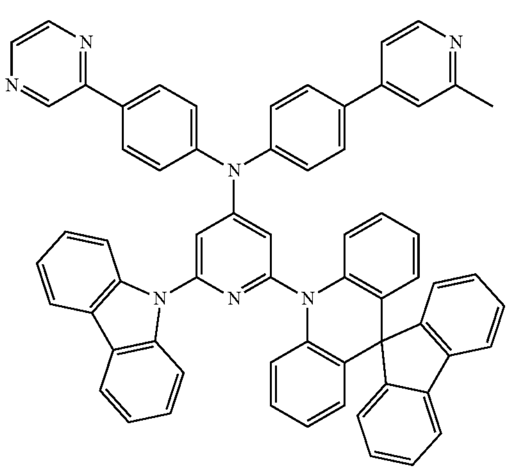
-continued
169
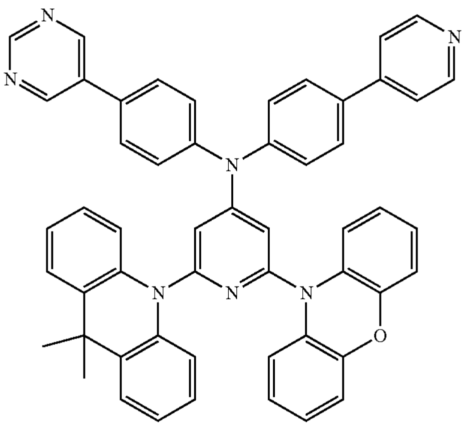
170
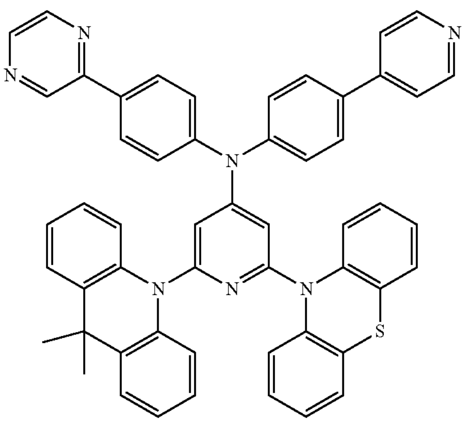
171
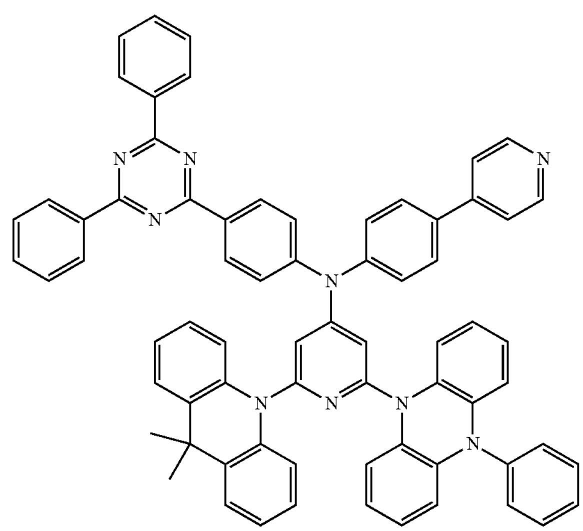

-continued
172
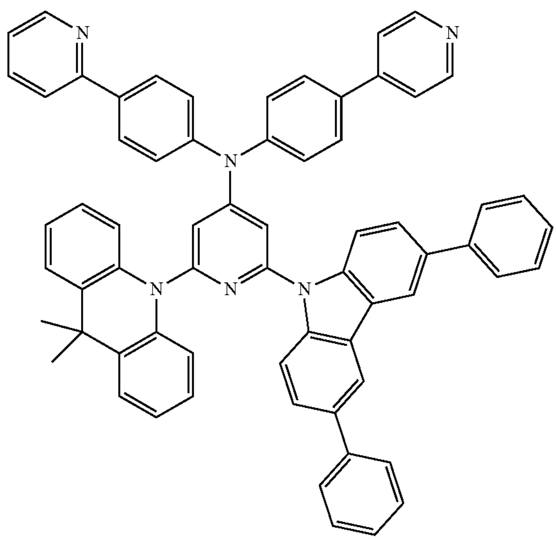
173
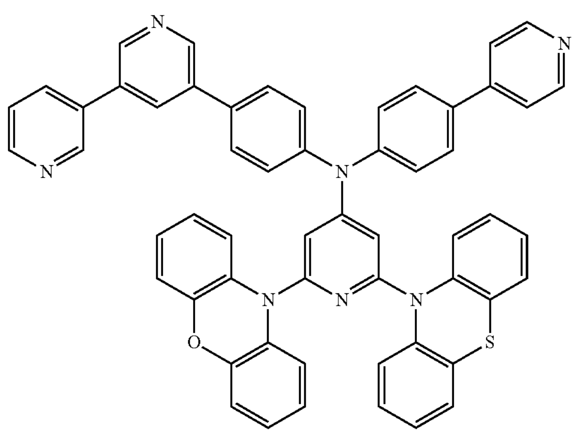
174
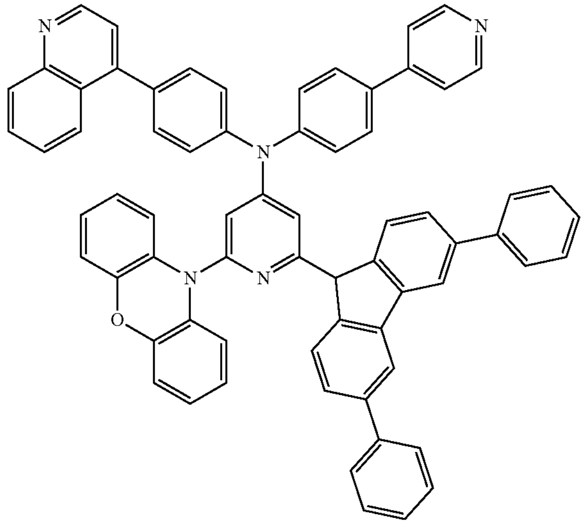
-continued
175
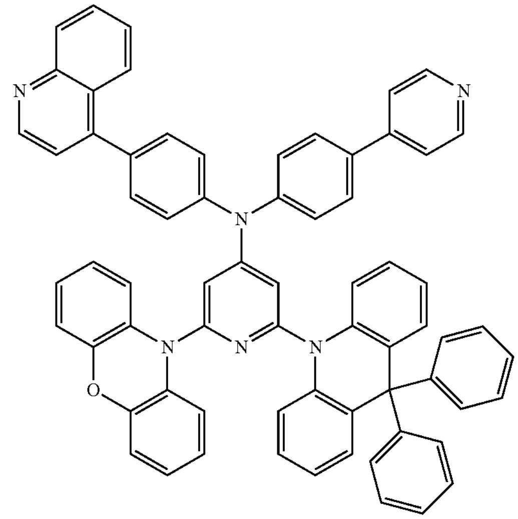
176
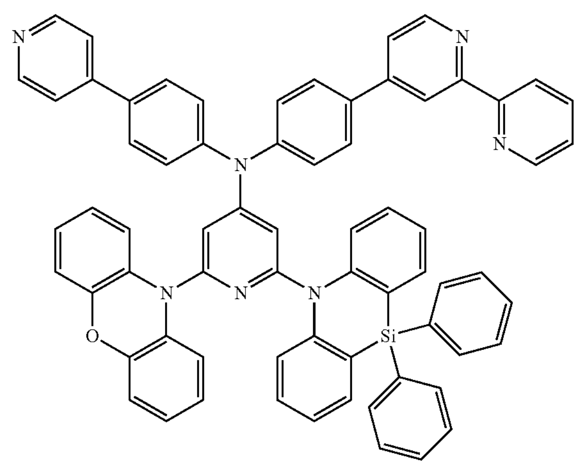
177
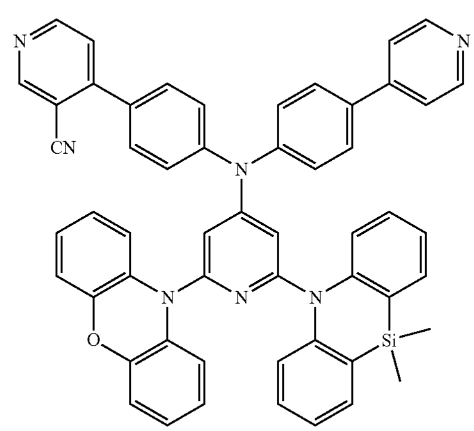

-continued

178

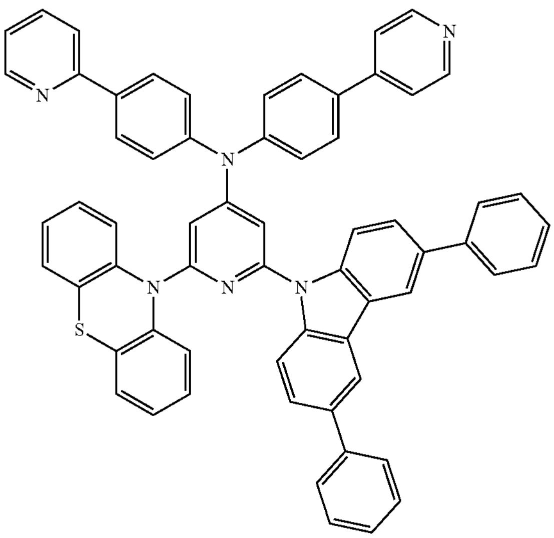

179

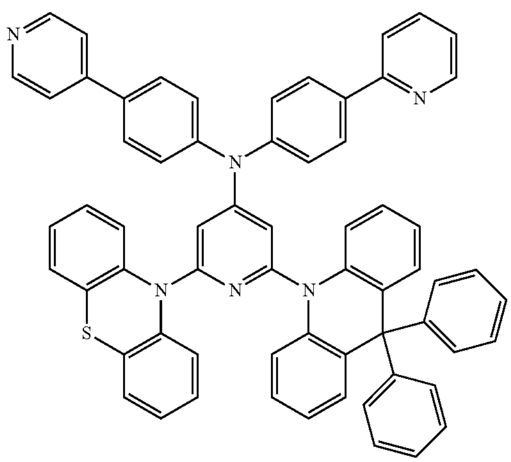

-continued

180

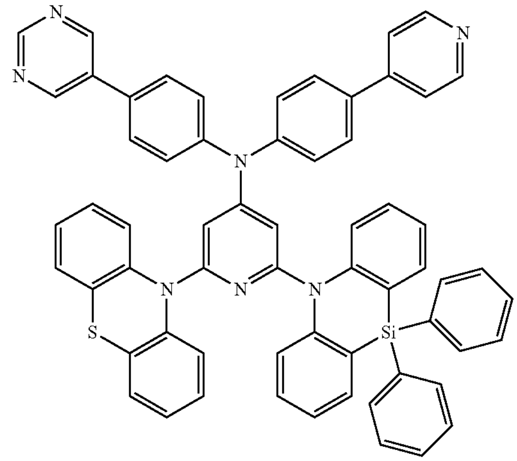

17. A display panel comprising an organic light-emitting device, the organic light-emitting device comprising:

an anode;

a cathode arranged opposite to the anode; and a light-emitting layer located between the anode and the cathode, wherein the light-emitting layer comprises a host material and a guest material, the host material comprising one or more compounds according to claim 1.

18. The display panel according to claim 17, wherein a singlet energy level of the host material is higher than a singlet energy level of the guest material, and a triplet energy level of the host material is higher than a triplet energy level of the guest material.

19. The display panel according to claim 17, wherein the organic light-emitting device further comprises one or more of a hole injection layer, a hole transmission layer, an electron blocking layer, a hole blocking layer, an electron transmission layer, or an electron injection layer.

20. A display apparatus, comprising the display panel according to claim 17.

* * * * *